United States Patent
Yamazaki et al.

(10) Patent No.: US 8,643,018 B2
(45) Date of Patent: Feb. 4, 2014

(54) SEMICONDUCTOR DEVICE COMPRISING A PIXEL PORTION AND A DRIVER CIRCUIT

(75) Inventors: Shunpei Yamazaki, Setagaya (JP); Junichiro Sakata, Atsugi (JP); Hiroyuki Miyake, Atsugi (JP); Hideaki Kuwabara, Isehara (JP); Hideki Uochi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/616,019

(22) Filed: Sep. 14, 2012

(65) Prior Publication Data

US 2013/0015439 A1    Jan. 17, 2013

Related U.S. Application Data

(63) Continuation of application No. 12/835,907, filed on Jul. 14, 2010, now Pat. No. 8,293,594.

(30) Foreign Application Priority Data

Jul. 18, 2009 (JP) .................................. 2009-169602

(51) Int. Cl.
| | | |
|---|---|---|
| H01L 29/04 | (2006.01) | |
| H01L 29/10 | (2006.01) | |
| H01L 27/14 | (2006.01) | |
| H01L 27/12 | (2006.01) | |

(52) U.S. Cl.
USPC .............................. 257/59; 257/72; 257/350

(58) Field of Classification Search
USPC ............................................ 257/59, 72, 350
See application file for complete search history.

(56) References Cited

U.S. PATENT DOCUMENTS

| 5,256,897 A | 10/1993 | Hasegawa et al. |
| 5,338,959 A | 8/1994 | Kim et al. |

(Continued)

FOREIGN PATENT DOCUMENTS

| EP | 1 737 044 A | 12/2006 |
| EP | 1770788 A | 4/2007 |

(Continued)

OTHER PUBLICATIONS

Kimizuka et al., "Spinel, $YbFe_2O_4$, and $Yb_2Fe_3O_7$ Types of Structures for Compounds in the $In_2O_3$ and $Sc_2O_3$-$A_2O_3$-BO Systems [A: Fe, Ga, or Al; B: Mg, Mn, Fe, Ni, Cu, or Zn] at Temperatures Over 1000° C." Journal of Solid State Chemistry, 1985, vol. 60, pp. 382-384.

(Continued)

*Primary Examiner* — Ngan Ngo
(74) *Attorney, Agent, or Firm* — Eric J. Robinson; Robinson Intellectual Property Law Office, P.C.

(57) ABSTRACT

An object is to improve the aperture ratio of a semiconductor device. The semiconductor device includes a driver circuit portion and a display portion (also referred to as a pixel portion) over the same substrate. The driver circuit includes a channel-etched thin film transistor for driver circuit and a driver circuit wiring formed using metal. Source and drain electrodes of the thin film transistor for the driver circuit are formed using a metal. A channel layer of the thin film transistor for the driver circuit is formed using an oxide semiconductor. The display portion includes a bottom-contact thin film transistor for a pixel and a display portion wiring formed using an oxide conductor. Source and drain electrode layers of the thin film transistor for the pixel are formed using an oxide conductor. A semiconductor layer of the thin film transistor for the pixel is formed using an oxide semiconductor.

14 Claims, 39 Drawing Sheets

(56) References Cited

U.S. PATENT DOCUMENTS

| | | | |
|---|---|---|---|
| 5,731,216 A * | 3/1998 | Holmberg et al. | 438/30 |
| 5,731,856 A | 3/1998 | Kim et al. | |
| 5,744,864 A | 4/1998 | Cillessen et al. | |
| 5,755,938 A | 5/1998 | Fukui et al. | |
| 5,818,070 A * | 10/1998 | Yamazaki et al. | 257/72 |
| 5,847,410 A | 12/1998 | Nakajima | |
| 5,969,377 A * | 10/1999 | Seo | 257/72 |
| 6,124,606 A | 9/2000 | Boer et al. | |
| 6,294,274 B1 | 9/2001 | Kawazoe et al. | |
| 6,359,672 B2 | 3/2002 | Gu et al. | |
| 6,558,987 B2 | 5/2003 | Lee | |
| 6,563,174 B2 | 5/2003 | Kawasaki et al. | |
| 6,586,346 B1 | 7/2003 | Yamazaki et al. | |
| 6,727,522 B1 | 4/2004 | Kawasaki et al. | |
| 6,762,802 B2 | 7/2004 | Ono et al. | |
| 6,767,847 B1 | 7/2004 | Hu et al. | |
| 6,838,308 B2 | 1/2005 | Haga | |
| 6,900,872 B2 | 5/2005 | Kang | |
| 6,960,812 B2 | 11/2005 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,071,037 B2 | 7/2006 | Suzawa et al. | |
| 7,105,868 B2 | 9/2006 | Nause et al. | |
| 7,199,846 B2 | 4/2007 | Lim | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,298,084 B2 | 11/2007 | Baude et al. | |
| 7,301,211 B2 | 11/2007 | Yamazaki et al. | |
| 7,323,356 B2 | 1/2008 | Hosono et al. | |
| 7,358,592 B2 | 4/2008 | Ueno | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,582,904 B2 * | 9/2009 | Fujii et al. | 257/72 |
| 7,674,650 B2 | 3/2010 | Akimoto et al. | |
| 7,714,329 B2 | 5/2010 | Suzawa et al. | |
| 7,719,185 B2 | 5/2010 | Jin et al. | |
| 7,732,819 B2 | 6/2010 | Akimoto et al. | |
| 7,745,798 B2 | 6/2010 | Takahashi | |
| 7,767,505 B2 | 8/2010 | Son et al. | |
| 7,800,113 B2 | 9/2010 | Shoji et al. | |
| 7,851,279 B2 | 12/2010 | Takano et al. | |
| 7,932,521 B2 * | 4/2011 | Akimoto et al. | 257/72 |
| 7,935,964 B2 | 5/2011 | Kim et al. | |
| 7,998,372 B2 | 8/2011 | Yano et al. | |
| 8,102,476 B2 | 1/2012 | Son et al. | |
| 8,168,544 B2 | 5/2012 | Chang | |
| 8,207,533 B2 * | 6/2012 | Maekawa et al. | 257/59 |
| 8,207,756 B2 | 6/2012 | Shionoiri et al. | |
| 8,236,635 B2 | 8/2012 | Suzawa et al. | |
| 8,242,494 B2 | 8/2012 | Suzawa et al. | |
| 8,247,814 B2 * | 8/2012 | Maekawa et al. | 257/43 |
| 8,304,765 B2 | 11/2012 | Yamazaki et al. | |
| 8,309,961 B2 | 11/2012 | Yamazaki et al. | |
| 8,319,215 B2 | 11/2012 | Yamazaki et al. | |
| 8,343,799 B2 | 1/2013 | Ito et al. | |
| 2001/0030323 A1 | 10/2001 | Ikeda | |
| 2001/0046027 A1 | 11/2001 | Tai et al. | |
| 2002/0044111 A1 | 4/2002 | Yamazaki et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0267141 A1 | 11/2006 | Saito | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0057261 A1 | 3/2007 | Jeong et al. | |
| 2007/0072439 A1 | 3/2007 | Akimoto et al. | |
| 2007/0090365 A1 | 4/2007 | Hayashi et al. | |
| 2007/0096816 A1 | 5/2007 | Paul et al. | |
| 2007/0108446 A1 | 5/2007 | Akimoto | |
| 2007/0152217 A1 | 7/2007 | Lai et al. | |
| 2007/0170434 A1 | 7/2007 | Inoue et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0236640 A1 | 10/2007 | Kimura | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0176364 A1 | 7/2008 | Yang et al. | |
| 2008/0182358 A1 | 7/2008 | Cowdery-Corvan et al. | |
| 2008/0203387 A1 | 8/2008 | Kang et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2008/0308797 A1 | 12/2008 | Akimoto et al. | |
| 2008/0308804 A1 * | 12/2008 | Akimoto et al. | 257/59 |
| 2008/0308805 A1 | 12/2008 | Akimoto et al. | |
| 2008/0308806 A1 | 12/2008 | Akimoto et al. | |
| 2009/0008638 A1 | 1/2009 | Kang et al. | |
| 2009/0008639 A1 | 1/2009 | Akimoto et al. | |
| 2009/0009677 A1 | 1/2009 | Yamazaki et al. | |
| 2009/0033818 A1 | 2/2009 | Nakajima et al. | |
| 2009/0057683 A1 | 3/2009 | Nakajima et al. | |
| 2009/0061574 A1 | 3/2009 | Nakajima et al. | |
| 2009/0065771 A1 | 3/2009 | Iwasaki et al. | |
| 2009/0068773 A1 | 3/2009 | Lai et al. | |
| 2009/0072232 A1 | 3/2009 | Hayashi et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0140438 A1 | 6/2009 | Yamazaki et al. | |
| 2009/0148970 A1 | 6/2009 | Hosoya et al. | |

(56) References Cited

U.S. PATENT DOCUMENTS

| | | | |
|---|---|---|---|
| 2009/0152506 | A1 | 6/2009 | Umeda et al. |
| 2009/0152541 | A1 | 6/2009 | Maekawa et al. |
| 2009/0166616 | A1 | 7/2009 | Uchiyama |
| 2009/0186437 | A1 | 7/2009 | Akimoto |
| 2009/0186445 | A1 | 7/2009 | Akimoto |
| 2009/0189155 | A1 | 7/2009 | Akimoto |
| 2009/0189156 | A1 | 7/2009 | Akimoto |
| 2009/0278122 | A1 | 11/2009 | Hosono et al. |
| 2009/0280600 | A1 | 11/2009 | Hosono et al. |
| 2009/0283762 | A1 | 11/2009 | Kimura |
| 2010/0025678 | A1 | 2/2010 | Yamazaki et al. |
| 2010/0051934 | A1 | 3/2010 | Choung et al. |
| 2010/0051949 | A1 | 3/2010 | Yamazaki et al. |
| 2010/0059742 | A1 | 3/2010 | Shieh et al. |
| 2010/0065839 | A1 | 3/2010 | Yamazaki et al. |
| 2010/0065840 | A1 | 3/2010 | Yamazaki et al. |
| 2010/0065844 | A1 | 3/2010 | Tokunaga |
| 2010/0072467 | A1 | 3/2010 | Yamazaki et al. |
| 2010/0084650 | A1 | 4/2010 | Yamazaki et al. |
| 2010/0092800 | A1 | 4/2010 | Itagaki et al. |
| 2010/0102312 | A1 | 4/2010 | Yamazaki et al. |
| 2010/0105162 | A1 | 4/2010 | Suzawa et al. |
| 2010/0105163 | A1 | 4/2010 | Ito et al. |
| 2010/0105164 | A1 | 4/2010 | Ito et al. |
| 2010/0109002 | A1 | 5/2010 | Itagaki et al. |
| 2010/0117075 | A1 | 5/2010 | Akimoto et al. |
| 2010/0123136 | A1 | 5/2010 | Lee et al. |
| 2010/0200857 | A1 | 8/2010 | Shimada |
| 2010/0283055 | A1 | 11/2010 | Inoue et al. |
| 2010/0301329 | A1 | 12/2010 | Asano et al. |
| 2011/0032435 | A1 | 2/2011 | Kimura |
| 2011/0062433 | A1 | 3/2011 | Yamazaki |
| 2011/0062436 | A1 | 3/2011 | Yamazaki et al. |
| 2011/0117698 | A1 | 5/2011 | Suzawa et al. |
| 2011/0215318 | A1 | 9/2011 | Yamazaki et al. |
| 2012/0061668 | A1 | 3/2012 | Miyairi et al. |
| 2012/0104386 | A1 | 5/2012 | Miyairi et al. |
| 2012/0286266 | A1 | 11/2012 | Suzawa et al. |
| 2012/0286267 | A1 | 11/2012 | Suzawa et al. |
| 2013/0001583 | A1* | 1/2013 | Yamazaki et al. ............... 257/72 |
| 2013/0105793 | A1 | 5/2013 | Ito et al. |

FOREIGN PATENT DOCUMENTS

| | | | |
|---|---|---|---|
| EP | 1933293 | A | 6/2008 |
| EP | 1983499 | A | 10/2008 |
| EP | 1995787 | A | 11/2008 |
| EP | 1998373 | A | 12/2008 |
| EP | 1998374 | A | 12/2008 |
| EP | 1998375 | A | 12/2008 |
| EP | 2 226 847 | A | 9/2010 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 03-231472 | A | 10/1991 |
| JP | 05-251705 | | 9/1993 |
| JP | 08-116067 | | 5/1996 |
| JP | 08-264794 | A | 10/1996 |
| JP | 11-505377 | | 5/1999 |
| JP | 2000-044236 | A | 2/2000 |
| JP | 2000-150900 | | 5/2000 |
| JP | 2002-076356 | A | 3/2002 |
| JP | 2002-289859 | A | 10/2002 |
| JP | 2003-029293 | | 1/2003 |
| JP | 2003-086000 | A | 3/2003 |
| JP | 2003-086808 | | 3/2003 |
| JP | 2004-014982 | | 1/2004 |
| JP | 2004-103957 | | 4/2004 |
| JP | 2004-273614 | A | 9/2004 |
| JP | 2004-273732 | A | 9/2004 |
| JP | 2005-033172 | | 2/2005 |
| JP | 2007-081362 | | 3/2007 |
| JP | 2007-096055 | | 4/2007 |
| JP | 2007-123861 | | 5/2007 |
| JP | 2007-163467 | | 6/2007 |
| JP | 2007-171932 | | 7/2007 |
| JP | 2007-250983 | A | 9/2007 |
| JP | 2009-141001 | | 6/2009 |
| JP | 2009-158663 | | 7/2009 |
| JP | 2009-265271 | | 11/2009 |
| JP | 2010-098280 | | 4/2010 |
| WO | WO 2004/114391 | | 12/2004 |
| WO | WO-2007/058231 | | 5/2007 |
| WO | WO-2007/119386 | | 10/2007 |
| WO | 2009/072533 | | 6/2009 |

OTHER PUBLICATIONS

Kimizuka et al., "Syntheses and Single-Crystal Data of Homologous Compounds, $In_2O_3(ZnO)m$ ($m$=3, 4, and 5), $InGaO_3(ZnO)_3$, and $Ga_2O_3(ZnO)m$ ($m$=7, 8, 9, and 16) in the $In_2O_3$-$ZnGa_2O_4$-$ZnO$ System," Journal of Solid State Chemistry, Apr. 1, 1995, vol. 116, No. 1, pp. 170-178.

Nakamura et al., "The Phase Relations in the $In_2O_3$-$Ga_2ZnO_4$-$ZnO$ System at 1350° C.," Journal of Solid State Chemistry, Aug. 1, 1991, vol. 93, No. 2, pp. 298-315.

Li et al., "Modulated Structures of Homologous Compounds $InMO_3(ZnO)_m$ (M=in,Ga; m=Integer) Described by Four-Dimensional Superspace Group," Journal of Solid State Chemistry, 1998, vol. 139, pp. 347-355.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Nomura et al., "Thin-Film Transistor Fabricated in Single-Crystalline Transparent Oxide Semiconductor," Science, May 23, 2003, vol. 300, No. 5623, pp. 1269-1272.

Lee et al., "Current Status of, Challenges to, and Perspective View of AM-OLED," IDW '06: Proceedings of the 13th International Display Workshops, Dec. 7, 2006, pp. 663-666.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Asaoka et al., "29.1: Polarizer-Free Reflective LCD Combined With Ultra Low-Power Driving Technology," SID Digest '09: SID International Symposium Digest of Technical Papers, 2009, pp. 395-398.

Tsuda et al., "Ultra Low Power Consumption Technologies for Mobile TFT-LCDs," IDW '02: Proceedings of the 9th International Display Workshops, Dec. 4, 2002, pp. 295-298.

Kanno et al., "White Stacked Electrophosphorecent Organic Light-Emitting Device Employing $MoO_3$ as a Charge-Generation Layer," Adv. Mater. (Advanced Materials), 2006, vol. 18, No. 3, pp. 339-342.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Ikeda et al., "Full-Functional System Liquid Crystal Display Using CG-Silicon Technology," SID Digest '04: SID International Symposium Digest of Technical Papers, 2004, vol. 35, pp. 860-863.

Kurokawa et al., "UHF RFCPUS on Flexible and Glass Substrates for Secure RFID Systems," Journal of Solid-State Circuits, 2008, vol. 43, No. 1, pp. 292-299.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Hirao et al., "Novel Top-Gate Zinc Oxide Thin-Film Transistors (ZnO TFTs) for AMLCDs," Journal of the SID, 2007, vol. 15, No. 1, pp. 17-22.

Lee et al., "World's Largest (15-inch) XGA AMLCD Panel using IGZO Oxide TFT," SID Digest '08: SID International Symposium Digest of Technical Papers, May 20, 2008, vol. 39, pp. 625-628.

(56) References Cited

OTHER PUBLICATIONS

Park et al., "Challenge to Future Displays: Transparent AM-OLED Driven by PEALD Grown ZnO TFT," IMID '07 Digest, 2007, pp. 1249-1252.

Park et al., "Amorphous Indium-Gallium-Zinc Oxide TFTs and their Application for Large Size AMOLED," AM-FPD '08 Digest of Technical Papers, Jul. 2, 2008, pp. 275-278.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Costello et al., "Electron Microscopy of a Cholesteric Liquid Crystal and Its Blue Phase," Phys. Rev. A (Physical Review. A), May 1, 1984, vol. 29, No. 5, pp. 2957-2959.

Kitzerow et al., "Observation of Blue Phases in Chiral Networks," Liquid Crystals, 1993, vol. 14, No. 3, pp. 911-916.

Kikuchi et al., "Polymer-Stabilized Liquid Crystal Blue Phases," Nature Materials, Sep. 2, 2002, vol. 1, pp. 64-68.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Park et al., "High performance amorphous oxide thin film transistors with self-aligned top-gate structure," IEDM 09: Technical Digest of International Electron Devices Meeting, Dec. 7, 2009, pp. 191-194.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Miyasaka, "58.2: Invited Paper: Suftla Flexible Microelectronics on their Way to Business," SID Digest '07: SID International Symposium Digest of Technical Papers, 2007, vol. 38, pp. 1673-1676.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Prins et al., "A Ferroelectric Transparent Thin-Film Transistor," Appl. Phys. Lett. (Applied Physics Letters), Jun. 17, 1996, vol. 68, No. 25, pp. 3650-3652.

Takahashi et al., "Theoretical Analysis of IGZO Transparent Amorphous Oxide Semiconductor," IDW '08: Proceedings of the 15th International Display Workshops, Dec. 3, 2008, pp. 1637-1640.

Osada et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Ohara et al., "21.3: 4.0 In. QVGA AMOLED Display Using In-Ga-Zn-Oxide TFTs with a Novel Passivation Layer," SID Digest '09: SID International Symposium Digest of Technical Papers, May 31, 2009, pp. 284-287.

Godo et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Osada et al., "Development of Driver-Integrated Panel using Amorphous In-Ga-Zn-Oxide TFT," AM-FPD '09 Digest of Technical Papers, Jul. 1, 2009, pp. 33-36.

Godo et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Ohara et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Sakata et al., "Development of 4.0-In. AMOLED Display with Driver Circuit Using Amorphous In-Ga-Zn-Oxide TFTS," IDW '09: Proceedings of the 16th International Display Workshops, 2009, pp. 689-692.

International Search Report (Application No. PCT/JP2010/061292) dated Oct. 12, 2010.

Written Opinion (Application No. PCT/JP2010/061292) dated Oct. 12, 2010.

Fortunato et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Hayashi et al., "42.1: Invited Paper: Improved Amorphous In-Ga-Zn-O TFTs," SID Digest '08: SID International Symposium Digest of Technical Papers, May 20, 2008, vol. 39, pp. 621-624.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Son et al., "42.4L: Late-News Paper: 4 Inch QVGA AMOLED Driven by the Threshold Voltage Controlled Amorphous GIZO $(Ga_2O_3-In_2O_3-ZnO)$ TFT," SID Digest '08: SID International Symposium Digest of Technical Papers, May 20, 2008, vol. 39, pp. 633-636.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Nakamura, "Synthesis of Homologous Compound with New Long-Period Structure," NIRIM Newsletter, Mar. 1, 1995, vol. 150, pp. 1-4.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

(56) References Cited

OTHER PUBLICATIONS

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1-245202-6.

Orita et al., "Amorphous transparent conductive oxide $InGaO_3(ZnO)m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6th International Display Workshops, Dec. 3, 2008, pp. 581-584.

Kim et al., "High-Performance oxide thin film transistors passivated by various gas plasmas," 214th ECS Meeting, 2008, No. 2317.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

"Transparent Circuit," Nikkei Electronics, Aug. 27, 2007, No. 959, pp. 39-52.

Kim.C et al., "A Novel Four-Mask-Count Process Architecture for TFT-LCDS,", SID Digest '00 : SID International Symposium Digest of Technical Papers, 2000, vol. 31, pp. 1006-1009.

Song.J et al., "34.1: Advanced Four-Mask Process Architecture for the A-SI TFT Array Manufacturing Method,", SID Digest '02 : SID International Symposium Digest of Technical Papers, 2002, vol. 33, pp. 1038-1041.

\* cited by examiner

FIG. 3A
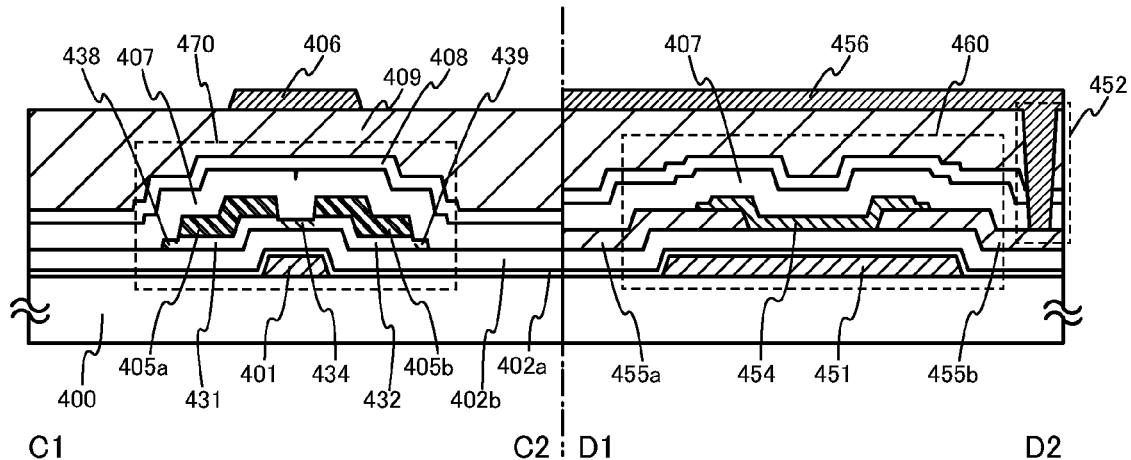
FIG. 3B1
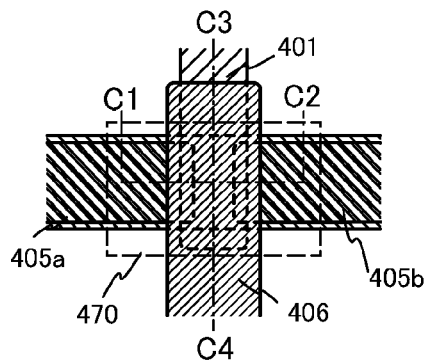
FIG. 3B2
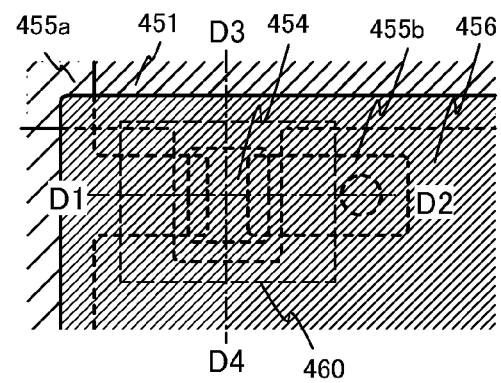
FIG. 3C
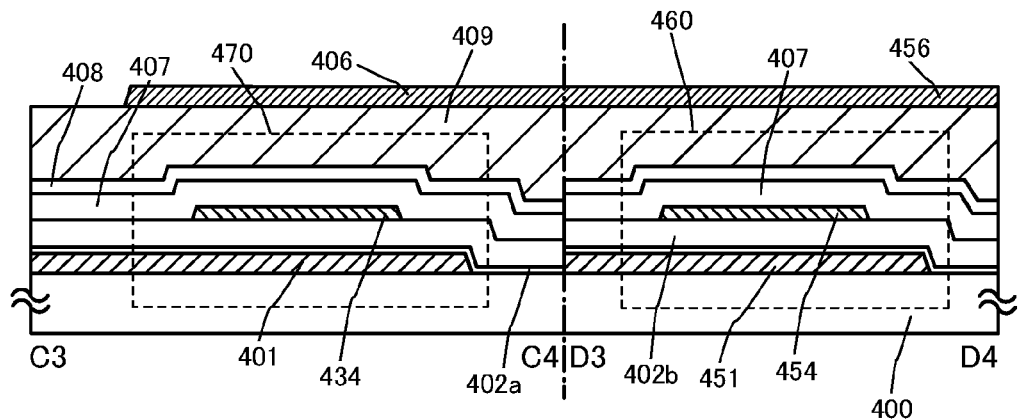

FIG. 4A1
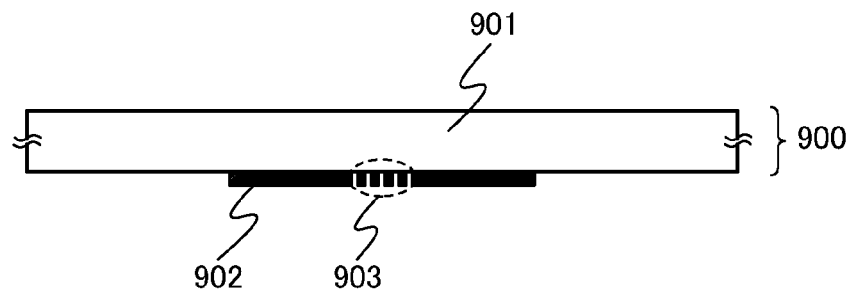
FIG. 4A2
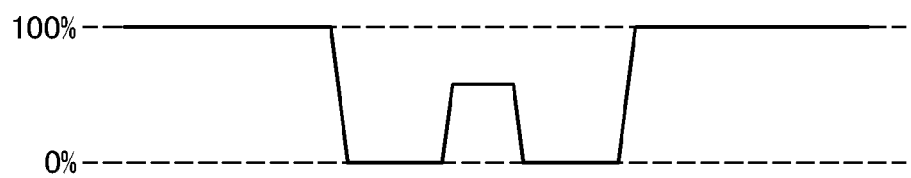
FIG. 4B1
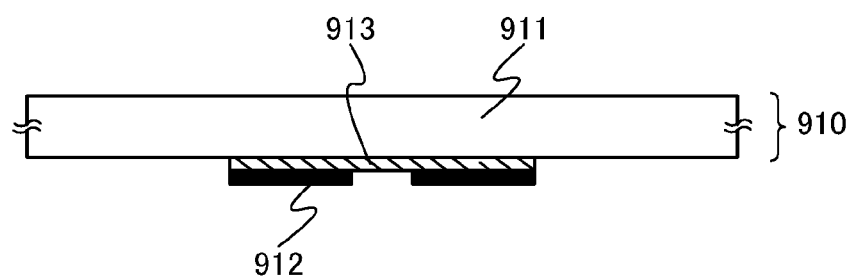
FIG. 4B2
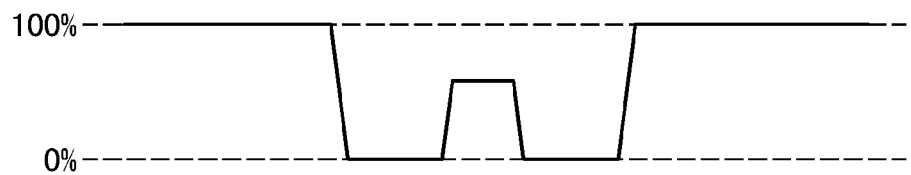

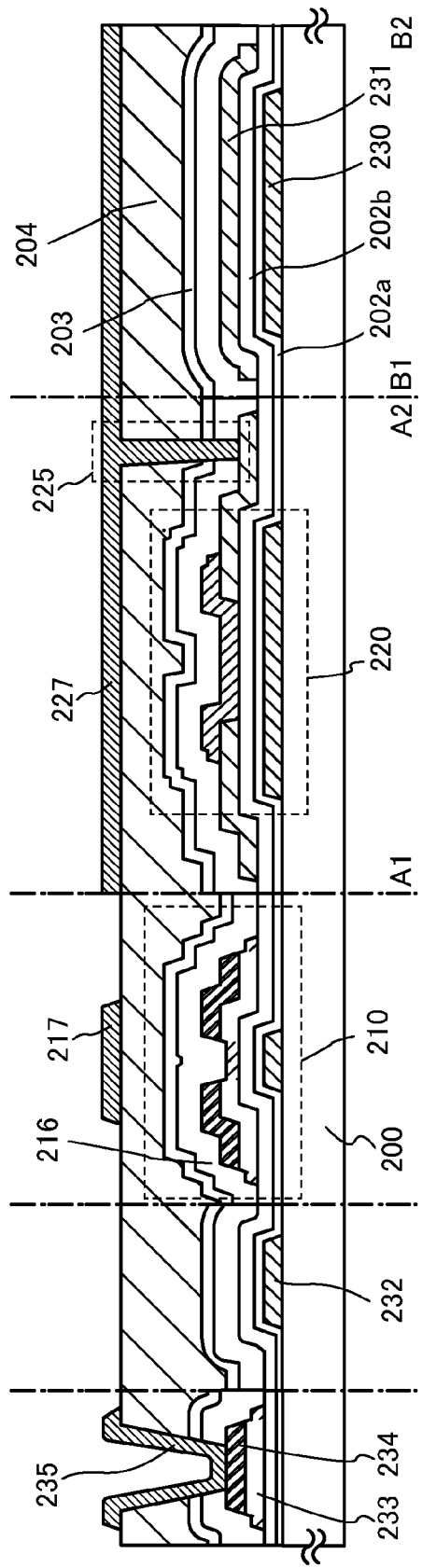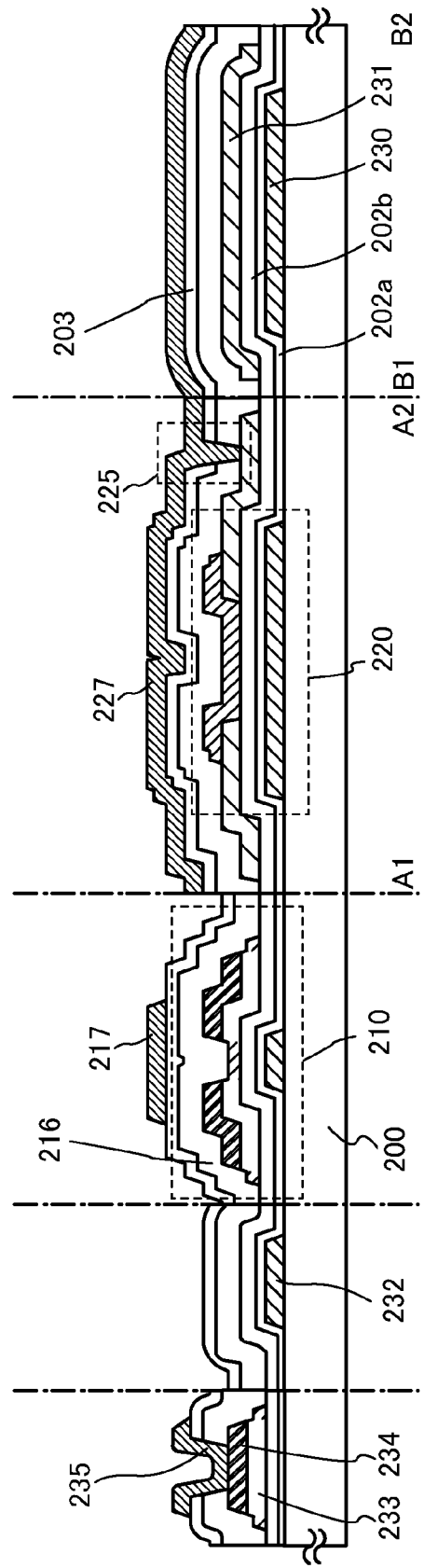

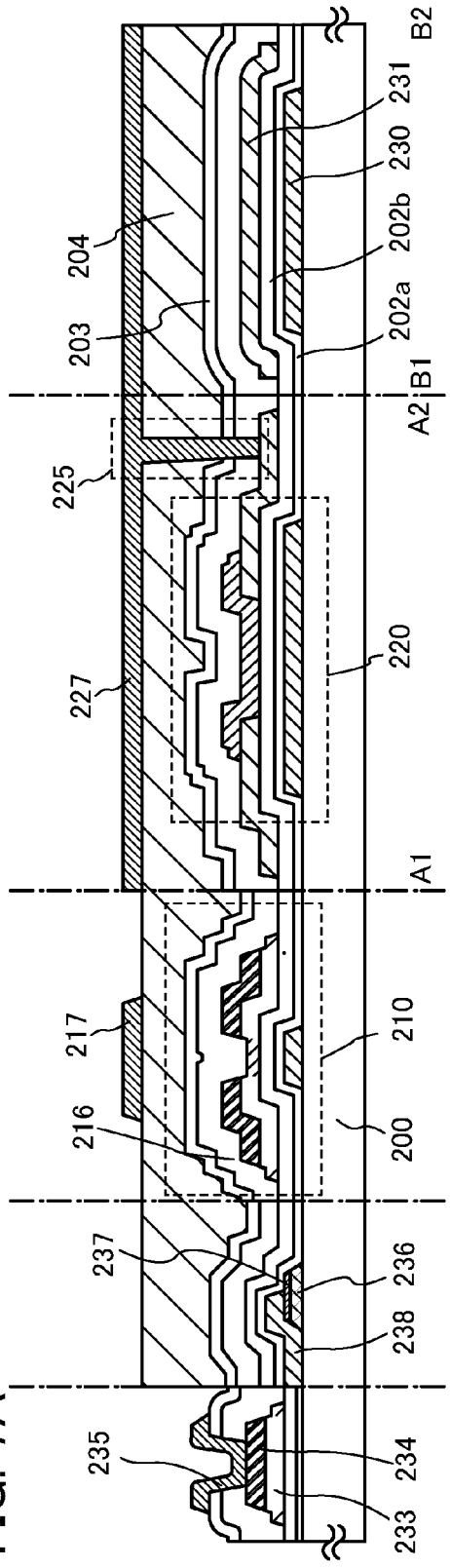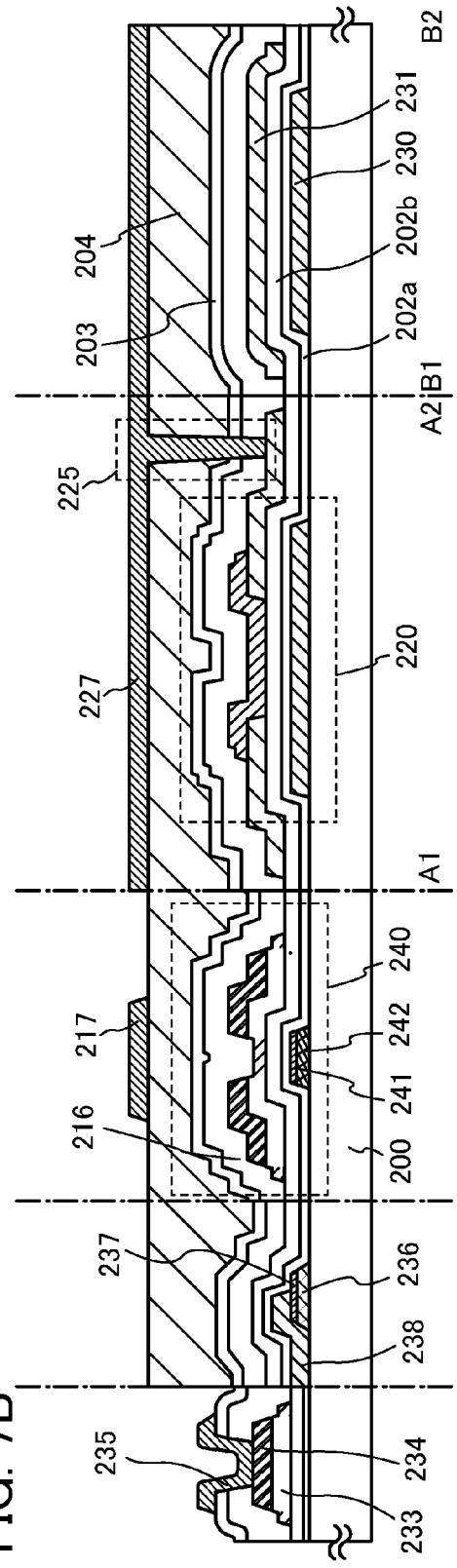

FIG. 11A
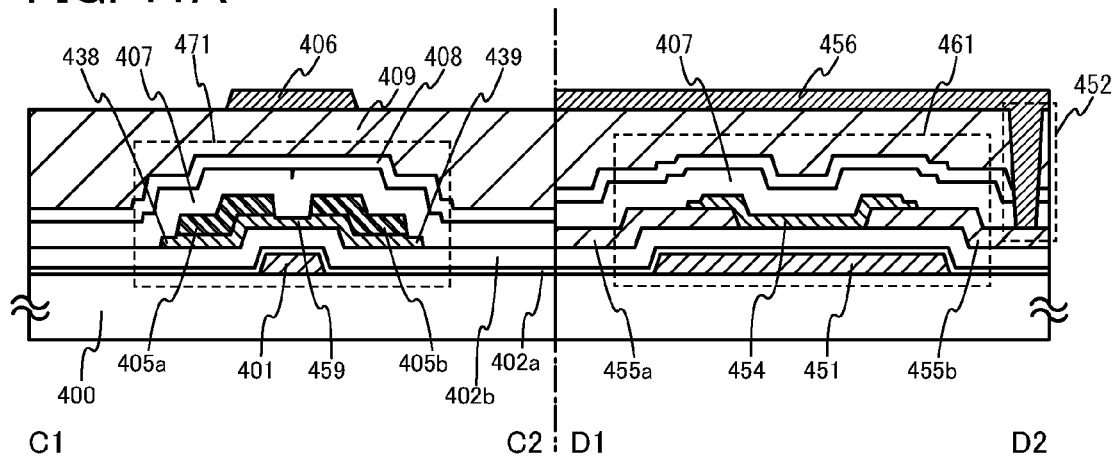
FIG. 11B1
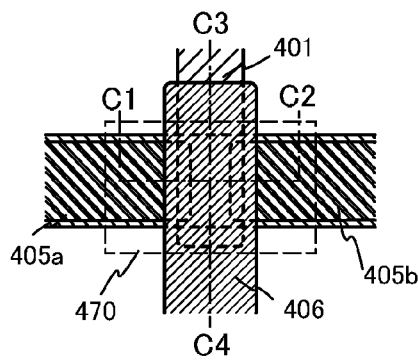
FIG. 11B2
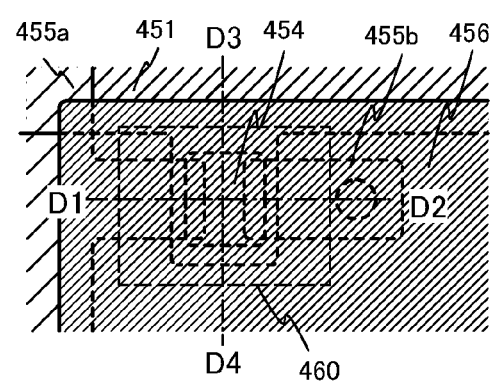
FIG. 11C
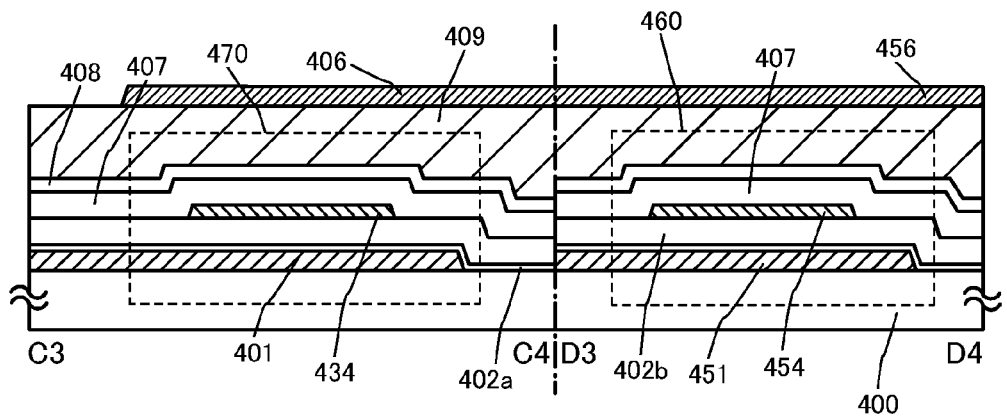

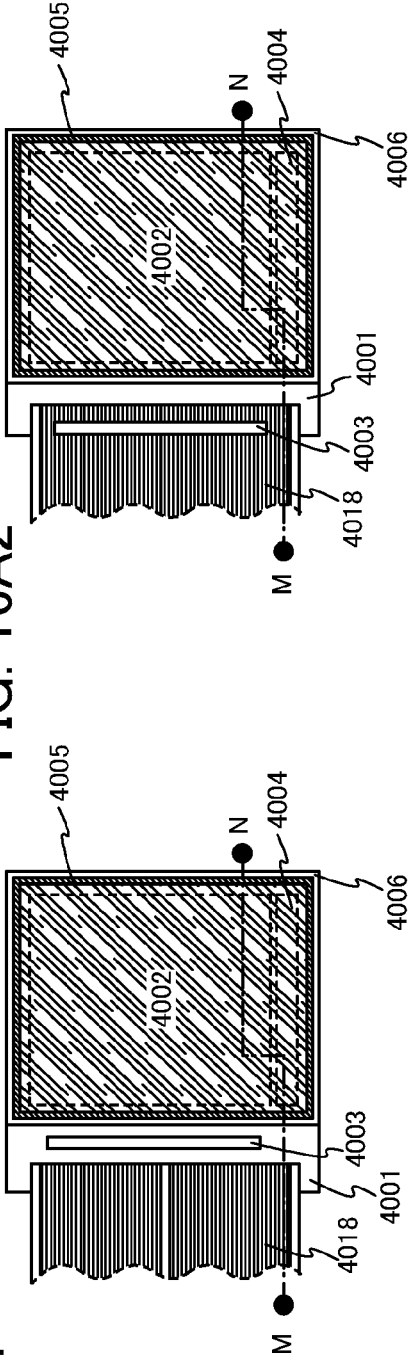
FIG. 16A1
FIG. 16A2
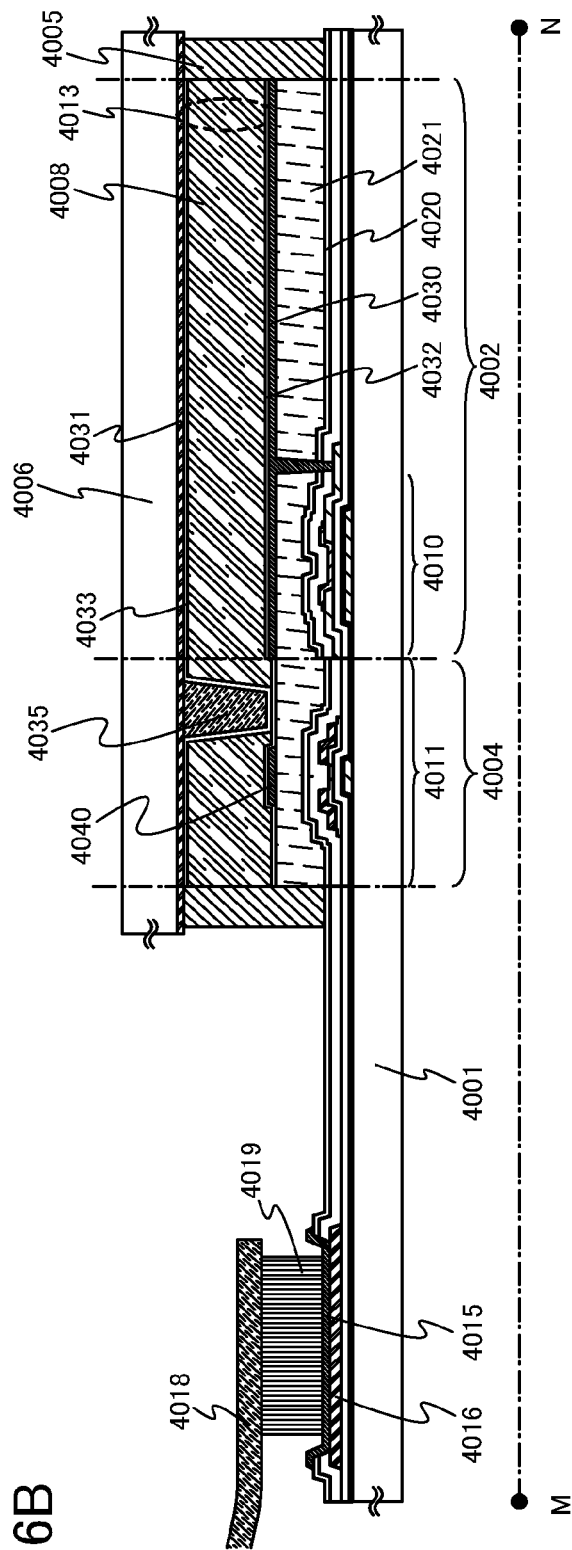
FIG. 16B

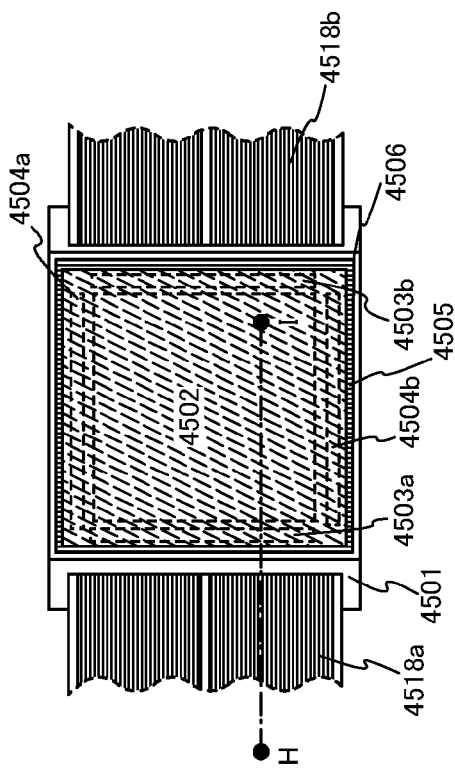
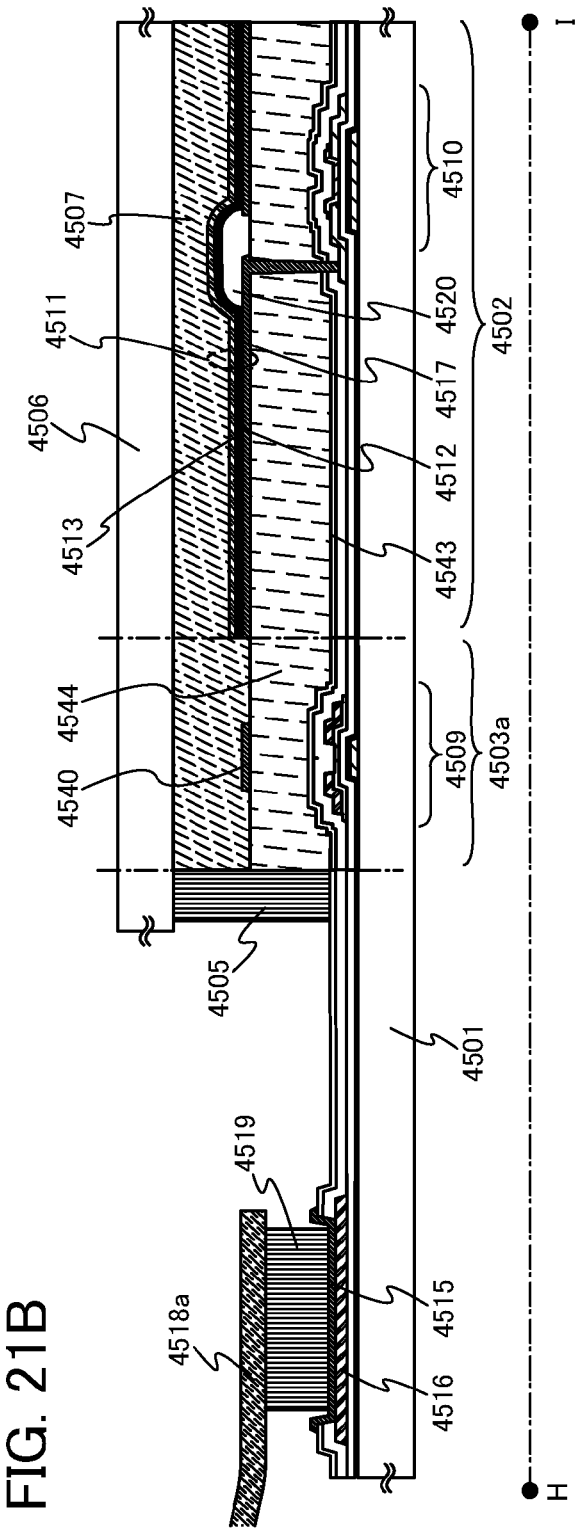
FIG. 21A
FIG. 21B

SEMICONDUCTOR DEVICE COMPRISING A PIXEL PORTION AND A DRIVER CIRCUIT

TECHNICAL FIELD

The present invention relates to semiconductor devices including oxide semiconductors and manufacturing methods thereof.

Note that in this specification, a semiconductor device refers to all devices that can function by utilizing semiconductor properties, and electro-optic devices such as display devices, semiconductor circuits, and electronic devices are all semiconductor devices.

BACKGROUND ART

Light-transmitting metal oxides are used in semiconductor devices. For example, conductive metal oxides (hereinafter referred to as oxide conductors) such as indium tin oxide (ITO) are used as transparent electrode materials needed in display devices such as liquid crystal displays.

In addition, light-transmitting metal oxides attract attention as materials having semiconductor properties. For example, In—Ga—Zn—O-based oxides and the like are expected to be used as semiconductor materials needed in display devices such as liquid crystal displays. In particular, they are expected to be used for channel layers of thin film transistors (hereinafter referred to as TFTs).

TFTs which include metal oxides having semiconductor properties (hereinafter referred to as oxide semiconductors) can be formed by low-temperature processes. Therefore, expectations for oxide semiconductors as materials which replace or surpass amorphous silicon used in display devices and the like are raised.

The use of oxide conductors and oxide semiconductors having light-transmitting properties enables the production of light-transmitting TFTs (for example, see Reference 1).

Furthermore, TFTs including oxide semiconductors as a channel layer have high field-effect mobility. Therefore, driver circuits in display devices or the like can be formed using the TFTs (for example, see Reference 2).

REFERENCE

Reference 1: T. Nozawa, "Transparent Circuitry", *Nikkei Electronics*, No. 959, Aug. 27, 2007, pp. 39-52.

Reference 2: T. Osada et al., "Development of Driver-Integrated Panel using Amorphous In—Ga—Zn-Oxide TFT", *Proc. SID '09 Digest,* 2009, pp. 184-187.

DISCLOSURE OF INVENTION

It is an object of one embodiment of the present invention to reduce the manufacturing cost of a display device.

It is an object of one embodiment of the present invention to improve the aperture ratio of a display device.

It is an object of one embodiment of the present invention to make a display portion of a display device display a higher-resolution image.

It is an object of one embodiment of the present invention to provide a display device which can operate at high speed.

One embodiment of the present invention is a display device including a driver circuit portion and a display portion over the same substrate. The driver circuit portion includes a driver circuit TFT and a driver circuit wiring. A source electrode (also referred to as a source electrode layer) and a drain electrode (also referred to as a drain electrode layer) of the driver circuit TFT are formed using a metal. A channel layer of the driver circuit TFT is formed using an oxide semiconductor. The driver circuit wiring is formed using a metal. The display portion includes a pixel TFT and a display portion wiring. A source electrode and a drain electrode of the pixel TFT are formed using an oxide conductor. A semiconductor layer of the pixel TFT is formed using an oxide semiconductor. The display portion wiring is formed using an oxide conductor.

Note that a specific manufacturing process of a TFT, a specific structure of a different element (e.g., a capacitor) included in a display device, and the like are not disclosed in Reference 1. In addition, it is not disclosed that a driver circuit and a light-transmitting TFT are formed over the same substrate.

In a display device of one embodiment of the present invention, a driver circuit portion including a driver circuit TFT and a display portion including a pixel TFT are formed over the same substrate. Thus, the manufacturing cost of the display device can be reduced.

In a display device of one embodiment of the present invention, a display portion includes a pixel TFT and a display portion wiring. A source electrode and a drain electrode of the pixel TFT are formed using an oxide conductor. A semiconductor layer of the pixel TFT is formed using an oxide semiconductor. The display portion wiring is formed using an oxide conductor. That is, in the display device, a region where the pixel TFT and the display portion wiring are formed can be used as a display region in a pixel portion. Thus, the aperture ratio of the display device can be improved.

In a display device of one embodiment of the present invention, a display portion includes a pixel TFT and a display portion wiring. A source electrode and a drain electrode of the pixel TFT are formed using an oxide conductor. A semiconductor layer of the pixel TFT is formed using an oxide semiconductor. The display portion wiring is formed using an oxide conductor. That is, in the display device, it is possible to determine the pixel size without limitation by the size of the pixel TFT. Thus, it is possible to make the display portion of the display device display a higher-resolution image.

In a display device of one embodiment of the present invention, a driver circuit portion includes a driver circuit TFT and a driver circuit wiring. A source electrode and a drain electrode of the driver circuit TFT are formed using a metal. A channel layer of the driver circuit TFT is formed using an oxide semiconductor. The driver circuit wiring is formed using a metal. That is, in the display device, a driver circuit includes a TFT having high field-effect mobility and a wiring having low resistance. Thus, the display device can operate at high speed.

As an oxide semiconductor used in this specification, a thin film of a material expressed by $InMO_3(ZnO)_m$ (m>0) is formed, and a thin film transistor including the thin film as an oxide semiconductor layer is formed. Note that M denotes one or more metal elements selected from Ga, Fe, Ni, Mn, or Co. As an example, M might be Ga or might be Ga and the above metal element other than Ga, for example, M might be Ga and Ni or Ga and Fe. Further, in the oxide semiconductor, in some cases, a transitional metal element such as Fe or Ni or an oxide of the transitional metal is contained as an impurity element in addition to the metal element contained as M. In this specification, among oxide semiconductor layers whose composition formulae are expressed by $InMO_3(ZnO)_m$ (m>0), an oxide semiconductor which includes Ga as M is referred to as an In—Ga—Zn—O-based oxide semiconductor, and a thin film of the In—Ga—Zn—O-based oxide semiconductor is referred to as an In—Ga—Zn—O-based non-single-crystal film.

As an oxide semiconductor used for the oxide semiconductor layer, any of the following oxide semiconductors can be used in addition to the above metal oxide: an In—Sn—Zn—O-based oxide semiconductor; an In—Al—Zn—O-based oxide semiconductor; a Sn—Ga—Zn—O-based oxide semiconductor; an Al—Ga—Zn—O-based oxide semiconductor; a Sn—Al—Zn—O-based oxide semiconductor; an In—Zn—O-based oxide semiconductor; a Sn—Zn—O-based oxide semiconductor; an Al—Zn—O-based oxide semiconductor; an In—O-based oxide semiconductor; a Sn—O-based oxide semiconductor; and a Zn—O-based oxide semiconductor. Silicon oxide may be contained in the oxide semiconductor layer formed using the above oxide semiconductor. When silicon oxide ($SiO_x$ ($x>0$)) which hinders crystallization is contained in the oxide semiconductor layer, crystallization of the oxide semiconductor layer can be suppressed in the case where heat treatment is performed after the formation of the oxide semiconductor layer in the manufacturing process. Note that the oxide semiconductor layer is preferably amorphous but may be partly crystallized.

The oxide semiconductor preferably includes In, further preferably includes In and Ga. Dehydration or dehydrogenation is effective in forming an i-type (intrinsic) oxide semiconductor layer.

In the process for manufacturing the above-mentioned semiconductor device, it is preferable first to change the oxide semiconductor layer into an oxygen-deficient oxide semiconductor layer by the heat treatment of the oxide semiconductor layer in the atmosphere of an inert gas such as nitrogen or a rare gas (e.g., argon or helium) or under reduced pressure so as to be a low-resistant oxide semiconductor layer (i.e., an N-type (e.g., $N^-$-type) oxide semiconductor layer) and then to make the oxide semiconductor layer be in an oxygen-excess state by the formation of an oxide insulating film which is in contact with the oxide semiconductor layer. Accordingly, the oxide semiconductor layer is changed into a high-resistant oxide semiconductor layer, i.e., an i-type oxide semiconductor layer. Thus, it is possible to manufacture a semiconductor device including a highly reliable thin film transistor with favorable electrical characteristics.

The above-mentioned heat treatment is performed at a temperature which is higher than or equal to 350° C., preferably higher than or equal to 400° C., and lower than the strain point of a substrate in the atmosphere of an inert gas such as nitrogen or a rare gas (e.g., argon or helium) or under reduced pressure. In this heat treatment, the oxide semiconductor layer undergoes dehydration or dehydrogenation, which results in the reduction of an impurity such as moisture which is contained in the oxide semiconductor layer.

The oxide semiconductor layer is subjected to the heat treatment for dehydration or dehydrogenation under a heat treatment condition that two peaks of water or at least one peak of water at around 300° C. is not detected even if TDS is performed at up to 450° C. on the dehydrated or dehydrogenated oxide semiconductor layer. Even if TDS is performed at up to 450° C. on a thin film transistor including an oxide semiconductor layer obtained under such dehydration or dehydrogenation condition, at least the peak of water at around 300° C. is not detected.

Cooling after the heat treatment is carried out so that the oxide semiconductor layer does not contact with water or hydrogen, which is achieved by performing the cooling in a furnace used for dehydration or dehydrogenation without exposure of the oxide semiconductor layer to the air. When a thin film transistor is formed using an oxide semiconductor layer obtained by changing an oxide semiconductor layer into a low-resistant oxide semiconductor layer, i.e., an N-type (e.g., $N^-$-type or $N^+$-type) oxide semiconductor layer by dehydration or dehydrogenation and then by changing the low-resistant oxide semiconductor layer into a high-resistant oxide semiconductor layer so as to be an i-type semiconductor layer, the threshold voltage of the thin film transistor can be positive voltage, so that a so-called normally-off switching element can be realized. It is preferable for a display device that a channel be formed with positive threshold voltage and as close to 0 V as possible in a thin film transistor. Note that if the threshold voltage of the thin film transistor is negative, the thin film transistor tends to be normally on; in other words, current flows between a source electrode and a drain electrode even when gate voltage is 0 V. In an active matrix display device, the electrical characteristics of a thin film transistor included in a circuit are important and influence the performance of the display device. Among the electrical characteristics of the thin film transistor, the threshold voltage ($V_{th}$) is particularly important. When the threshold voltage is high or negative even when field-effect mobility is high, it is difficult to control the circuit. In the case where a thin film transistor has high threshold voltage and a large absolute value of its threshold voltage, the thin film transistor cannot perform a switching function as the TFT and might be a load when the TFT is driven at low voltage. In the case of an n-channel thin film transistor, it is preferable that a channel be formed and drain current flows after positive voltage is applied as gate voltage. A transistor in which a channel is not formed unless driving voltage is increased and a transistor in which a channel is formed and drain current flows even when negative voltage is applied are unsuitable for a thin film transistor used in a circuit.

Cooling after the heat treatment may be carried out after switching the gas used in heating to a different gas. For example, cooling may be performed after the furnace used for dehydration or dehydrogenation is filled with a high-purity oxygen gas, a high-purity $N_2O$ gas, or ultra-dry air (having a dew point of −40° C. or lower, preferably −60° C. or lower) without exposure of the oxide semiconductor layer to the air with the use of the furnace used for dehydration or dehydrogenation.

The electrical characteristics of a thin film transistor are improved using an oxide semiconductor film cooled slowly (or cooled) in an atmosphere which does not contain moisture (having a dew point of −40° C. or lower, preferably −60° C. or lower) after moisture which is contained in a film is reduced by heat treatment for dehydration or dehydrogenation, and high-performance thin film transistors which can be mass-produced are realized.

In this specification, heat treatment in the atmosphere of an inert gas such as nitrogen or a rare gas (e.g., argon or helium) or under reduced pressure is referred to as heat treatment for dehydration or dehydrogenation. In this specification, for convenience, dehydration or dehydrogenation refers not only to elimination of $H_2$ but also to elimination of H, OH, or the like.

As mentioned above, by the heat treatment for dehydration or dehydrogenation, the oxide semiconductor layer is changed into an oxygen-deficient oxide semiconductor layer so as to be a low-resistant oxide semiconductor layer, i.e., an N-type (e.g., $N^-$-type) oxide semiconductor layer. Therefore, the formation of a drain electrode layer over the low-resistant oxide semiconductor layer allows a region underneath the drain electrode layer to be formed as a high-resistant drain region (also referred to as an HRD region) which is an oxygen-deficient region.

The carrier concentration of the high-resistant drain region is higher than or equal to $1\times10^{17}/cm^3$ and is at least higher than the carrier concentration of a channel formation region (lower than $1\times10^{17}/cm^3$). Note that the carrier concentration in this specification is carrier concentration obtained by Hall effect measurement at room temperature.

Then, a channel formation region is formed by making at least part of the dehydrated or dehydrogenated oxide semiconductor layer be in an oxygen-excess state so as to be a higher-resistant oxide semiconductor layer, i.e., an i-type oxide semiconductor layer. Note that as the treatment for making part of dehydrated or dehydrogenated the oxide semiconductor layer be in an oxygen-excess state, any of the following methods is employed: deposition of an oxide insulating film by sputtering over and in contact with the dehydrated or dehydrogenated oxide semiconductor layer; heat treatment of the oxide insulating film formed over and in contact with the dehydrated or dehydrogenated oxide semiconductor layer; heat treatment of the oxide insulating film formed over and in contact with the dehydrated or dehydrogenated oxide semiconductor layer in an atmosphere including oxygen; heat treatment of the oxide insulating film formed over and in contact with the dehydrated or dehydrogenated oxide semiconductor layer in an inert gas atmosphere, which is followed by cooling treatment in an oxygen atmosphere; and heat treatment of the oxide insulating film formed over and in contact with the dehydrated or dehydrogenated oxide semiconductor layer in an inert gas atmosphere, which is followed by cooling treatment in ultra-dry air (having a dew point of −40° C. or lower, preferably −60° C. or lower).

Further, at least part of the dehydrated or dehydrogenated oxide semiconductor layer (a portion overlapping with a gate electrode (also referred to as a gate electrode layer)) can be selectively made to be in an oxygen-excess state, which allows the part to be a high-resistant oxide semiconductor layer, i.e., an i-type oxide semiconductor layer. Hence, the channel formation region can be formed. For example, the channel formation region can be formed in such a manner that a source electrode layer and a drain electrode layer formed using metal electrodes of Ti or the like are formed on and in contact with the dehydrated or dehydrogenated oxide semiconductor layer and then the exposure regions which do not overlap with at least one of the source electrode layer and the drain electrode layer are selectively made to be in an oxygen-excess state. In the case where the exposure regions are selectively made to be in an oxygen-excess state, a first high-resistant drain region overlapping with the source electrode layer and a second high-resistant drain region overlapping with the drain electrode layer are formed, and the channel formation region is formed between the first high-resistant drain region and the second high-resistant drain region. That is, the channel formation region is formed between the source electrode layer and the drain electrode layer in a self-aligning manner.

Thus, it is possible to manufacture a semiconductor device including a highly reliable thin film transistor with favorable electrical characteristics.

Note that by forming the high-resistant drain regions in the oxide semiconductor layer overlapping with the drain electrode layer (and the source electrode layer), reliability of a driver circuit can be improved. Specifically, by forming the high-resistant drain regions, a structure can be obtained in which conductivity can be varied gradually from the drain electrode layer to the channel formation region via the high-resistant drain region. Therefore, in the case where the thin film transistor operates with the drain electrode layer connected to a wiring for supplying a high power supply potential VDD, the high-resistant drain region serves as a buffer and a high electric field is not applied locally even if the high electric field is applied between the gate electrode layer and the drain electrode layer, so that the withstand voltage of the transistor can be improved.

In addition, by forming the high-resistant drain regions in the oxide semiconductor layers overlapping with the drain electrode layer (and the source electrode layer), the amount of leakage current in the channel formation region when the driver circuit is formed can be reduced. Specifically, by forming the high-resistant drain regions, the leakage current of the transistor, which flows between the drain electrode layer and the source electrode layer, flows sequentially through the drain electrode layer, the high-resistant drain region on the drain electrode layer side, the channel formation region, the high-resistant drain region on the source electrode layer side, and the source electrode layer. In this case, in the channel formation region, leakage current flowing from a low-resistant N-type region on the drain electrode layer side to the channel formation region can be localized in the vicinity of an interface between the channel formation region and a gate insulating layer which has high resistance when the transistor is off. Thus, the amount of leakage current in a back channel portion (part of a surface of the channel formation region, which is apart from the gate electrode layer) can be reduced.

Further, the first high-resistant drain region overlapping with the source electrode layer and the second high-resistant drain region overlapping with the drain electrode layer may be formed so that they overlap with part of the gate electrode layer, which allows the intensity of an electric field in the vicinity of an end portion of the drain electrode layer to be reduced more effectively.

Note that ordinal numbers such as "first" and "second" in this specification are used for convenience and do not denote the order of steps and the stacking order of layers. In addition, the ordinal numbers in this specification do not denote particular names which specify the present invention.

Further, as a display device including a driver circuit, there are a light-emitting display device including a light-emitting element and a display device including an electrophoretic display element, which is also referred to as electronic paper, in addition to a liquid crystal display device.

In a light-emitting display device including a light-emitting element, a plurality of thin film transistors is included in a pixel portion. The pixel portion includes a region where a gate electrode of a thin film transistor is connected to a source wiring (also referred to as a source wiring layer) or a drain wiring (also referred to as a drain wiring layer) of another transistor. In addition, a driver circuit of the light-emitting display device including a light-emitting element includes a region where a gate electrode of a thin film transistor is connected to a source wiring or a drain wiring of the thin film transistor.

A thin film transistor having stable electrical characteristics can be manufactured. Therefore, a semiconductor device which includes highly reliable thin film transistors having favorable electrical characteristics can be provided.

BRIEF DESCRIPTION OF DRAWINGS

In the accompanying drawings:

FIGS. 3A to 3C illustrate a semiconductor device;

FIGS. 4A1 to 4B2 illustrate multi-tone masks;

FIGS. 5A and 5B each illustrate a semiconductor device;

FIGS. 7A and 7B each illustrate a semiconductor device;

FIGS. 11A to 11C illustrate a semiconductor device;

FIGS. 16A1 to 16B illustrate a semiconductor device;

FIGS. 21A and 21B illustrate a semiconductor device;

BEST MODE FOR CARRYING OUT THE INVENTION

Figure 1A:
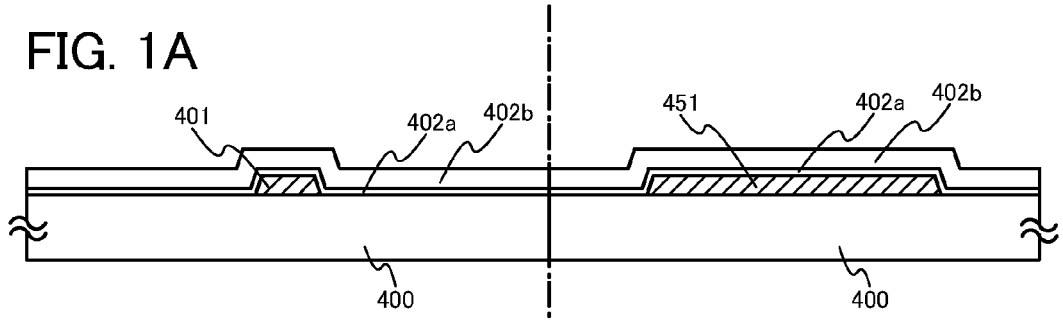
FIGS. 1A to 1E illustrate a method for manufacturing a semiconductor device.

Hereinafter, embodiments of the present invention are described in detail with reference to the accompanying drawings. However, the present invention is not limited to the description below, and it is easily understood by those skilled in the art that modes and details disclosed herein can be modified in various ways. Therefore, the present invention is not construed as being limited to description of the embodiments.

Embodiment 1

A semiconductor device and a method for manufacturing the semiconductor device are described with reference to FIGS. 1A to 1E, FIGS. 2A to 2D, FIGS. 3A to 3C, and FIGS. 4A1 to 4B2. FIG. 3A illustrates examples of cross-sectional structures of two thin film transistors with different structures, which are formed over the same substrate. In FIG. 3A, a thin film transistor 470 has a bottom-gate structure called a channel-etched structure, and a thin film transistor 460 has a bottom-gate structure called a bottom-contact structure (also referred to as an inverted-coplanar structure).

FIG. 3B1 is a plan view of the thin film transistor 470 which is provided in a driver circuit. FIG. 3A includes a cross-sectional view taken along line C1-C2 in FIG. 3B1. FIG. 3C includes a cross-sectional view taken along line C3-C4 in FIG. 3B1. FIG. 3B2 is a plan view of the thin film transistor 460 which is provided in a pixel. FIG. 3A includes a cross-sectional view taken along line D1-D2 in FIG. 3B2. FIG. 3C includes a cross-sectional view taken along line D3-D4 in FIG. 3B2.

The thin film transistor 470 provided in the driver circuit is a channel-etched thin film transistor and includes a gate electrode layer 401, a first gate insulating layer 402a, a second gate insulating layer 402b, an oxide semiconductor layer which includes at least a channel formation region 434, a first high-resistant drain region 431, and a second high-resistant drain region 432, a source electrode layer 405a, and a drain electrode layer 405b over a substrate 400 having an insulating surface. In addition, an oxide insulating film 407 which covers the thin film transistor 470 and is in contact with the channel formation region 434 is provided.

The first high-resistant drain region 431 is formed in contact with a lower surface of the source electrode layer 405a in a self-aligning manner. In addition, the second high-resistant drain region 432 is formed in contact with a lower surface of the drain electrode layer 405b in a self-aligning manner. The channel formation region 434 is in contact with the oxide insulating film 407 and has smaller thickness than the first high-resistant drain region 431 and the second high-resistant drain region 432. Furthermore, the channel formation region 434 is a region (an i-type region) which has higher resistance than the first high-resistant drain region 431 and the second high-resistant drain region 432.

In order to make wirings have low resistance, it is preferable to use a metal material for the source electrode layer 405a and the drain electrode layer 405b in the thin film transistor 470.

A conductive layer 406 is provided above the channel formation region 434 so as to overlap with the channel formation region 434. When the conductive layer 406 is electrically connected to the gate electrode layer 401 and has the same potential as the gate electrode layer 401, gate voltage can be applied from upper and lower sides of the oxide semiconductor layer which is provided between the gate electrode layer 401 and the conductive layer 406. In addition, when the gate electrode layer 401 and the conductive layer 406 have different potentials, for example, the potential of the conductive layer 406 is a fixed potential, GND, or 0 V, electrical characteristics of the TFT, for example, the threshold voltage or the like can be controlled. In other words, when the gate electrode layer 401 functions as a first gate electrode layer and the conductive layer 406 functions as a second gate electrode layer, the thin film transistor 470 can be used as a thin film transistor having four terminals.

A protective insulating layer 408 and a planarization insulating layer 409 are stacked between the conductive layer 406 and the oxide insulating film 407.

The protective insulating layer 408 is preferably formed in contact with the first gate insulating layer 402a provided below the protective insulating layer 408 or in contact with an insulating film serving as a base so as to prevent entry of an impurity such as moisture, a hydrogen ion, or OH⁻ from the vicinity of an edge portion of the substrate. In particular, it is effective to form the first gate insulating layer 402a or the insulating film serving as a base, which is in contact with the protective insulating layer 408, with the use of a silicon nitride film.

The thin film transistor 460 provided in the pixel is a bottom-contact thin film transistor and includes a gate electrode layer 451, the first gate insulating layer 402a, the second gate insulating layer 402b, an oxide semiconductor layer 454 which includes a channel formation region, a source electrode layer 455a, and a drain electrode layer 455b over the substrate 400 having an insulating surface. In addition, the oxide insulating film 407 which covers the thin film transistor 460 and is in contact with an upper surface and a side surface of the oxide semiconductor layer 454 is provided.

Heat treatment for reducing an impurity such as moisture (heat treatment for dehydration or dehydrogenation) is performed after an oxide semiconductor film is formed. The carrier concentration of the oxide semiconductor layer is lowered by, for example, the formation of an oxide insulating film which is in contact with the oxide semiconductor layer after the heat treatment for dehydration or dehydrogenation and slow cooling are performed, which leads to improvement in electrical characteristics of the thin film transistor 460 and improvement in reliability.

Note that the oxide semiconductor layer 454 is formed over the source electrode layer 455a and the drain electrode layer 455b so as to partly overlap with the source electrode layer 455a and the drain electrode layer 455b. In addition, the oxide semiconductor layer 454 overlaps with the gate electrode layer 451 with the first gate insulating layer 402a and the second gate insulating layer 402b therebetween. The channel formation region of the thin film transistor 460 provided in the pixel is a region which is surrounded by a side surface of the source electrode layer 455a and a side surface of the drain electrode layer 455b, which faces the side surface of the source electrode layer 455a, in the oxide semiconductor layer 454, that is, a region which is in contact with the second gate insulating layer 402b and overlaps with the gate electrode layer 451.

In order to realize a display device having high aperture ratio, in which a light-transmitting thin film transistor is used as the thin film transistor 460, a light-transmitting conductive film is used for the source electrode layer 455a and the drain electrode layer 455b.

In addition, a light-transmitting conductive film is used for the gate electrode layer 451 of the thin film transistor 460.

In the pixel in which the thin film transistor 460 is provided, a conductive film having a light-transmitting property with respect to visible light is used for a pixel electrode layer 456, another electrode layer (e.g., a capacitor electrode layer), or another wiring layer (e.g., a capacitor wiring layer) so that the display device having high aperture ratio is realized. Needless to say, it is preferable to use films having light-transmitting properties with respect to visible light for the first gate insulating layer 402a, the second gate insulating layer 402b, and the oxide insulating film 407.

In this specification, a film having a light-transmitting property with respect to visible light refers to a film whose transmittance of visible light is 75 to 100%. In the case where such a film has conductivity, it is also referred to as a transparent conductive film. In addition, a conductive film having translucence with respect to visible light may be used for a metal oxide used for a gate electrode layer, a source electrode layer, a drain electrode layer, a pixel electrode layer, another electrode layer, or another wiring layer. Translucence with respect to visible light refers to a transmittance of 50 to 75%.

Steps of manufacturing the thin film transistor 470 and the thin film transistor 460 over the same substrate are described below with reference to FIGS. 1A to 1E, FIGS. 2A to 2D, FIGS. 3A to 3C, and FIGS. 4A1 to 4B2.

First, a light-transmitting conductive film is formed over the substrate 400 having an insulating surface. Then, the gate electrode layers 401 and 451 are formed in a first photolithography step. In addition, in a pixel portion, a capacitor wiring (also referred to as a capacitor wiring layer) is formed using the same light-transmitting material as the gate electrode layers 401 and 451 in the first photolithography step. In the case where a capacitor is needed not only in the pixel portion but also in the driver circuit, a capacitor wiring is also formed in the driver circuit. Note that a resist mask may be formed by an inkjet method. When the resist mask is formed by an inkjet method, a photomask is not used; thus, manufacturing cost can be reduced.

Although there is no particular limitation to a substrate which can be used as the substrate 400 having an insulating surface, it is necessary that the substrate have heat resistance high enough to withstand at least heat treatment to be performed later. As the substrate 400 having an insulating surface, a glass substrate formed using barium borosilicate glass, aluminoborosilicate glass, or the like can be used.

In the case where the temperature of the heat treatment to be performed later is high, a substrate whose strain point is higher than or equal to 730° C. is preferably used as the substrate 400. For the substrate 400, for example, a glass material such as aluminosilicate glass, aluminoborosilicate glass, or barium borosilicate glass is used. Note that by containing more barium oxide (BaO) than boric acid, a more practical heat-resistant glass substrate can be obtained. Therefore, a glass substrate containing more BaO than $B_2O_3$ is preferably used.

Note that as the substrate 400, a substrate formed using an insulator, such as a ceramic substrate, a quartz substrate, or a sapphire substrate, may be used instead of a glass substrate. Alternatively, crystallized glass or the like can be used.

An insulating film serving as a base film may be provided between the substrate 400 and the gate electrode layers 401 and 451. The base film has a function of preventing diffusion of an impurity element from the substrate 400 and can be formed to have a single-layer structure or a layered structure of one or more of a silicon nitride film, a silicon oxide film, a silicon nitride oxide film, and a silicon oxynitride film. Further, a halogen element such as fluorine or chlorine is added to the base film, so that mobile ions such as sodium can be immobilized. The peak of the concentration of a halogen element to be contained in the base film is measured using a secondary ion mass spectrometer (SIMS) and is preferably in the range of from $1\times10^{15}$ cm$^{-3}$ to $1\times10^{20}$ cm$^{-3}$.

As the material of the gate electrode layers 401 and 451, a conductive material having a light-transmitting property with respect to visible light, for example, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, or a Zn—O-based metal oxide can be used. The thickness of the gate electrode layers 401 and 451 is set within the range of 50 to 300 nm as appropriate. As a deposition method of the metal oxide used for the gate electrode layers 401 and 451, sputtering, vacuum evaporation (e.g., electron beam deposition), arc discharge ion plating, or a spray method is used. In addition, in the case where sputtering is used, it is preferable that deposition be performed using a target containing $SiO_2$ at 2 to 10 percent by weight, and $SiO_x$ (x>0), which inhibits crystallization, be contained in the light-transmitting conductive film so that crystallization is suppressed when the heat treatment for dehydration or dehydrogenation is performed in the later step.

Since a semiconductor film and a wiring are formed over the gate electrode layer 401 and the electrode layer 451, it is preferable that the gate electrode layer 401 and the gate electrode layer 451 be processed to have tapered end portions or stepwise end portions in order to prevent disconnection.

Next, a gate insulating layer is formed over the gate electrode layers 401 and 451.

The gate insulating layer can be formed to have a single-layer structure or a layered structure of one or more of a silicon oxide layer, a silicon nitride layer, a silicon oxynitride layer, and a silicon nitride oxide layer by plasma-enhanced CVD, sputtering, or the like. For example, a silicon oxynitride layer may be formed using a deposition gas containing $SiH_4$, oxygen, and nitrogen by plasma-enhanced CVD.

In this embodiment, a gate insulating layer in which the first gate insulating layer 402a with a thickness of 50 to 200 nm and the second gate insulating layer 402b with a thickness of 50 to 300 nm are stacked is used. For the first gate insulating layer 402a, a 100-nm-thick silicon nitride film or a 100-nm-thick silicon nitride oxide film is used. Further, for the second gate insulating layer 402b, a 100-nm-thick silicon oxide film is used (see FIG. 1A).

Next, the source electrode layer 455a and the drain electrode layer 455b are formed in a second photolithography step after a light-transmitting conductive film is formed over the second gate insulating layer 402b. As a deposition method of the light-transmitting conductive film, sputtering, vacuum evaporation (e.g., electron beam deposition), arc discharge ion plating, or a spray method is used. As the material of the conductive film, a conductive material having a light-transmitting property with respect to visible light, for example, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, or a Zn—O-based metal oxide can be used. The thickness of the conductive film is set within the range of 50 to 300 nm as appropriate. In addition, in the case where sputtering is used, it is preferable that deposition be performed using a target containing $SiO_2$ at 2 to 10 percent by weight, and $SiO_x$ (x>0), which inhibits crystallization, be contained in the light-transmitting conductive film so that crystallization is suppressed when the heat treatment for dehydration or dehydrogenation is performed in the later step.

Note that a resist mask for forming the source electrode layer 455a and the drain electrode layer 455b may be formed by an inkjet method. When the resist mask is formed by an inkjet method, a photomask is not used; thus, manufacturing cost can be reduced.

Figure 1B:
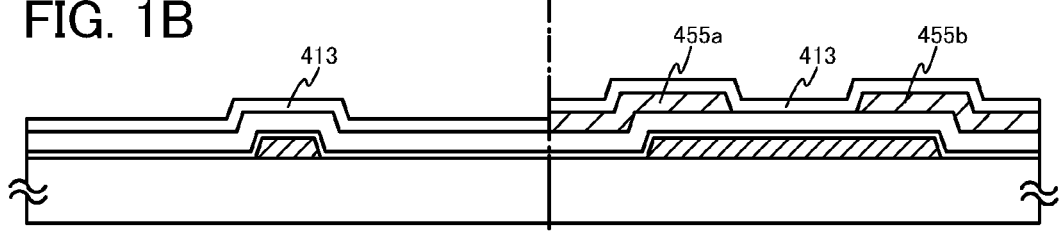
Figure 1C:
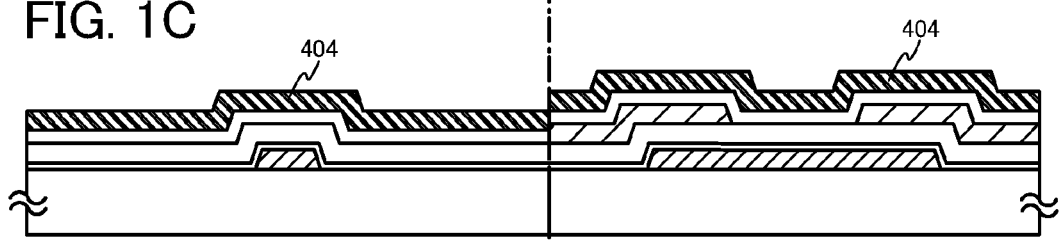

Next, an oxide semiconductor film 413 with a thickness of 2 to 200 nm is formed over the second gate insulating layer 402b, the source electrode layer 455a, and the drain electrode layer 455b (see FIG. 1B). The thickness of the oxide semiconductor film 413 is preferably smaller than or equal to 50 nm in order that the oxide semiconductor layer be amorphous even when heat treatment for dehydration or dehydrogenation is performed after the oxide semiconductor film 413 is formed. When the thickness of the oxide semiconductor layer is made small, crystallization can be suppressed when heat treatment is performed after the oxide semiconductor layer is formed.

Note that before the oxide semiconductor film 413 is formed by sputtering, dust on a surface of the second gate insulating layer 402b is preferably removed by reverse sputtering in which an argon gas is introduced and plasma is generated. The reverse sputtering refers to a method in which, without application of voltage to a target side, an RF power supply is used for application of voltage to a substrate side in an argon atmosphere and plasma is generated in the vicinity of the substrate so that a substrate surface is modified. Note that nitrogen, helium, oxygen, or the like may be used instead of the argon atmosphere.

As the oxide semiconductor film 413, an In—Ga—Zn—O-based non-single-crystal film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film is used. In this embodiment, the oxide semiconductor film 413 is formed by sputtering with the use of an In—Ga—Zn—O-based oxide semiconductor target. Sputtering may be carried out in a rare gas (typically argon) atmosphere, an oxygen atmosphere, or an atmosphere including a rare gas (typically argon) and oxygen. In the case where sputtering is used, it is preferable that deposition be performed using a target containing $SiO_2$ at 2 to 10 percent by weight to allow $SiO_x$ (x>0), which inhibits crystallization, to be contained in the oxide semiconductor film 413 so that crystallization is suppressed when the heat treatment for dehydration or dehydrogenation is performed in the later step.

Then, the oxide semiconductor film 413 is subjected to dehydration or dehydrogenation. The temperature of first heat treatment for dehydration or dehydrogenation is set to higher than or equal to 350° C., preferably higher than or equal to 400° C., and lower than the strain point of the substrate. Here, the substrate is put in an electric furnace which is one of heat treatment apparatuses and heat treatment is performed on the oxide semiconductor film 413 in a nitrogen atmosphere (see FIG. 1B). In this embodiment, the same furnace is used from a heat temperature T at which the oxide semiconductor layer is subjected to dehydration or dehydrogenation to a temperature low enough to prevent entry of moisture again; specifically, slow cooling is performed in a nitrogen atmosphere until the temperature drops by 100° C. or more from the heat temperature T. Note that without limitation to a nitrogen atmosphere, dehydration or dehydrogenation may be performed in a rare gas atmosphere such as helium, neon, or argon or under reduced pressure.

It is preferable that nitrogen or a rare gas such as helium, neon, or argon do not include moisture, hydrogen, or the like in the first heat treatment. For example, nitrogen or a rare gas such as helium, neon, or argon, which is introduced into the heat treatment apparatus, preferably has 6N purity (99.9999%) or more, further preferably 7N purity (99.99999%) or more (i.e., the impurity concentration is preferably 1 ppm or lower, more preferably 0.1 ppm or lower).

In some cases, the oxide semiconductor layer is crystallized to be a microcrystalline film or a polycrystalline film depending on the conditions of the first heat treatment or the material of the oxide semiconductor layer.

Further, before the formation of the oxide semiconductor film, heat treatment may be performed in an inert gas atmosphere (e.g., nitrogen, helium, neon, or argon), an oxygen atmosphere, or under reduced pressure (at a temperature of higher than or equal to 400° C. and lower than the strain point of the substrate) so that impurities contained in the gate insulating layer, such as hydrogen and water, may be removed.

Then, a metal conductive film 404 is formed over the oxide semiconductor film 413. As a material of the metal conductive film 404, a film including an element selected from Al, Cr, Cu, Ta, Ti, Mo, or W, an alloy film including any of the above elements as a component, a stacked film of the above elements (including the alloy thereof), or the like is used (see FIG. 1C).

As the metal conductive film 404, a three-layer structure in which an aluminum layer is stacked over a titanium layer and a titanium layer is stacked over the aluminum layer or a three-layer structure in which an aluminum layer is stacked over a molybdenum layer and a molybdenum layer is stacked over the aluminum layer is preferably used. Needless to say, the metal conductive film 404 may have a single-layer structure, a two-layer structure, or a stacked-layer structure including four or more layers. In this embodiment, as the metal conductive film 404, a stack of conductive films of a titanium film, an aluminum film, and a titanium film is used.

Figure 1D:
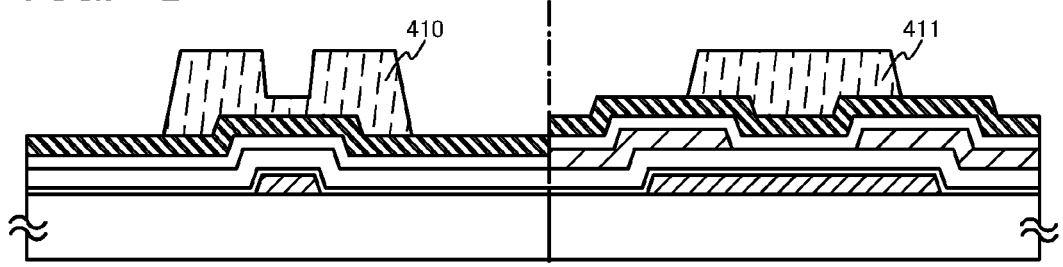

Then, a resist mask 410 and a resist mask 411 are formed over the metal conductive film 404 in a third photolithography step (see FIG. 1D). The resist mask 410 of this embodiment is a resist mask having a depressed portion and a projected portion. In other words, the resist mask 410 can also be referred to as a resist mask including a plurality of regions (here, two regions) having different thicknesses. A region of the resist mask 410, which has a larger thickness, is referred to as a projected portion of the resist mask 410. A region of the resist mask 410, which has a smaller thickness, is referred to as a depressed portion of the resist mask 410.

In the resist mask 410, the projected portions are formed over regions where the source electrode layer 405a and the drain electrode layer 405b are to be formed and the depressed portion is formed over a region which is to be a channel formation region formed between the source electrode layer 405a and the drain electrode layer 405b.

The resist mask 410 can be formed using a multi-tone mask. Here, multi-tone masks are described below with reference to FIGS. 4A1 to 4B2.

The multi-tone mask is a mask capable of light exposure with multi-level light intensity, typically, light exposure with three levels of light intensity to provide an exposed region, a half-exposed region, and an unexposed region. With the use of the multi-tone mask, one-time light exposure and development process allow a resist mask with plural thicknesses (typically, two levels of thicknesses) to be formed. Therefore, with the use of a multi-tone mask, the number of photomasks can be reduced.

FIGS. 4A1 and 4B1 illustrate cross-sectional views of typical multi-tone masks. FIG. 4A1 illustrates a gray-tone mask 900 and FIG. 4B1 illustrates a half-tone mask 910.

The gray-tone mask 900 illustrated in FIG. 4A1 includes a light-blocking portion 902 formed using a light-blocking film and a diffraction grating portion 903 provided with a pattern of the light-blocking film which are formed on a light-transmitting substrate 901.

The diffraction grating portion 903 has slits, dots, meshes, or the like which are provided at intervals less than or equal to the resolution limit of light used for light exposure, whereby the amount of light transmitted through the diffraction grating portion 903 is controlled. Note that the slits, dots, or meshes provided at the diffraction grating portion 903 may be provided periodically or non-periodically.

As the light-transmitting substrate 901, quartz or the like can be used. The light-blocking film for forming the light-blocking portion 902 and the diffraction grating portion 903 may be formed using a metal material, and chromium, chromium oxide, or the like is preferably used.

In the case where the gray-tone mask 900 is irradiated with light for light exposure, as illustrated in FIG. 4A2, the light transmittance of the region overlapping with the light-blocking portion 902 is 0%, and the light transmittance of the region where neither the light-blocking portion 902 nor the diffraction grating portion 903 is provided is 100%. Further, the light transmittance at the diffraction grating portion 903 is approximately in the range of 10 to 70%, which can be adjusted by the interval of slits, dots, meshes, or the like of the diffraction grating.

The half-tone mask 910 illustrated in FIG. 4B1 includes a light-blocking portion 912 formed using a light-blocking film and a semi-light-transmitting portion 913 formed using a semi-light-transmitting film which are formed on the light-transmitting substrate 911.

The semi-light-transmitting portion 913 can be formed using a film of MoSiN, MoSi, MoSiO, MoSiON, CrSi, or the like. The light-blocking portion 912 may be formed using a metal material similar to the material of the light-blocking film of the gray-tone mask, and chromium, chromium oxide, or the like is preferably used.

In the case where the half-tone mask 910 is irradiated with light for light exposure, as illustrated in FIG. 4B2, the light transmittance of the region overlapping with the light-blocking portion 912 is 0%, and the light transmittance of the region where neither the light-blocking portion 912 nor the semi-light-transmitting portion 913 is provided is 100%. Further, the light transmittance in the semi-light-transmitting portion 913 is approximately in the range of 10 to 70%, which can be adjusted by the kind, the thickness, or the like of the material to be formed.

By light exposure and development with the use of the multi-tone mask, the resist mask 410 which has regions with different thicknesses can be formed. Note that without limitation thereto, the resist mask 410 may be formed without using a multi-tone mask.

Figure 1E:
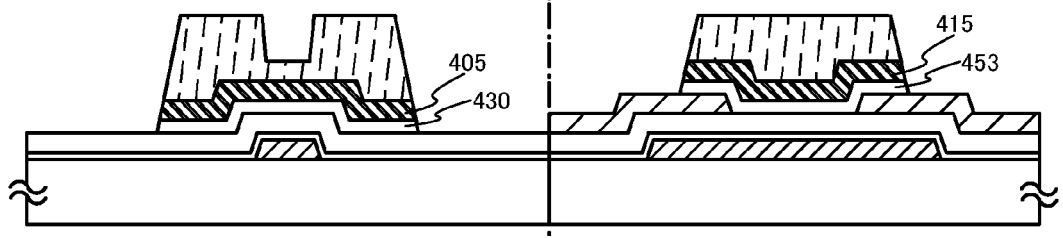

Then, the metal conductive film 404 and the oxide semiconductor film 413 are selectively etched at the same time, with the use of the resist mask 410 and the resist mask 411, so that an oxide semiconductor layer 430 and an oxide semiconductor layer 453, which are island-shaped oxide semiconductor layers, a conductive layer 405, and a conductive layer 415 are formed (see FIG. 1E). When the stack of conductive films of a titanium film, an aluminum film, and a titanium film is used as the metal conductive film 404, the metal conductive film 404 and the oxide semiconductor film 413 can be etched by dry etching in which a chlorine gas is used.

Then, the resist mask 410 and the resist mask 411 are made to recede (reduce), so that a resist mask 410a, a resist mask 410b, and a resist mask 411a are formed. In order to make the resist masks recede (reduce), ashing or the like in which oxygen plasma is used may be performed. The resist mask 410 is made to recede (reduce), so that a portion of the conductive layer 405, which is between the resist mask 410a and the resist mask 410b, is exposed.

Next, the portion of the conductive layer 405, which is between the resist mask 410a and the resist mask 410b, is selectively etched using the resist mask 410a and the resist mask 410b, so that the source electrode layer 405a and the drain electrode layer 405b are formed. Note that at this time, a region of the oxide semiconductor layer 430, which is between the source electrode layer 405a and the drain electrode layer 405b, is partly etched, so that a groove (depressed portion) is formed in the oxide semiconductor layer 430.

Figure 2A:
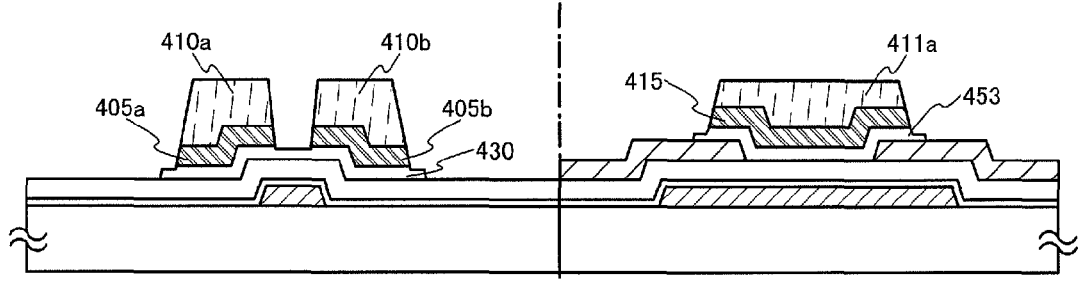
FIGS. 2A to 2D illustrate a method for manufacturing a semiconductor device.
Figure 2B:
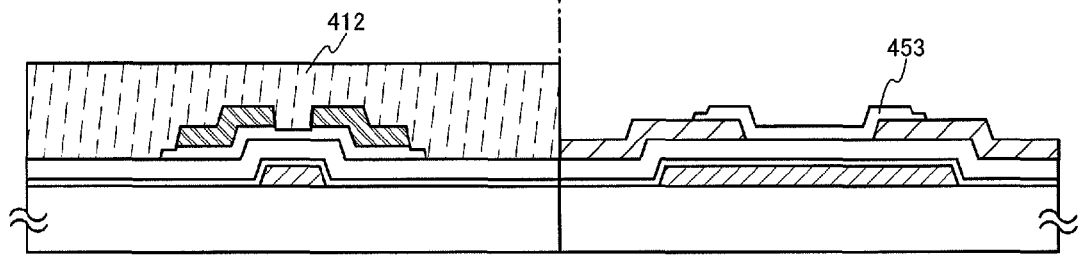
Figure 2C:
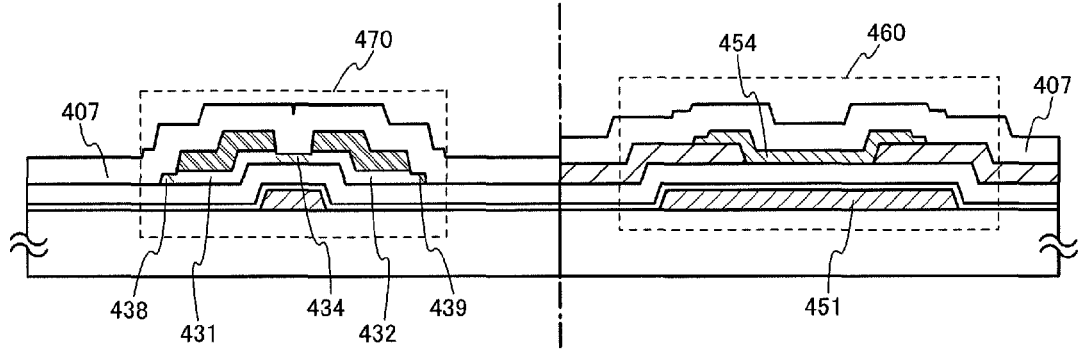

Further, since peripheral portions of the conductive layer 405 and the conductive layer 415 are etched in accordance with the amount of recession (reduction) of the resist mask 410 and the resist mask 411, peripheral portions of the oxide semiconductor layer 430 and the oxide semiconductor layer 453 protrude outside edges of the source electrode layer 405a and the drain electrode layer 405b, and the conductive layer 415, respectively, and the protruding peripheral portions of the oxide semiconductor layer 430 and the oxide semiconductor layer 453 have smaller thicknesses (see FIG. 2A).

Then, the resist masks 410a, 410b, and 411a are removed, and a resist mask 412 is formed in a fourth photolithography step. The conductive layer 415 is etched using the resist mask 412, so that the oxide semiconductor layer 453 is exposed (see FIG. 2B).

Materials of the oxide semiconductor layer 453, the source electrode layer 455a, and the drain electrode layer 455b and etching conditions are adjusted as appropriate so that the oxide semiconductor layer 453, the source electrode layer 455a, and the drain electrode layer 455b are not removed in etching the conductive layer 415. Alternatively, the resist mask may be formed by an inkjet method. A photomask is not needed when the resist mask is formed by an inkjet method, so that manufacturing cost can be reduced.

Then, the resist mask 412 is removed, and the oxide insulating film 407 serving as a protective insulating film is formed, which is in contact with an upper surface and side surfaces of the oxide semiconductor layer 453, and the groove (depressed portion), a projected region 438, and a projected region 439 of the oxide semiconductor layer 430.

The oxide insulating film 407 has a thickness of at least 1 nm or larger and can be formed by a method by which impurities such as water and hydrogen are not mixed into the oxide insulating film 407, such as sputtering, as appropriate. In this embodiment, a 300-nm-thick silicon oxide film is deposited as the oxide insulating film 407 by sputtering. The substrate temperature at the time of deposition is in the range of room temperature to 300° C., and is 100° C. in this embodiment. The silicon oxide film can be deposited by sputtering in a rare gas (typically argon) atmosphere, an oxygen atmosphere, or an atmosphere including a rare gas (typically argon) and oxygen. Further, a silicon oxide target or a silicon target can be used as a target. For example, silicon oxide film can be deposited using a silicon target in an atmosphere including oxygen and nitrogen by sputtering. The oxide insulating film 407 which is formed in contact with the oxide semiconductor layer whose resistance is lowered by the dehydration or dehydrogenation is formed using an inorganic insulating film which does not contain an impurity such as moisture, a hydrogen ion, or OH⁻ and blocks entry of such an impurity from the outside. Typically, a silicon oxide film, a silicon nitride oxide film, an aluminum oxide film, or an aluminum oxynitride film is used.

Next, second heat treatment (preferably at 200 to 400° C., for example, 250 to 350° C.) is performed. For example, the second heat treatment is performed in a nitrogen atmosphere at 250° C. for one hour. By the second heat treatment, heat is applied while the groove in the oxide semiconductor layer 430 and the upper surface and the side surfaces of the oxide semiconductor layer 453 are in contact with the oxide insulating film 407.

Through the above steps, heat treatment for dehydration or dehydrogenation is performed on the oxide semiconductor film after deposition to reduce the resistance, and then, part of the oxide semiconductor film is selectively made to be an oxygen-excess state. Accordingly, the channel formation region 434 overlapping with the gate electrode layer 401, and the projected regions 438 and 439 become intrinsic, and the first high-resistant drain region 431 which overlaps with the source electrode layer 405a and the second high-resistant drain region 432 which overlaps with the drain electrode layer 405b are formed in a self-aligning manner. Further, the entire oxide semiconductor layer 453 becomes intrinsic and serves as the oxide semiconductor layer 454 including a channel formation region (see FIG. 2C).

Note that by forming the second high-resistant drain region 432 (and the first high-resistant drain region 431) in the oxide semiconductor layer overlapping with the drain electrode layer 405b (and the source electrode layer 405a), reliability of a driver circuit can be improved. Specifically, by forming the second high-resistant drain region 432, a structure can be employed in which conductivity can be varied stepwise from the drain electrode layer to the channel formation region via the second high-resistant drain region 432. Therefore, in the case where the thin film transistor operates with the drain electrode layer 405b connected to a wiring for supplying a high power supply potential VDD, the high-resistant drain region serves as a buffer and a high electric field is not applied locally even if the high electric field is applied between the gate electrode layer 401 and the drain electrode layer 405b, so that the withstand voltage of the transistor can be improved.

Note that by forming the second high-resistant drain region 432 (and the first high-resistant drain region 431) in the oxide semiconductor layer overlapping with the drain electrode layer 405b (and the source electrode layer 405a), the amount of leakage current in the channel formation region 434 can be reduced.

Figure 2D:
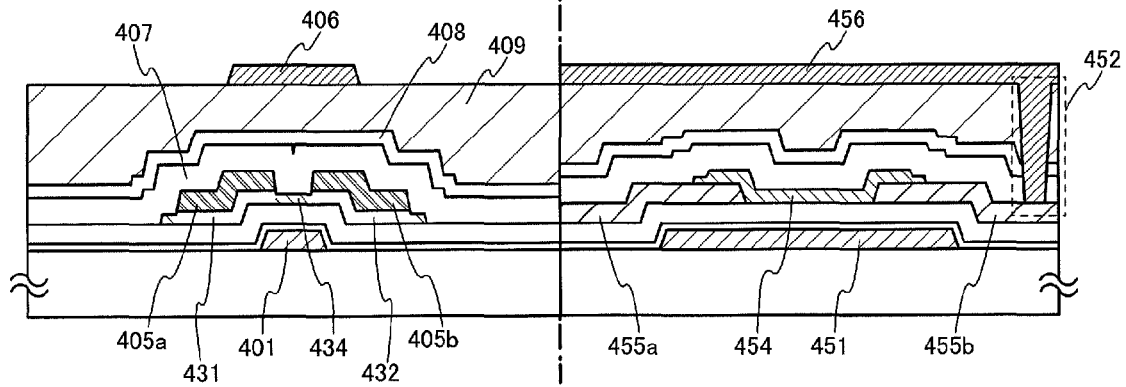

Then, the protective insulating layer 408 is formed over the oxide insulating film 407 (see FIG. 2D). In this embodiment, a silicon nitride film is formed by RF sputtering. Since RF sputtering has high productivity, it is preferably used as a deposition method of the protective insulating layer 408. The protective insulating layer 408 is formed using an inorganic insulating film which does not contain an impurity such as moisture, a hydrogen ion, or OH⁻ and blocks entry of such an impurity from the outside. Typically, a silicon nitride film, an aluminum nitride film, a silicon nitride oxide film, or an aluminum oxynitride film is used. Needless to say, the protective insulating layer 408 is formed using a light-transmitting insulating film.

It is preferable that the protective insulating layer 408 be in contact with the first gate insulating layer 402a provided below the protective insulating layer 408 or in contact with the insulating film serving as a base so that entry of an impurity such as moisture, a hydrogen ion, or OH⁻, from the vicinity of an edge portion of the substrate can be prevented. In particular, it is effective to form the first gate insulating layer 402a or the insulating film serving as a base, which is in contact with the protective insulating layer 408, with the use of a silicon nitride film. In other words, when a silicon nitride film is provided so as to surround a lower surface, an upper surface, and a side surface of the oxide semiconductor layer, reliability of the display device is improved.

Next, the planarization insulating layer 409 is formed over the protective insulating layer 408. The planarization insulating layer 409 can be formed using an organic material having heat resistance, such as polyimide, an acrylic resin, a benzocyclobutene-based resin, polyamide, or an epoxy resin. Other than such an organic material, it is possible to use a low-dielectric constant material (a low-k material), a siloxane-based resin, phosphosilicate glass (PSG), borophosphosilicate glass (BPSG), or the like. Note that the planarization insulating layer 409 may be formed by stacking a plurality of insulating films formed using these materials.

Note that a siloxane-based resin corresponds to a resin including a Si—O—Si bond formed using a siloxane-based material as a starting material. The siloxane-based resin may include an organic group (e.g., an alkyl group or an aryl group) as a substituent. Further, the organic group may include a fluoro group.

There is no particular limitation to the method for forming the planarization insulating layer 409. The planarization insulating layer 409 can be formed, depending on the material, by a method such as sputtering, an SOG method, a spin coating method, a dipping method, a spray coating method, or a droplet discharge method (e.g., an inkjet method, screen printing, or offset printing), or a tool (equipment) such as a doctor knife, a roll coater, a curtain coater, or a knife coater.

Then, a resist mask is formed in a fifth photolithography step and a contact hole 452 which reaches the drain electrode layer 455b is formed by etching of the planarization insulating layer 409, the protective insulating layer 408, and the oxide insulating film 407. In addition, contact holes (not illustrated) which reach the gate electrode layers 401 and 451 are formed by this etching. The resist mask for forming the contact hole which reaches the drain electrode layer 455b may be formed by an inkjet method. When the resist mask is formed by an inkjet method, a photomask is not used; thus, manufacturing cost can be reduced.

Next, a light-transmitting conductive film is formed after the resist mask is removed. The light-transmitting conductive film is formed using indium oxide, a mixed oxide of indium and tin (abbreviated as ITO), or the like by sputtering, vacuum evaporation, or the like. Alternatively, an Al—Zn—O-based non-single-crystal film containing nitrogen (i.e., an Al—Zn—O—N-based non-single-crystal film), a Zn—O-based non-single-crystal film containing nitrogen (i.e., a Zn—O—N-based non-single crystal film), or a Sn—Zn—O-based non-single-crystal film containing nitrogen (i.e., a Sn—Zn—O—N-based non-single-crystal film) may be used as the material of the light-transmitting conductive film. Note that the composition ratio (atomic %) of zinc in the Al—Zn—O—N-based non-single-crystal film is less than or equal to 47 atomic % and is higher than that of aluminum in the non-single-crystal film; the composition ratio (atomic %) of aluminum in the Al—Zn—O—N-based non-single-crystal film is higher than that of nitrogen in the non-single-crystal film. Such a material is etched with a hydrochloric acid-based solution. However, since a residue is easily left on the substrate particularly in etching ITO, a mixed oxide of indium and zinc may be used in order to improve etching processability.

Note that the unit of the composition ratio in the light-transmitting conductive film is atomic percent (atomic %), and the composition ratio is evaluated by analysis using an electron probe X-ray microanalyzer (EPMA).

Next, a resist mask is formed in a sixth photolithography step, and unnecessary portions are removed by etching so that the pixel electrode layer 456 and the conductive layer 406 are formed (see FIG. 2D).

Through the above steps, over the same substrate, the thin film transistor 470 and the thin film transistor 460 can be separately formed in the driver circuit and the pixel portion with the use of six masks. Further, a storage capacitor which includes a capacitor wiring and a capacitor electrode (also referred to as a capacitor electrode layer) with the first gate insulating layer 402a and the second gate insulating layer 402b used as dielectrics can be formed over the same substrate. The thin film transistors 460 and storage capacitors are arranged in matrix to correspond to individual pixels so that the pixel portion is formed and the driver circuit including the thin film transistor 470 is provided around the pixel portion. Thus, one of the substrates for manufacturing an active matrix display device can be obtained. In this specification, such a substrate is referred to as an active matrix substrate for convenience.

Note that the pixel electrode layer 456 is electrically connected to the capacitor electrode layer through the contact hole 452 formed in the planarization insulating layer 409, the protective insulating layer 408, and the oxide insulating film 407. Note that the capacitor electrode layer can be formed using the same light-transmitting material in the same step as the source electrode layer 455a and the drain electrode layer 455b.

The conductive layer 406 is provided so as to overlap with the channel formation region 434 in the oxide semiconductor layer, whereby in a bias-temperature stress test (hereinafter referred to as a BT test) for examining the reliability of a thin film transistor, the amount of change in the threshold voltage of the thin film transistor 470 before and after the BT test can be reduced. Further, a potential of the conductive layer 406 may be the same as or different from that of the gate electrode layer 401. The conductive layer 406 can function also as a second gate electrode layer. Alternatively, the potential of the conductive layer 406 may be GND or 0 V, or the conductive layer 406 may be in a floating state.

Alternatively, the resist mask for forming the pixel electrode layer 456 may be formed by an inkjet method. When the resist mask is formed by an inkjet method, a photomask is not used; thus, manufacturing cost can be reduced.

This embodiment can be freely combined with any of the other embodiments.

Embodiment 2

In this embodiment, an example is described in which an active matrix liquid crystal display device is manufactured using the active matrix substrate described in Embodiment 1.

Figure 6:
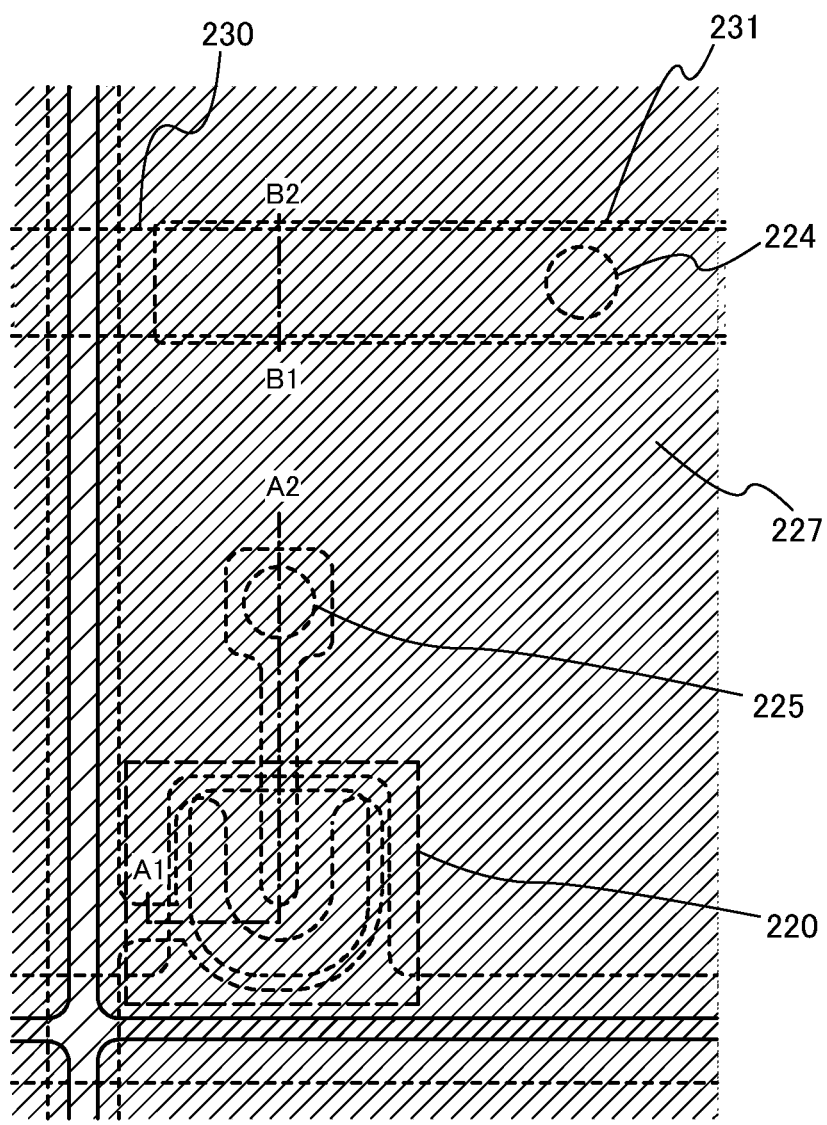
FIG. 6 illustrates a semiconductor device.

FIG. 5A illustrates an example of a cross-sectional structure of an active matrix substrate. Note that FIG. 6 illustrates part of a top view of a pixel portion. A cross section taken along dash-dot line A1-A2 in FIG. 6 corresponds to a cross section taken along line A1-A2 in FIG. 5A. A cross section taken along dash-dot line B1-B2 in FIG. 6 corresponds to a cross section taken along line B1-B2 in FIG. 5A. In the layout of a pixel illustrated in FIG. 6, the shape of an upper surface of a source electrode layer overlapping with an oxide semiconductor layer is a U-shape or a C-shape, which is different from that in Embodiment 1; however, this embodiment is not particularly limited to this.

The thin film transistor in the driver circuit and the thin film transistor in the pixel portion which are formed over the same substrate are illustrated in Embodiment 1; in this embodiment, a storage capacitor, a gate wiring (also referred to as a gate wiring layer), and a terminal portion of a source wiring are illustrated in addition to these thin film transistors. The capacitor, the gate wiring, and the terminal portion of the source wiring can be formed in the same manufacturing steps as in Embodiment 1 and can be manufactured without the increase in the number of photomasks and the increase in the number of steps. Further, in a portion serving as a display region in a pixel portion, all the gate wiring, the source wiring, and a capacitor wiring layer are formed using light-transmitting conductive films, which results in high aperture ratio.

Further, a metal wiring is used for a source wiring layer in a portion which is not the display region in order to reduce wiring resistance.

In FIG. 5A, a thin film transistor 210 is a channel-etched thin film transistor provided in a driver circuit, and a thin film transistor 220 which is electrically connected to a pixel electrode layer 227 is a bottom-contact thin film transistor provided in a pixel portion.

In this embodiment, the thin film transistor 220 formed over a substrate 200 has the same structure as the thin film transistor 460 in Embodiment 1.

A capacitor wiring layer 230 which is formed using the same light-transmitting material in the same step as a gate electrode layer of the thin film transistor 220 overlaps with a capacitor electrode 231 with a first gate insulating layer 202a and a second gate insulating layer 202b serving as dielectrics therebetween; thus, a storage capacitor is formed. Note that the capacitor electrode 231 is formed using the same light-transmitting material in the same step as a source electrode layer and a drain electrode layer of the thin film transistor 220. Thus, the storage capacitor has a light-transmitting property as well as the thin film transistor 220, so that the aperture ratio can be improved.

It is important for the storage capacitor to have a light-transmitting property in improving the aperture ratio. In a small liquid crystal display panel of 10 inches or smaller in particular, high aperture ratio can be realized even when the size of a pixel is made small in order to realize higher resolution of display images by increasing the number of gate wirings, for example. Further, high aperture ratio can be realized by using light-transmitting films as materials of the thin film transistor 220 and the storage capacitor even when one pixel is divided into a plurality of subpixels in order to realize a wide viewing angle. That is, high aperture ratio can be realized even when thin film transistors are densely arranged, and the display region can have a sufficient area. For example, when one pixel includes two to four subpixels and storage capacitors, the storage capacitors have light-transmitting properties as well as the thin film transistors, so that the aperture ratio can be improved.

Note that the storage capacitor is provided below the pixel electrode layer 227, and the capacitor electrode 231 is electrically connected to the pixel electrode layer 227.

In this embodiment, an example is described in which the storage capacitor is formed using the capacitor electrode 231 and the capacitor wiring layer 230; however, there is no particular limitation to the structure of the storage capacitor. For example, the storage capacitor may be formed in such a manner that, without provision of a capacitor wiring layer, a pixel electrode layer overlaps with a gate wiring in an adjacent pixel with a planarization insulating layer, a protective insulating layer, a first gate insulating layer, and a second gate insulating layer therebetween.

FIG. 6 illustrates a contact hole 224 for electrically connecting the capacitor electrode 231 and the pixel electrode layer 227 to each other. The contact hole 224 can be formed using the same photomask as that used for forming a contact hole 225 for electrically connecting the drain electrode layer of the thin film transistor 220 and the pixel electrode layer 227 to each other. Thus, the contact hole 224 can be formed without the increase in the number of steps.

A plurality of gate wirings, source wirings, and capacitor wiring layers are provided in accordance with pixel density. Further, in the terminal portion, a plurality of first terminal electrodes each having the same potential as the gate wiring, a plurality of second terminal electrodes each having the same potential as the source wiring, a plurality of third terminal electrodes each having the same potential as the capacitor wiring layer, and the like are arranged. There is no particular limitation to the number of each of the terminal electrodes, and the number of the terminals may be determined by a practitioner as appropriate.

In the terminal portion, the first terminal electrode which has the same potential as the gate wiring can be formed using the same light-transmitting material as the pixel electrode layer 227. The first terminal electrode is electrically connected to the gate wiring through a contact hole which reaches the gate wiring. The contact hole which reaches the gate wiring is formed by selective etching of a planarization insulating layer 204, a protective insulating layer 203, an oxide insulating layer 216, the second gate insulating layer 202b, and the first gate insulating layer 202a with the use of the same photomask as that used for forming the contact hole 225 for electrically connecting the drain electrode layer of the thin film transistor 220 and the pixel electrode layer 227 to each other.

A gate electrode layer of the thin film transistor 210 provided in the driver circuit may be electrically connected to a conductive layer 217 provided above an oxide semiconductor layer. In that case, a contact hole is formed by selective etching of the planarization insulating layer 204, the protective insulating layer 203, the oxide insulating layer 216, the second gate insulating layer 202b, and the first gate insulating layer 202a with the use of the same photomask as that used for forming the contact hole 225 for electrically connecting the drain electrode layer of the thin film transistor 220 and the pixel electrode layer 227 to each other. The conductive layer 217 and the gate electrode layer of the thin film transistor 210 provided in the driver circuit are electrically connected to each other through the contact hole.

A second terminal electrode 235 which has the same potential as a source wiring 234 in the driver circuit can be formed using the same light-transmitting material as the pixel electrode layer 227. The second terminal electrode 235 is electrically connected to the source wiring through a contact hole which reaches the source wiring 234. The source wiring 234 is a metal wiring, is formed using the same material in the same step as a source electrode layer of the thin film transistor 210, and has the same potential as the source electrode layer of the thin film transistor 210.

Since the source wiring 234 of the driver circuit is formed in a photolithography step in which a multi-tone mask is used in Embodiment 1, an oxide semiconductor layer 233 exists below the source wiring 234.

The third terminal electrode which has the same potential as the capacitor wiring layer 230 can be formed using the same light-transmitting material as the pixel electrode layer 227. Further, a contact hole which reaches the capacitor wiring layer 230 can be formed using the same photomask in the same step as those for forming the contact hole 224 for electrically connecting the capacitor electrode 231 and the pixel electrode layer 227 to each other.

In the case of manufacturing an active matrix liquid crystal display device, a liquid crystal layer is provided between an active matrix substrate and a counter substrate provided with a counter electrode (also referred to as a counter electrode layer), and the active matrix substrate and the counter substrate are fixed. Note that a common electrode which is electrically connected to the counter electrode provided on the counter substrate is provided over the active matrix substrate, and a fourth terminal electrode which is electrically connected to the common electrode is provided in the terminal portion. The fourth terminal electrode is used for setting a potential of the common electrode to a fixed potential such as GND or 0 V. The fourth terminal electrode can be formed using the same light-transmitting material as the pixel electrode layer 227.

There is no particular limitation to the structure where the source electrode layer of the thin film transistor 220 and the source electrode layer of the thin film transistor 210 are electrically connected to each other. For example, a connection electrode for connecting the source electrode layer of the thin film transistor 220 and the source electrode layer of the thin film transistor 210 may be formed in the same step as the pixel electrode layer 227. Further, in the portion which is not the display region, the source electrode layer of the thin film transistor 220 and the source electrode layer of the thin film transistor 210 may be in contact with each other so as to overlap with each other.

Note that FIG. 5A illustrates a cross-sectional structure of a gate wiring layer 232 in the driver circuit. Since an example of a small liquid crystal display panel of 10 inches or smaller is described in this embodiment, the gate wiring layer 232 in the driver circuit is formed using the same light-transmitting material as the gate electrode layer of the thin film transistor 220.

When the same material is used for the gate electrode layer, the source electrode layer, the drain electrode layer, the pixel electrode layer, another electrode layer, and another wiring layer, a common sputtering target and a common manufacturing apparatus can be used, and material cost and cost of an etchant (or an etching gas) used in etching can be reduced. Accordingly, manufacturing cost can be reduced.

In the case where a photosensitive resin material is used for the planarization insulating layer 204 in the structure of FIG. 5A, the step of forming a resist mask can be omitted.

FIG. 5B illustrates a cross-sectional structure, part of which is different from the structure in FIG. 5A. FIG. 5B is the same as FIG. 5A except that the planarization insulating layer 204 is not provided; thus, the same portions are denoted by the same reference numerals and detailed description of the same portions is not repeated. In FIG. 5B, the pixel electrode layer 227, the conductive layer 217, and the second terminal electrode 235 are formed on and in contact with the protective insulating layer 203.

With the structure in FIG. 5B, the step of forming the planarization insulating layer 204 can be omitted.

This embodiment can be freely combined with any of the other embodiments.

Embodiment 3

There is a possibility that the resistance of a light-transmitting wiring might become a problem in the case where the size of a liquid crystal display panel exceeds 10 inches and reaches 60 inches and even 120 inches. Therefore, this embodiment will show an example where part of a gate wiring is formed using a metal wiring so that the wiring resistance is reduced.

Note that in FIG. 7A, the same portions as in FIG. 5A are denoted by the same reference numerals and detailed description of the same portions is not repeated.

FIG. 7A illustrates an example where part of a gate wiring in a driver circuit is formed using a metal wiring and formed in contact with a light-transmitting wiring which is the same as the gate electrode layer of the thin film transistor 210. Note that the number of photomasks is larger than that in Embodiment 1 since the metal wiring is formed.

First, a heat-resistant conductive material film (with a thickness of 100 nm to 500 nm) that can withstand first heat treatment for dehydration or dehydrogenation is formed over a substrate 200.

In this embodiment, a 370-nm-thick tungsten film and a 50-nm-thick tantalum nitride film are formed. Although a stack of the tantalum nitride film and the tungsten film is used as the conductive film here, there is no particular limitation and the conductive film may be formed using an element selected from Ta, W, Ti, Mo, Al, or Cu; an alloy containing any of these elements as its component, an alloy film containing a combination of any of these elements, or a nitride containing any of these elements as its component. The heat-resistant conductive material film is not limited to a single layer containing the above-described element and may be a stack of two or more layers.

In a first photolithography step, metal wirings are formed, so that a first metal wiring layer 236 and a second metal wiring layer 237 are formed. An inductively coupled plasma (ICP) etching method is preferably used for etching of the tungsten film and the tantalum nitride film. The films can be etched into a desired tapered shape with an ICP etching method with appropriate adjustment of etching conditions (e.g., the amount of electric power applied to a coiled electrode, the amount of electric power applied to a substrate-side electrode, and the temperature of the substrate-side electrode). The first metal wiring layer 236 and the second metal wiring layer 237 are tapered; thus, defects in forming a light-transmitting conductive film on the first metal wiring layer 236 and the second metal wiring layer 237 can be reduced.

Then, after the light-transmitting conductive film is formed, a gate wiring layer 238, a gate electrode layer of the thin film transistor 210, and a gate electrode layer of the thin film transistor 220 are formed in a second photolithography step. The light-transmitting conductive film is formed using any of the conductive materials that transmit visible light described in Embodiment 1.

Note that some materials for the light-transmitting conductive film cause the formation of an oxide film at a surface of the first metal wiring layer 236 or the second metal wiring layer 237 which contacts with the gate wiring layer 238, which occurs in later heat treatment or the like and results in the increase in contact resistance. Consequently, the second metal wiring layer 237 is preferably formed using a metal nitride film that prevents oxidation of the first metal wiring layer 236.

Next, a gate insulating layer, an oxide semiconductor layer, and the like are formed in the same steps as in Embodiment 1. Subsequent steps are performed as described in Embodiment 1 so as to complete the active matrix substrate.

This embodiment shows an example in which after the formation of the planarization insulating layer 204, the planarization insulating layer in a terminal portion is selectively removed using a photomask. It is preferable that the planarization insulating layer be not placed in the terminal portion so that the terminal portion can be connected to an FPC in a favorable manner.

In FIG. 7A, the second terminal electrode 235 is formed over the protective insulating layer 203. FIG. 7A illustrates the gate wiring layer 238 which overlaps with part of the second metal wiring layer 237; alternatively, the gate wiring layer may entirely cover the first metal wiring layer 236 and the second metal wiring layer 237. In other words, the first metal wiring layer 236 and the second metal wiring layer 237 can be referred to as auxiliary wirings for reducing the resistance of the gate wiring layer 238.

In the terminal portion, a first terminal electrode which has the same potential as the gate wiring is formed over the protective insulating layer 203 and electrically connected to the second metal wiring layer 237. A wiring led from the terminal portion is also formed using a metal wiring.

Furthermore, in order to reduce the wiring resistance, the metal wirings (i.e., the first metal wiring layer 236 and the second metal wiring layer 237) can be used as the auxiliary wirings for the gate wiring and a capacitor wiring in a portion which is not located in a display region.

FIG. 7B illustrates a cross-sectional structure, part of which is different from the structure in FIG. 7A. FIG. 7B is the same as FIG. 7A except for a material of the gate electrode layer in the thin film transistor in the driver circuit; therefore, the same portions are denoted by the same reference numerals and detailed description of the same portions is not repeated.

FIG. 7B illustrates an example in which the gate electrode layer in the thin film transistor in the driver circuit is formed using a metal wiring. In the driver circuit, a material of the gate electrode layer is not limited to a light-transmitting material.

In FIG. 7B, a thin film transistor 240 provided in the driver circuit includes a gate electrode layer in which a second metal wiring layer 241 is stacked over a first metal wiring layer 242. Note that the first metal wiring layer 242 can be formed using the same material in the same step as the first metal wiring layer 236. Moreover, the second metal wiring layer 241 can be formed using the same material in the same step as the second metal wiring layer 237.

In the case where the gate electrode layer of the thin film transistor 240 is electrically connected to the conductive layer 217, it is preferable to use a metal nitride film as the second metal wiring layer 241 for preventing oxidation of the first metal wiring layer 242.

In this embodiment, a metal wiring is used for some wirings of the driver circuit so that the wiring resistance is reduced; and high definition of display images can be achieved and high aperture ratio can be maintained even when the size of a liquid crystal display panel exceeds 10 inches and reaches 60 inches and even 120 inches.

This embodiment can be freely combined with any of the other embodiments.

Embodiment 4

Figure 8A:
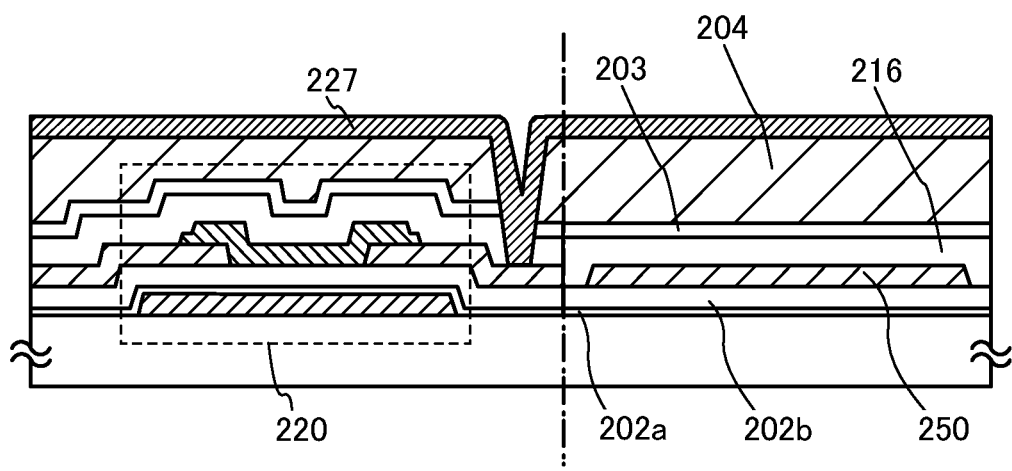
FIGS. 8A and 8B each illustrate a semiconductor device.

In this embodiment, an example of a structure of a storage capacitor, which is different from that in Embodiment 2, will be described with reference to FIGS. 8A and 8B. FIG. 8A is the same as FIG. 5A except for a structure of the storage capacitor; therefore, the same portions are denoted by the same reference numerals and detailed description of the same portions is not repeated. FIG. 8A illustrates a cross-sectional structure of the thin film transistor 220 provided in a pixel and a storage capacitor.

FIG. 8A illustrates an example in which the storage capacitor is formed using the pixel electrode layer 227 and a capacitor wiring layer 250 which overlaps with the pixel electrode layer 227, with the oxide insulating layer 216, the protective insulating layer 203, and the planarization insulating layer 204 serving as dielectrics. Since the capacitor wiring layer 250 is formed using the same light-transmitting material in the same step as the source electrode layer of the thin film transistor 220 provided in the pixel, the capacitor wiring layer 250 is arranged so as not to overlap with a source wiring layer of the thin film transistor 220.

In the storage capacitor illustrated in FIG. 8A, a pair of electrodes and the dielectrics have light-transmitting properties, and thus the storage capacitor as a whole has light-transmitting properties.

Figure 8B:
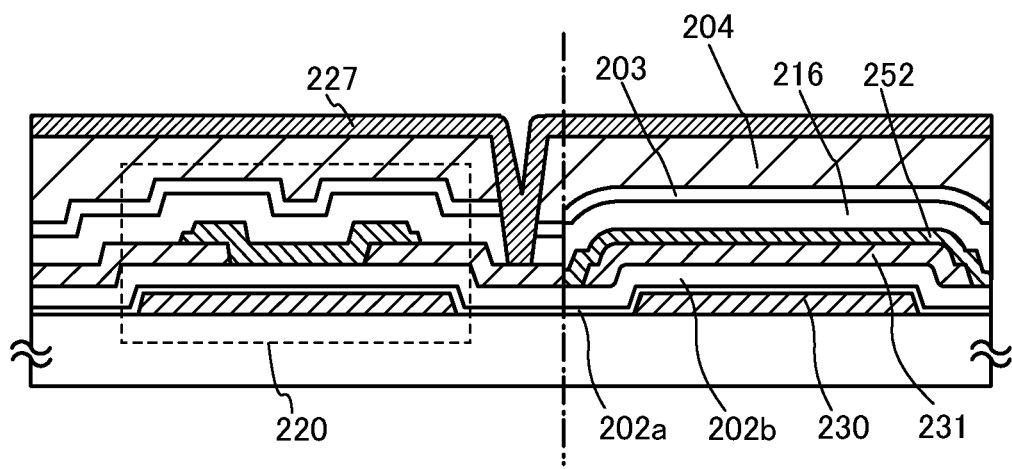

FIG. 8B illustrates an example of a structure of the storage capacitor, which is different from that in FIG. 8A. FIG. 8B is the same as FIG. 5A except for a structure of the storage capacitor; therefore, the same portions are denoted by the same reference numerals and detailed description of the same portions is not repeated.

FIG. 8B illustrates an example in which the storage capacitor is formed using the capacitor wiring layer 230 and a stack of an oxide semiconductor layer 252 which overlaps with the capacitor wiring layer 230 and the capacitor electrode 231 with the first gate insulating layer 202a and the second gate insulating layer 202b serving as dielectrics. The oxide semiconductor layer 252 is stacked on and in contact with the capacitor electrode 231 and functions as one electrode of the storage capacitor. Note that the capacitor electrode 231 is formed using the same light-transmitting material in the same step as the source electrode layer and the drain electrode layer of the thin film transistor 220. Moreover, since the capacitor wiring layer 230 is formed using the same light-transmitting material in the same step as the gate electrode layer of the thin film transistor 220, the capacitor wiring layer 230 is arranged so as not to overlap with a gate wiring layer of the thin film transistor 220.

The capacitor electrode 231 is electrically connected to the pixel electrode layer 227.

Also in the storage capacitor illustrated in FIG. 8B, a pair of electrodes and the dielectrics have light-transmitting properties, and thus the storage capacitor as a whole has light-transmitting properties.

Each of the storage capacitors illustrated in FIGS. 8A and 8B has light-transmitting properties; thus, sufficient capacitance and high aperture ratio can be obtained even when the size of pixels is decreased in order to realize higher definition of display images by increasing the number of gate wirings, for example.

This embodiment can be freely combined with any of the other embodiments.

Embodiment 5

In this embodiment, an example of first heat treatment which is different from that in Embodiment 1 is described with reference to FIGS. 9A to 9E, FIGS. 10A to 10D, and FIGS. 11A to 11C. Since FIGS. 9A to 9E, FIGS. 10A to 10D, and FIGS. 11A to 11C are the same as FIGS. 1A to 1E, FIGS. 2A to 2D, and FIGS. 3A to 3C except for part of the steps, the same reference numerals are used for the same portions, and detailed description of the same portions is not repeated.

First, as described in Embodiment 1, a light-transmitting conductive film is formed over the substrate 400 having an insulating surface, and then the gate electrode layers 401 and 451 are formed in a first photolithography step.

Figure 9A:
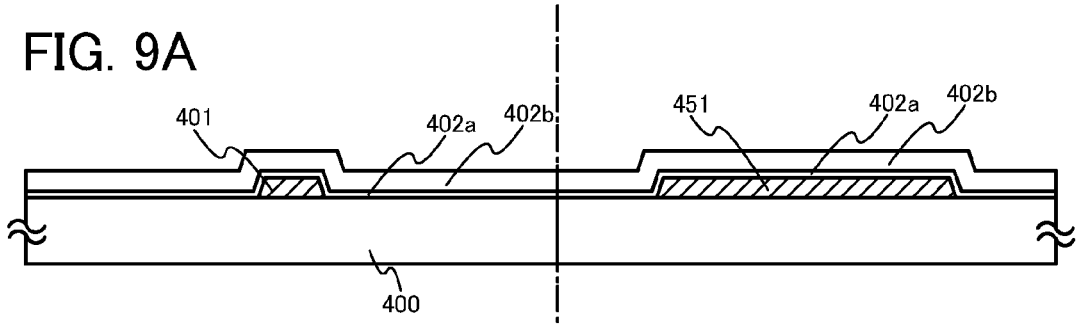
FIGS. 9A to 9E illustrate a method for manufacturing a semiconductor device.

Next, the first gate insulating layer 402a and the second gate insulating layer 402b are stacked over the gate electrode layer 401 (see FIG. 9A).

Next, a light-transmitting conductive film is formed over the second gate insulating layer 402b, and then the source electrode layer 455a and the drain electrode layer 455b are formed in a second photolithography step. Note that FIG. 9A is the same as FIG. 1A.

Next, the oxide semiconductor film 413 with a thickness of 2 nm to 200 nm is formed over the second gate insulating layer 402b, the source electrode layer 455a, and the drain electrode layer 455b. Note that the steps up to here are the same as those in Embodiment 1.

Then, the oxide semiconductor film is subjected to dehydration or dehydrogenation in an inert gas atmosphere or under reduced pressure. The temperature of the first heat treatment for dehydration or dehydrogenation is set to higher than or equal to 350° C., preferably higher than or equal to 400° C., and lower than the strain point of the substrate. Here, the substrate is put in an electric furnace which is one of heat treatment apparatuses and the oxide semiconductor film is subjected to heat treatment in a nitrogen atmosphere. Then, without exposure of the substrate to the air, moisture or hydrogen are prevented from being mixed into the oxide semiconductor film again and the oxide semiconductor film is made to have lower resistance, that is, made to be an N-type (N$^-$-type, N$^+$-type, or the like) as an oxygen-deficiency type. After that, a high-purity oxygen gas or a high-purity N$_2$O gas is introduced into the same furnace and cooling is performed. It is preferable that water, hydrogen, or the like be not contained in the oxygen gas or the N$_2$O gas. For example, the oxygen gas or the N$_2$O gas, which is introduced into the heat treatment apparatus, preferably has 6N purity (99.9999%) or higher, further preferably 7N purity (99.99999%) or higher. In other words, an impurity concentration in the oxygen gas or the N$_2$O gas is preferably 1 ppm or lower, further preferably 0.1 ppm or lower.

In addition, after the first heat treatment for dehydration or dehydrogenation, heat treatment may be performed at higher than or equal to 200° C. and lower than or equal to 400° C., preferably higher than or equal to 200° C. and lower than or equal to 300° C., in an oxygen gas atmosphere or an N$_2$O gas atmosphere.

Figure 9B:
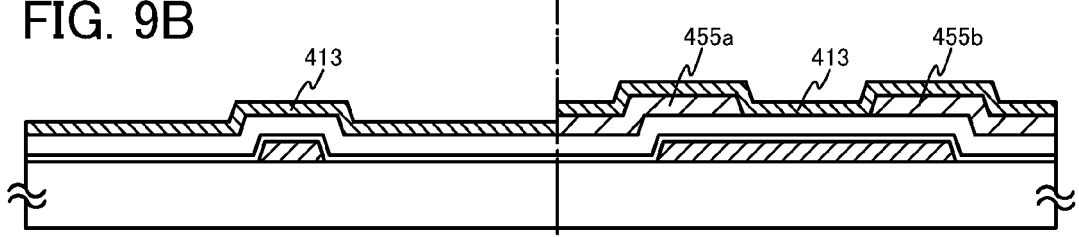

The entire oxide semiconductor film is made to be in an oxygen-excess state through the above steps; thus, the oxide semiconductor film is made to have high resistance, that is, the oxide semiconductor film is made to be intrinsic (see FIG. 9B).

Accordingly, reliability of a thin film transistor which is to be completed can be increased.

Figure 9C:
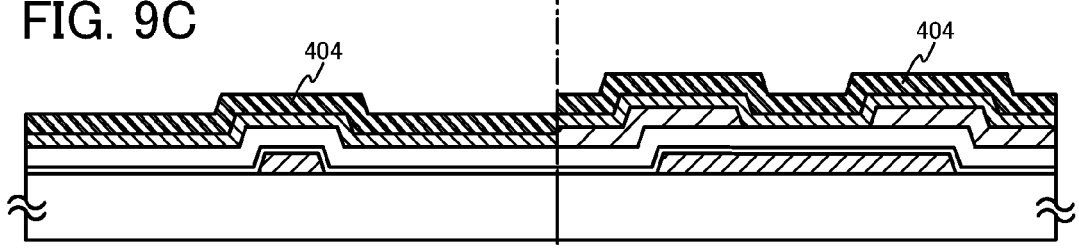

Then, the metal conductive film 404 is formed over the oxide semiconductor film 413 (see FIG. 9C).

Figure 9D:
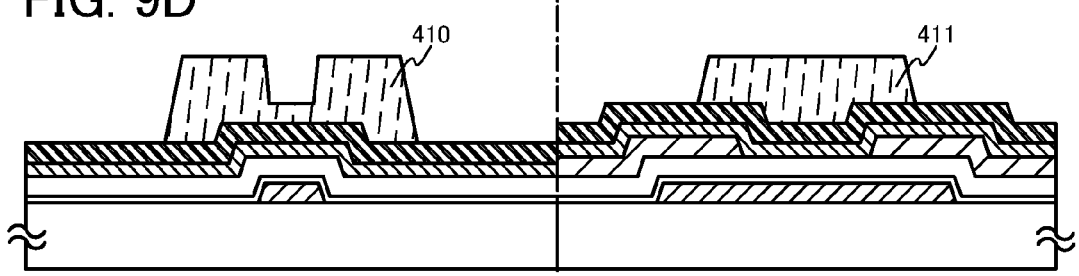
Figure 9E:
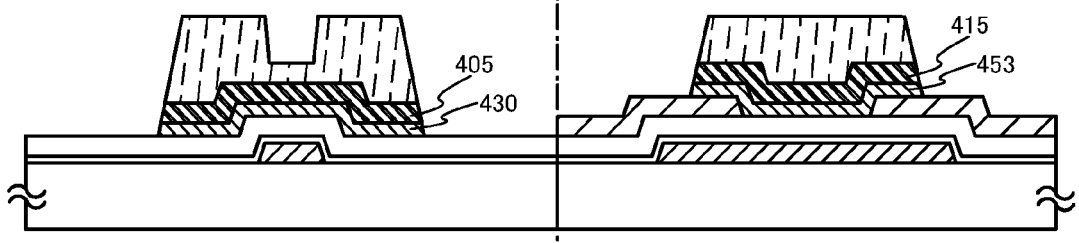
Figure 10A:
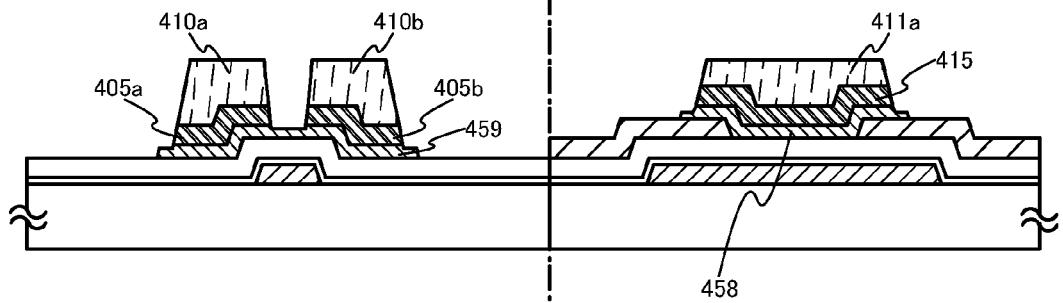
FIGS. 10A to 10D illustrate a method for manufacturing a semiconductor device.
Figure 10B:
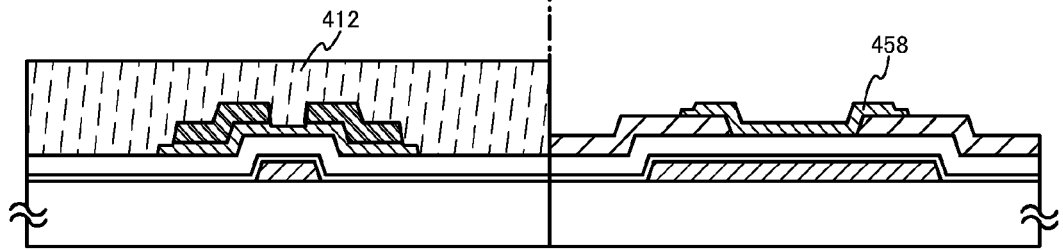
Figure 10C:
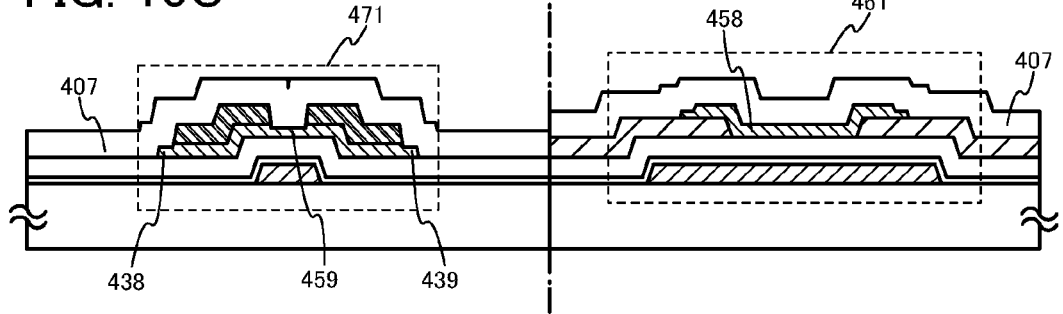
Figure 10D:
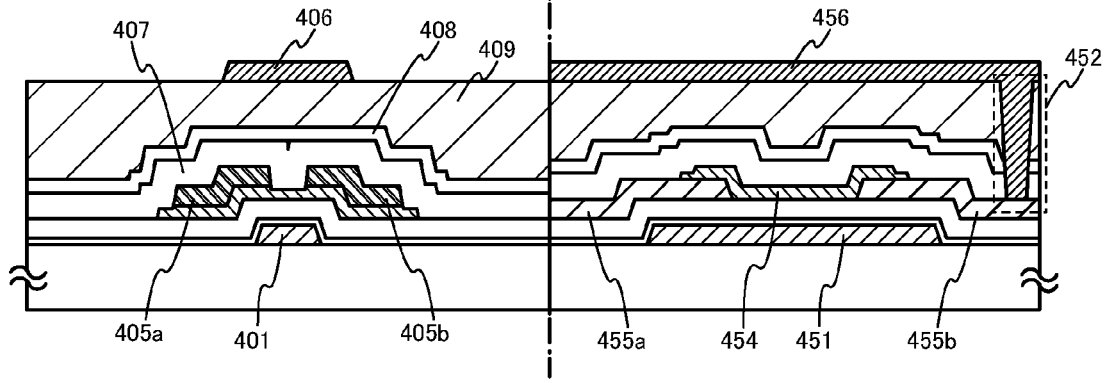

Next, as in Embodiment 1, the resist mask 410 and the resist mask 411 having a projected portion and a depressed portion are formed over the metal conductive film 404 in a third photolithography step with the use of a multi-tone mask (see FIG. 9D).

Next, through the similar steps to those described in Embodiment 1, the source electrode layer 405a, the drain electrode layer 405b, the conductive layer 415, an oxide semiconductor layer 458, and an oxide semiconductor layer 459 having a groove (depressed portion) are formed. Note that peripheral portions of the oxide semiconductor layer 459 and the oxide semiconductor layer 458 protrude outside edges of the source electrode layer 405a and the drain electrode layer 405b, and the conductive layer 415, respectively, and the protruding peripheral portions of the oxide semiconductor layer 430 and the oxide semiconductor layer 453 have smaller thicknesses (see FIG. 9E and FIG. 10A).

Then, the resist masks 410a, 410b, and 411a are removed, and the resist mask 412 is formed in a fourth photolithography step. The conductive layer 415 is etched using the resist mask 412 so that the oxide semiconductor layer 458 is exposed (see FIG. 10B).

In addition, before the formation of the oxide semiconductor film, heat treatment may be performed in an inert gas atmosphere (e.g., nitrogen, helium, neon, or argon), an oxygen atmosphere, or under reduced pressure (at higher than or equal to 400° C. and lower than the strain point of the substrate) to remove an impurity such as hydrogen or water, which is included in the gate insulating layer.

Then, the resist mask 412 is removed, and the oxide insulating film 407 serving as a protective insulating film is formed, which is in contact with an upper surface and side surfaces of the oxide semiconductor layer 458, and the groove (depressed portion), the projected region 438, and the projected region 439 of the oxide semiconductor layer 459.

Then, second heat treatment is performed in an inert gas atmosphere or an oxygen gas atmosphere (preferably at higher than or equal to 200° C. and lower than or equal to 400° C., for example, higher than or equal to 250° C. and lower than or equal to 350° C.) (see FIG. 10C). For example, the second heat treatment is performed in a nitrogen atmosphere at 250° C. for one hour.

Next, the protective insulating layer 408 is formed over the oxide insulating film 407.

After that, the planarization insulating layer 409 is formed over the protective insulating layer 408.

Then, a resist mask is formed in a fifth photolithography step, and the planarization insulating layer 409, the protective insulating layer 408, and the oxide insulating film 407 are etched so that a contact hole 452 which reaches the drain electrode layer 455b is formed.

Then, the resist mask is removed, and a light-transmitting conductive film is formed.

Next, a resist mask is formed in a sixth photolithography step. Unnecessary portions are etched away so that the pixel electrode layer 456 and the conductive layer 406 are formed (see FIG. 10D).

Through the above steps, over the same substrate, a thin film transistor 471 and a thin film transistor 461 can be separately formed in a driver circuit and a pixel portion with the use of six masks. In addition, a storage capacitor which is formed with a capacitor wiring layer and a capacitor electrode with the use of the first gate insulating layer 402a and the second gate insulating layer 402b as dielectrics can be formed over the same substrate. The thin film transistors 461 and storage capacitors are arranged in matrix so as to correspond to individual pixels so that a pixel portion is formed and a driver circuit including the thin film transistor 471 is provided around the pixel portion. Thus, one of the substrates for manufacturing an active matrix display device can be obtained. In this specification, such a substrate is referred to as an active matrix substrate for convenience.

The conductive layer 406 is provided so as to overlap with the channel formation region in the oxide semiconductor layer 459, whereby in a bias-temperature stress test (hereinafter, referred to as a BT test) for examining the reliability of a thin film transistor, the amount of change in the threshold voltage of the thin film transistor 471 before and after the BT test can be reduced. Further, a potential of the conductive layer 406 may be the same as or different from that of the gate electrode layer 401. The conductive layer 406 can function also as a second gate electrode layer. Alternatively, the potential of the conductive layer 406 may be GND or 0 V, or the conductive layer 406 may be in a floating state.

FIG. 11B1 is a plan view of the channel-etched thin film transistor 471 which is provided in the driver circuit. FIG. 11A includes a cross-sectional view taken along line C1-C2 in FIG. 11B1. FIG. 11C includes a cross-sectional view taken along line C3-C4 in FIG. 11B1. FIG. 11B2 is a plan view of the thin film transistor 461 which is provided in the pixel. FIG. 11A includes a cross-sectional view taken along line D1-D2 in FIG. 11B2. FIG. 11C includes a cross-sectional view taken along line D3-D4 in FIG. 11B2.

This embodiment can be freely combined with any of the other embodiments.

Embodiment 6

In this embodiment, an example is described below in which at least some of driver circuits and a thin film transistor provided in a pixel portion are formed over the same substrate.

The thin film transistor provided in the pixel portion is formed in accordance with Embodiments 1 to 5. The thin film transistors described in Embodiments 1 to 5 are n-channel TFTs; therefore, some of driver circuits which can be formed using n-channel TFTs are formed over the same substrate as the thin film transistor of the pixel portion.

Figure 12A:
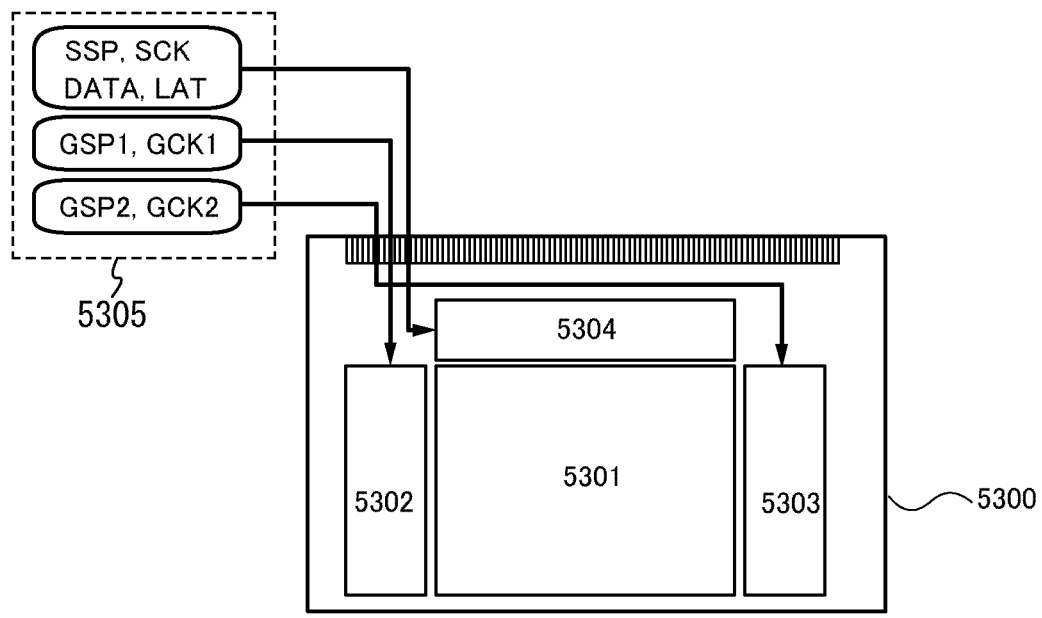
FIGS. 12A and 12B are each a block diagram of a semiconductor device.

FIG. 12A illustrates an example of a block diagram of an active matrix display device. The display device includes a pixel portion 5301, a first scan line driver circuit 5302, a second scan line driver circuit 5303, and a signal line driver circuit 5304 over a substrate 5300. In the pixel portion 5301, a plurality of signal lines which are extended from the signal line driver circuit 5304 and a plurality of scan lines which are extended from the first scan line driver circuit 5302 and the second scan line driver circuit 5303 are provided. Note that pixels which include display elements are arranged in matrix in regions where the scan lines and the signal lines are crossed. In addition, the substrate 5300 of the display device is connected to a timing control circuit 5305 (also referred to as a controller or a control IC) through a connection portion such as a flexible printed circuit (FPC).

In FIG. 12A, the first scan line driver circuit 5302, the second scan line driver circuit 5303, and the signal line driver circuit 5304 are formed over the same substrate 5300 as the pixel portion 5301. Therefore, the number of components of a driver circuit which is provided outside and the like is reduced, which leads to cost reduction. Further, the number of connections in the connection portion can be reduced by extending wirings in the case where a driver circuit is provided outside the substrate 5300, which leads to improvement in reliability or improvement in a yield.

The timing control circuit 5305 supplies, for example, a first scan line driver circuit start signal (GSP1) and a scan line driver circuit clock signal (GCK1) to the first scan line driver circuit 5302. The timing control circuit 5305 supplies, for example, a second scan line driver circuit start signal (GSP2, also referred to as a start pulse) and a scan line driver circuit clock signal (GCK2) to the second scan line driver circuit 5303. The timing control circuit 5305 supplies a signal line driver circuit start signal (SSP), a signal line driver circuit clock signal (SCK), video signal data (DATA, also simply referred to as a video signal), and a latch signal (LAT) to the signal line driver circuit 5304. Note that each clock signal may be a plurality of clock signals whose phases are shifted or may be supplied together with an inverted clock signal (CKB) which is obtained by inverting the clock signal. Note that one of the first scan line driver circuit 5302 and the second scan line driver circuit 5303 can be eliminated.

Figure 12B:
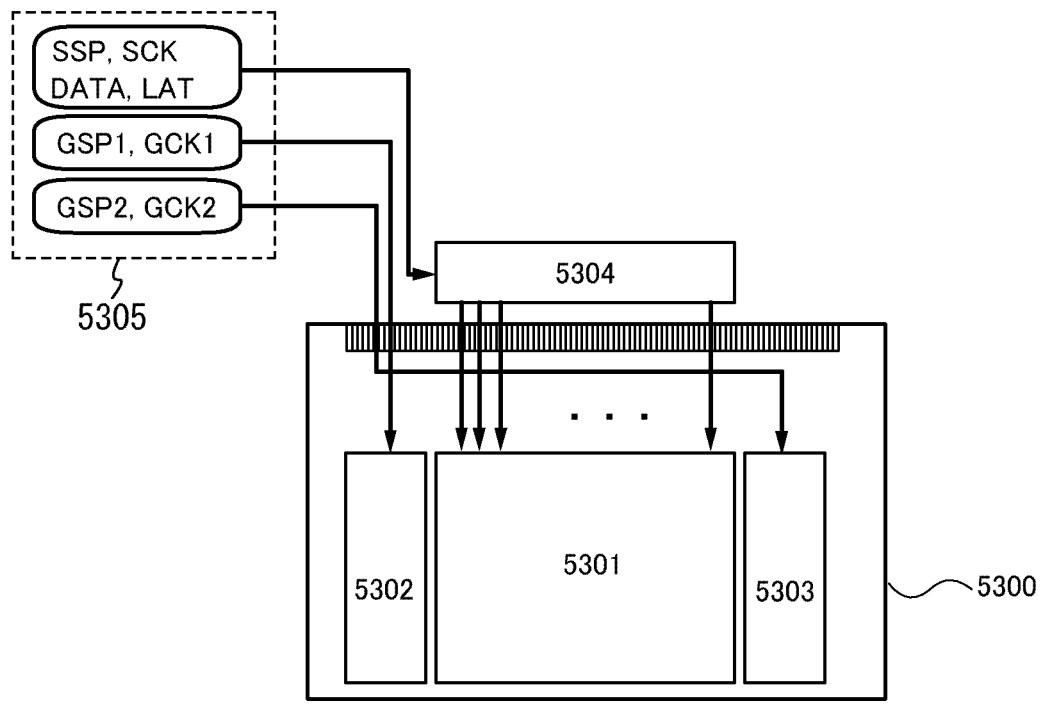

FIG. 12B illustrates a structure in which the first scan line driver circuit 5302 and the second scan line driver circuit 5303 are formed over the same substrate 5300 as the pixel portion 5301 and the signal line driver circuit 5304 is formed over a substrate which is different from the pixel portion 5301.

Figure 13A:
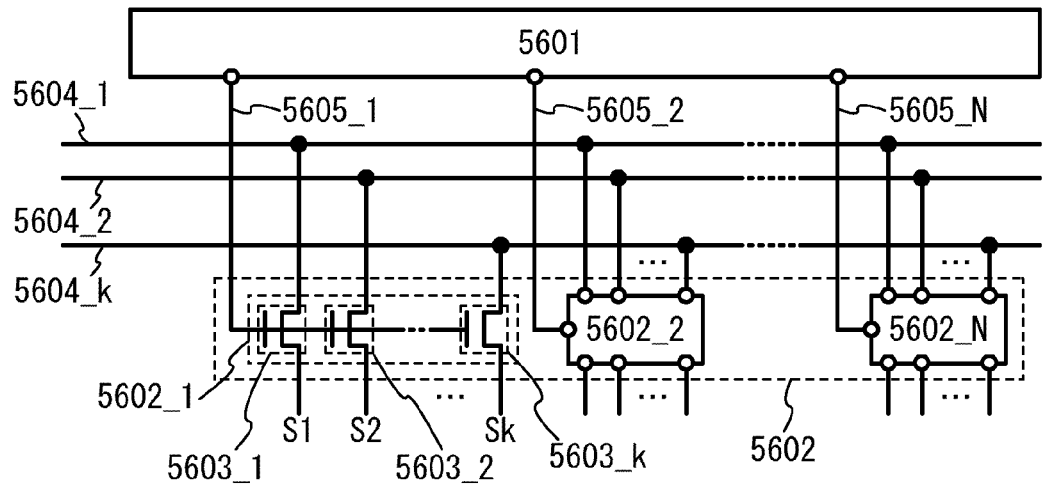
FIGS. 13A and 13B are a circuit diagram and a timing chart of a signal line driver circuit.
Figure 13B:
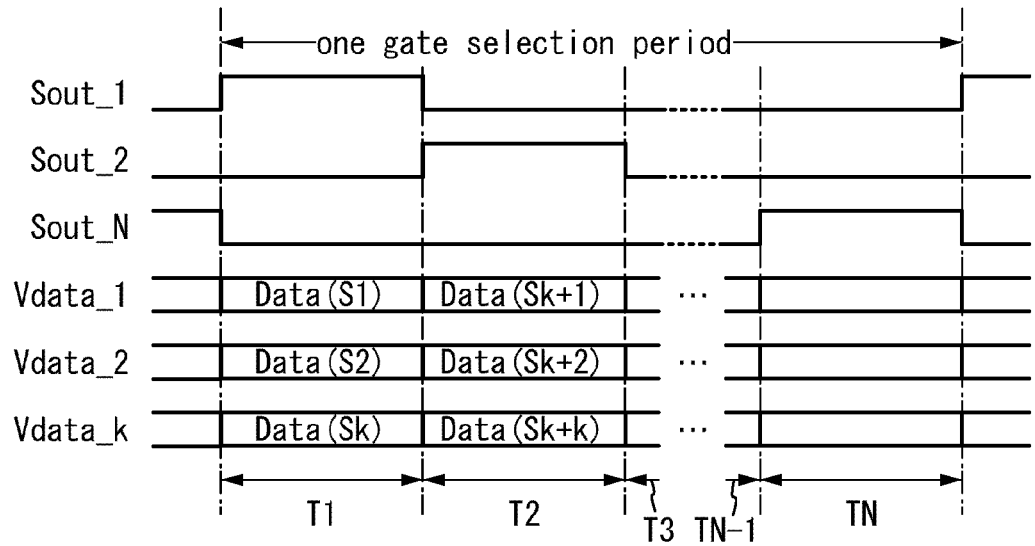

The thin film transistors described in Embodiments 1 to 5 are n-channel TFTs. FIGS. 13A and 13B illustrate an example of a structure and operation of a signal line driver circuit which is formed using n-channel TFTs.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of thin film transistors 5603_1 to 5603_$k$ ($k$ is a natural number). An example where the thin film transistors 5603_1 to 5603_$k$ are n-channel TFTs is described.

A connection relation in the signal line driver circuit is described taking the switching circuit 5602_1 as an example. First terminals of the thin film transistors 5603_1 to 5603_$k$ are connected to wirings 5604_1 to 5604_$k$, respectively. Second terminals of the thin film transistors 5603_1 to 5603_$k$ are connected to signal lines S1 to Sk, respectively. Gates of the thin film transistors 5603_1 to 5603_$k$ are connected to a wiring 5605_1.

The shift register 5601 has a function of sequentially outputting H-level signals (also referred to as H signals or signals at high power supply potential level) to the wirings 5605_1 to 5605_N and sequentially selecting the switching circuits 5602_1 to 5602_N.

The switching circuit 5602_1 has a function of controlling a conduction state between the wirings 5604_1 and the signal line S1 (electrical continuity between the first terminals and the second terminal), that is, a function of controlling whether or not to supply potential of the wirings 5604_1 to the signal line S1. As described above, the switching circuit 5602_1 functions as a selector. In a similar way, the thin film transistors 5603_2 to 5603_$k$ each have functions of controlling conduction states between the wirings 5604_1 to 5604_$k$ and the signal lines S2 to Sk, that is, functions of supplying the potentials of the wirings 5604_2 to 5604_$k$ to the signal lines S2 to Sk. In this manner, each of the thin film transistors 5603_1 to 5603_$k$ function as a switch.

Note that video signal data (DATA) is input to each of the wirings 5604_1 to 5604_$k$. The video signal data (DATA) is an analog signal corresponding to an image signal or image data in many cases.

Next, operation of the signal line driver circuit in FIG. 13A is described with reference to a timing chart in FIG. 13B. FIG. 13B illustrates examples of signals Sout_1 to Sout_N and signals Vdata_1 to Vdata_k. The signals Sout_1 to Sout_N are examples of output signals from the shift register 5601, and the signals Vdata_1 to Vdata_k are examples of signals input to the wirings 5604_1 to 5604_$k$. Note that one operation period of the signal line driver circuit corresponds to one gate selection period in a display device. For example, one gate selection period is divided into periods T1 to TN. Each of the periods T1 to TN is a period during which the video signal data (DATA) is written to pixels in a selected row.

Note that as for structures shown in drawings and the like of this embodiment, distortion in signal waveforms and the like are exaggerated for simplicity in some cases. Thus, the scale is not necessarily limited to that illustrated.

In the periods T1 to TN, the shift register 5601 sequentially outputs H-level signals to the wirings 5605_1 to 5605_N. For example, in the period T1, the shift register 5601 outputs the H-level signal to the wiring 5605_1. Then, the thin film transistors 5603_1 to 5603_$k$ are turned on, so that the wirings 5604_1 to 5604_$k$ and the signal lines S1 to Sk are brought into conduction. In this case, Data (S1) to Data (Sk) are input to the wirings 5604_1 to 5604_$k$, respectively. The Data (S1) to Data (Sk) are input to pixels in a selected row in first to k-th columns through the thin film transistors 5603_1 to 5603$k$, respectively. Thus, in the periods T1 to TN, video signal data (DATA) is sequentially written to the pixels in the selected row by k columns.

By writing video signal data (DATA) to pixels by a plurality of columns as described above, the number of video signal data (DATA) or the number of wirings can be reduced. Accordingly, the number of connections to an external circuit can be reduced. By writing video signals to pixels by a plurality of columns, writing time can be extended and insufficient writing of video signals can be prevented.

Note that as the shift register 5601 and the switching circuit 5602, a circuit including the thin film transistor described in any of Embodiments 1 to 5 can be used.

One mode of a shift register which is used for part of a scan line driver circuit and/or a signal line driver circuit is described with reference to FIGS. 14A to 14C and FIGS. 15A and 15B.

The scan line driver circuit includes a shift register. The scan line driver circuit may also include a level shifter, a buffer, or the like in some cases. In the scan line driver circuit, a clock signal (CLK) and a start pulse signal (SP) are input to the shift register, and then a selection signal is generated. The generated selection signal is buffered and amplified in the buffer, and the resulting signal is supplied to a corresponding scan line. Gate electrodes of transistors in pixels of one line are connected to a scan line. Since the transistors in the pixels of one line must be turned on all at once, a buffer which can supply a large amount of current is used.

Figure 14A:
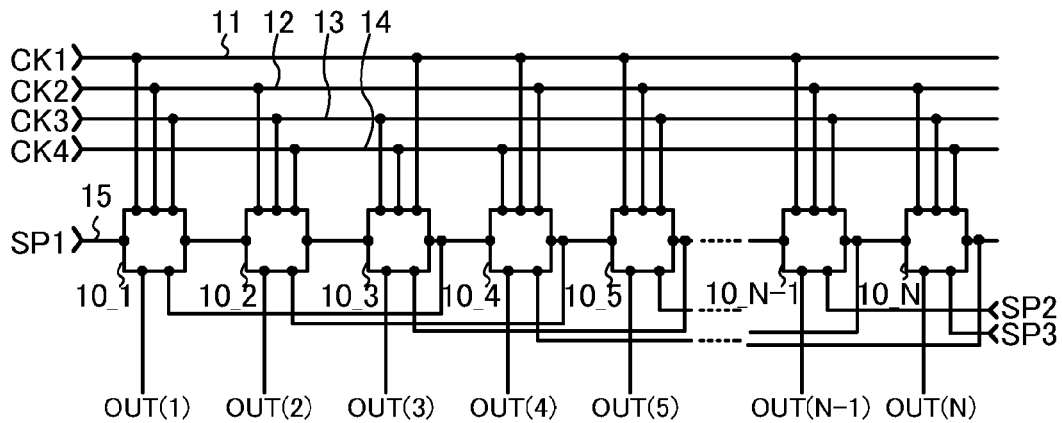
FIGS. 14A to 14C are each a circuit diagram illustrating a configuration of a shift register.

The shift register includes first to N-th pulse output circuits 10_1 to 10_N (N is a natural number of 3 or more) (see FIG. 14A). A first clock signal CK1 from a first wiring 11, a second clock signal CK2 from a second wiring 12, a third clock signal CK3 from a third wiring 13, and a fourth clock signal CK4 from a fourth wiring 14 are supplied in the first to N-th pulse output circuits 10_1 to 10_N of the shift register illustrated in FIG. 14A. In addition, a start pulse SP1 (a first start pulse) from a fifth wiring 15 is input to the first pulse output circuit 10_1. Further, a signal from the pulse output circuit 10_(n−1) of the previous stage (referred to as a previous stage signal OUT (n−1)) is input to the n-th pulse output circuit 10_n (n is a natural number of 2 or more and N or less) in a second or subsequent stage. A signal from the third pulse output circuit 10_3 which is two stages after the first pulse output circuit 10_1 is input to the first pulse output circuit 10_1. Similarly, a signal from the (n+2)-th pulse output circuit 10_(n+2) which is two stages after the n-th pulse output circuit 10_n (referred to as a subsequent stage signal OUT (n+2)) is input to the n-th pulse output circuit 10_n in the second or subsequent stage. Therefore, the pulse output circuits in respective stages output first output signals (OUT (1) (SR) to OUT (N) (SR)) which is input to the pulse output circuit in the previous and/or subsequent stage, and second output signals (OUT (1) to OUT (N)) which is input to other circuits and the like. Note that as illustrated in FIG. 14A, since the subsequent stage signal OUT (n+2) is not input to the last two stages of the shift register, a second start pulse SP2 and a third start pulse SP3 may be separately input to the last two stages of the shift register, for example.

Note that a clock signal (CK) is a signal which oscillates between an H-level signal and an L-level signal (also referred to as L signal or a signal at a low power supply potential level) at regular intervals. Here, the first to fourth clock signals CK1 to CK4 are delayed by ¼ cycle sequentially (i.e., they are 90° out of phase with each other). In this embodiment, by using the first to fourth clock signals CK1 to CK4, control or the like of driving of the pulse output circuits is performed. The clock signal is also referred to as GCK or SCK in accordance with a driver circuit to which the signal is input; however, here, description is made using CK as the clock signal.

Figure 14B:
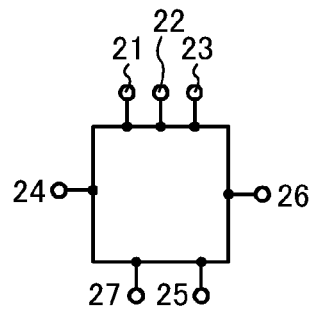

FIG. 14B is one of the pulse output circuits 10_n shown in FIG. 14A. A first input terminal 21, a second input terminal 22, and a third input terminal 23 are electrically connected to any of the first to fourth wirings 11 to 14. For example, in FIG. 14A, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In addition, the first input terminal 21 of the second pulse output circuit 10_2 is electrically connected to the second wiring 12, the second input terminal 22 of the second pulse output circuit 10_2 is electrically connected to the third wiring 13, and the third input terminal 23 of the second pulse output circuit 10_2 is electrically connected to the fourth wiring 14.

Each of the first to N-th pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 14B). In the first pulse output circuit 10_1, the first clock signal CK1 is input to the first input terminal 21; the second clock signal CK2 is input to the second input terminal 22; the third clock signal CK3 is input to the third input terminal 23; the start pulse is input to the fourth input terminal 24; the subsequent stage signal OUT (3) is input to the fifth input terminal 25; the first output signal OUT (1) (SR) is output from the first output terminal 26; and the second output signal OUT (1) is output from the second output terminal 27.

In addition to a thin film transistor (TFT) having three terminals, the thin film transistor having four terminals, which is described in the above embodiment, can be used for each of the first to N-th pulse output circuits 10_1 to 10_N. Note that in this specification, when a thin film transistor includes two gate electrodes with a semiconductor layer therebetween, the gate electrode which is located below the semiconductor layer is also referred to as a lower gate electrode and the gate electrode which is located above the semiconductor layer is also referred to as an upper gate electrode.

When an oxide semiconductor is used for a semiconductor layer including a channel formation region of a thin film transistor, threshold voltage is shifted in a negative or positive direction in some cases depending on a manufacturing process. Thus, a thin film transistor in which an oxide semiconductor is used for a semiconductor layer including a channel formation region preferably has a structure where threshold voltage can be controlled. The threshold voltage of a thin film transistor having four terminals can be controlled to be a desired value by controlling a potential of an upper gate electrode and/or a lower gate electrode.

Next, an example of a specific circuit structure of the pulse output circuit illustrated in FIG. 14B is described with reference to FIG. 14C.

Figure 14C:
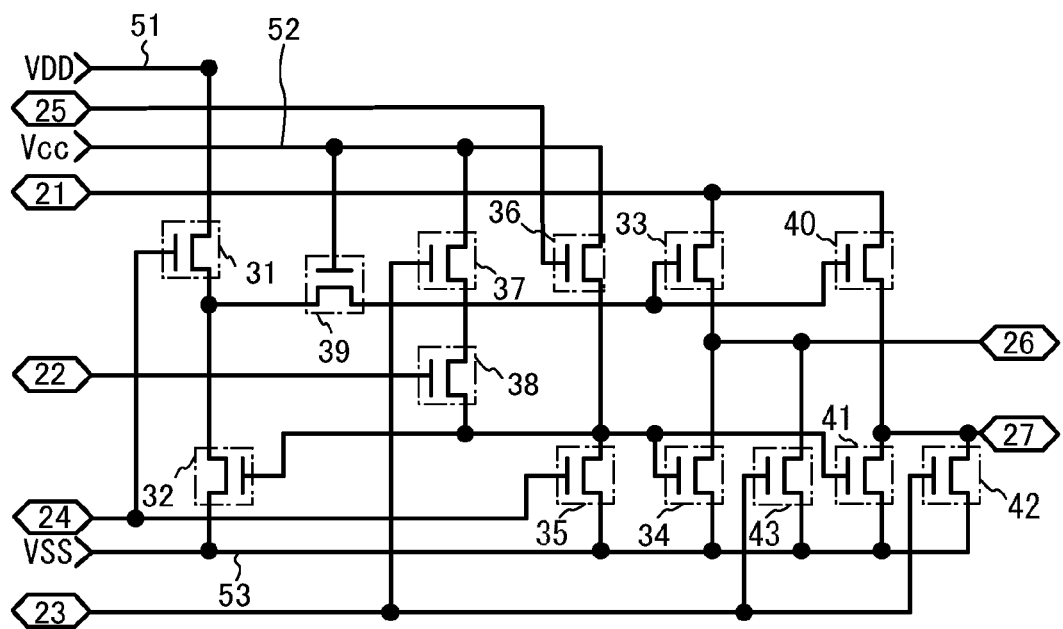

The pulse output circuit illustrated in FIG. 14C includes first to thirteenth transistors 31 to 43. In addition to the first to fifth input terminal 21 to 25, signals or power supply potentials are supplied to the first to thirteenth transistors 31 to 43 from a power supply line 51 to which a first high power supply potential VDD is supplied, a power supply line 52 to which a second high power supply potential VCC is supplied, and a power supply line 53 to which a low power supply potential VSS is supplied. Signals or the like are output through the first output terminal 26 and the second output terminal 27. Here, the power supply potentials of the power supply lines in FIG. 14C are set so that the first power supply potential VDD is higher than or equal to the second power supply potential VCC and the second power supply potential VCC is higher than the third power supply potential VSS. Although the first to fourth clock signals CK1 to CK4 are signals which oscillate between an H-level signal and an L-level signal at regular intervals, a potential is VDD when the clock signal is at the H level, and the potential is VSS when the clock signal is at the L level. When the potential VDD of the power supply line 51 is set to higher than the potential VCC of the power supply line 52, a potential applied to the gate electrode of the transistor can be lowered without adversely affecting the operation, whereby the shift of the threshold voltage of the transistor can be reduced and deterioration can be suppressed. Note that a thin film transistor having four terminals is preferably used for the first transistor 31 and the sixth to ninth transistors 36 to 39 among the first to thirteenth transistors 31 to 43. The first transistor 31 and the sixth to ninth transistors 36 to 39 are required to switch a potential of each node connected to one of electrodes which is to be a source or a drain by a control signal of the gate electrode. The first transistor 31 and the sixth to ninth transistors 36 to 39 can further reduce malfunctions of the pulse output circuits by quick response (sharp rising of on current) with respect to a control signal input to the gate electrode. Therefore, when a thin film transistor having four terminals is used, the threshold voltage can be controlled and malfunctions of the pulse output circuits can be further reduced.

In FIG. 14C, a first terminal of the first transistor 31 is electrically connected to the power supply line 51, a second terminal of the first transistor 31 is electrically connected to a first terminal of the ninth transistor 39, and gate electrodes (a lower gate electrode and an upper gate electrode) of the first transistor 31 are electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and gate electrodes (a lower gate electrode and an upper gate electrode) of the sixth transistor 36 are electrically connected to the fifth input terminal 25. A first terminal of the seventh transistor 37 is electrically connected to the power supply line 52, a second terminal of the seventh transistor 37 is electrically connected to a second terminal of the eighth transistor 38, and gate electrodes (a lower gate electrode and an upper gate electrode) of the seventh transistor 37 are electrically connected to the third input terminal 23. A first terminal of the eighth transistor 38 is electrically connected to the gate electrode of the second transistor 32 and the gate electrode of the fourth transistor 34, and gate electrodes (a lower gate electrode and an upper gate electrode) of the eighth transistor 38 is electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and gate electrodes (a lower gate electrode and an upper gate electrode) of the ninth transistor 39 are electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrodes (the lower gate electrode and the upper gate electrode) of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrodes (the lower gate electrode and the upper gate electrode) of the seventh transistor 37.

In FIG. 14C, a connection point of the gate electrode of the third transistor 33, the gate electrode of the tenth transistor 40, and the second terminal of the ninth transistor 39 is referred to as a node A. In addition, a connection point of the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 is referred to as a node B.

Figure 15A:
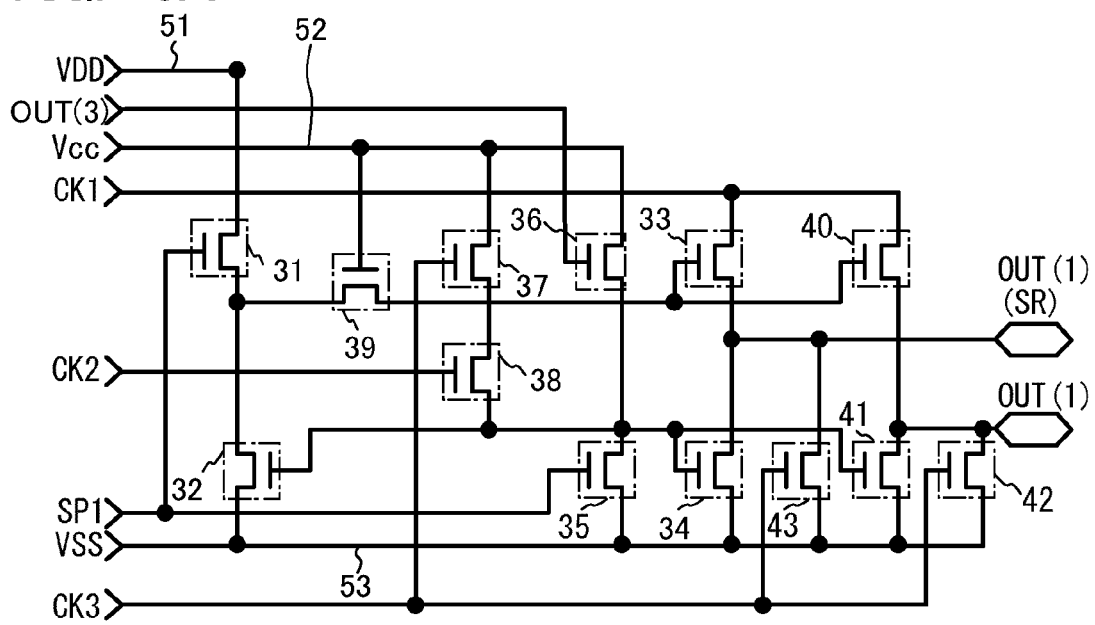
FIGS. 15A and 15B illustrate operations of a shift resister.

FIG. 15A illustrates signals input to the first to fifth input terminals 21 to 25 and signals output from the first output terminal 26 and the second output terminal 27 when the pulse output circuit illustrated in FIG. 14C is used as the first pulse output circuit 10_1.

Specifically, the first clock signal CK1 is input to the first input terminal 21; the second clock signal CK2 is input to the second input terminal 22; the third clock signal CK3 is input to the third input terminal 23; the start pulse (SP1) is input to the fourth input terminal 24; the subsequent stage signal OUT (3) is input to the fifth input terminal 25; the first output signal OUT (1) (SR) is output from the first output terminal 26; and the second output signal OUT (1) is output from the second output terminal 27.

Note that a thin film transistor is an element having at least three terminals of a gate, a drain, and a source. Further, the thin film transistor includes a semiconductor in which a channel region is formed in a region overlapping with the gate and the amount of current which flows between the drain and the source through the channel region can be controlled by controlling a potential of the gate. Here, since the source and the drain of the thin film transistor may change depending on the structure, the operating condition, and the like of the thin film transistor, it is difficult to define which is a source or a drain. Therefore, a region functioning as a source or a drain is not called a source or a drain in some cases. In such a case, for example, one of the source and the drain may be referred to as a first terminal and the other thereof may be referred to as a second terminal.

Note that in FIG. 14C and FIG. 15A, a capacitor for performing bootstrap operation by setting the node A floating may be additionally provided. Further, a capacitor having one electrode electrically connected to the node B may be additionally provided in order to hold a potential of the node B.

Figure 15B:
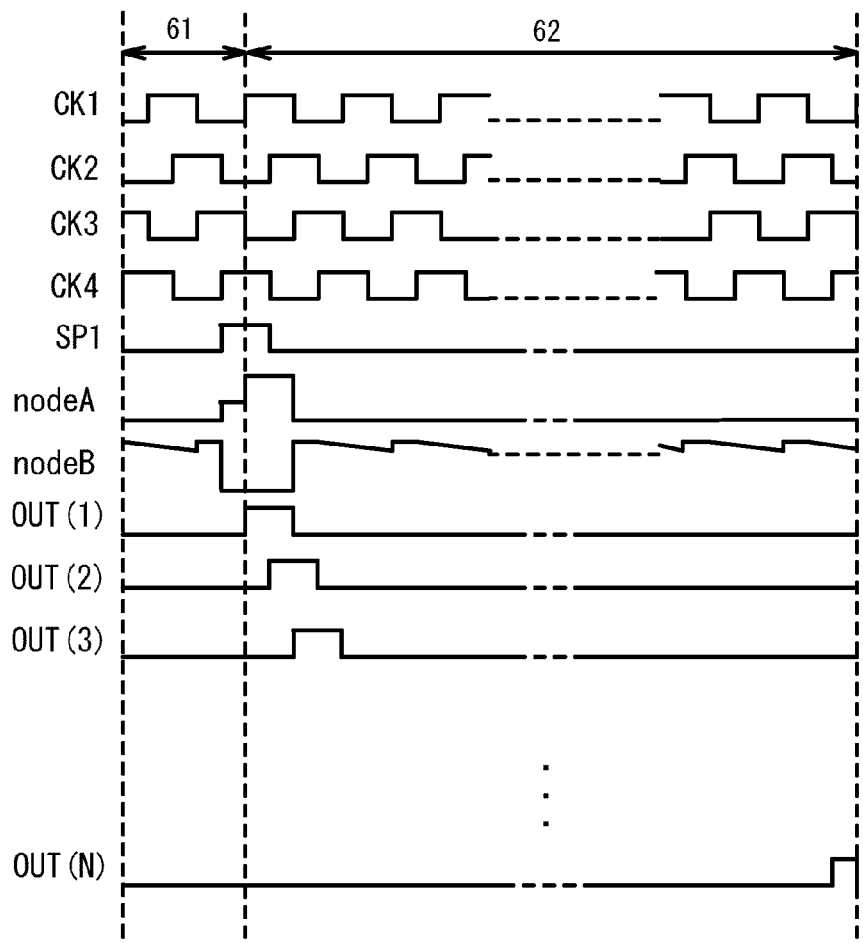

Here, FIG. 15B illustrates a timing chart of a shift register including a plurality of the pulse output circuits illustrated in FIG. 15A. Note that in the case where the shift register is a scan line driver circuit, a period 61 of FIG. 15B corresponds to a vertical retrace period and a period 62 of FIG. 15B corresponds to a gate selection period.

Note that as illustrated in FIG. 15A, with the ninth transistor 39 whose gate is supplied with the second power supply potential VCC, advantages described below are obtained before and after bootstrap operation.

Without the ninth transistor 39 whose gate is supplied with the second power supply potential VCC, when a potential of the node A is raised by bootstrap operation, a potential of a source which is the second terminal of the first thin film transistor 31 increases to a value higher than the first power supply potential VDD. Then, the first terminal of the first transistor 31, that is, the terminal on the power supply line 51 side, comes to serve as a source of the first transistor 31. Therefore, in the first transistor 31, a high bias voltage is applied and thus significant stress is applied between the gate and the source and between the gate and the drain, which might cause deterioration in the transistor. Thus, with the ninth transistor 39 whose gate electrode is supplied with the second power supply potential VCC, the potential of the node A is raised by bootstrap operation, but at the same time, an increase in the potential of the second terminal of the first transistor 31 can be prevented. In other words, with the ninth transistor 39, the level of a negative bias voltage applied between the gate and the source of the first transistor 31 can be lowered. Accordingly, with a circuit structure in this embodiment, a negative bias voltage applied between the gate and the source of the first transistor 31 can be lowered, so that deterioration in the first transistor 31, which is due to stress, can be further restrained.

Note that the ninth transistor 39 is provided so that the first terminal and the second terminal of the ninth transistor 39 are connected between the second terminal of the first transistor 31 and the gate of the third transistor 33. In the case where a shift register includes a plurality of pulse output circuits of this embodiment, the ninth transistor 39 may be eliminated in a signal line driver circuit which has more stages than a scan line driver circuit, which is advantageous in reducing the number of the transistors.

When an oxide semiconductor is used for each of the semiconductor layers of the first to thirteenth transistors 31 to 43, the amount of off current of the thin film transistors can be reduced, the amount of on current and field-effect mobility can be increased, and, the rate of deterioration can be decreased, whereby malfunctions of the circuit can be reduced. Further, a transistor including an oxide semiconductor has a lower rate of deterioration of the transistor due to application of a high potential to a gate electrode, as compared to a transistor including amorphous silicon. Therefore, even when the first power supply potential VDD is supplied to the power supply line to which the second power supply potential VCC is supplied, similar operation can be performed and the number of power supply lines provided between the circuits can be reduced, whereby size reduction in a circuit can be achieved.

Note that a similar effect is obtained even when a connection relation is changed so that a clock signal which is supplied to the gate electrodes (the lower gate electrode and the upper gate electrode) of the seventh transistor 37 through the third input terminal 23 is a clock signal which is supplied to the gate electrodes (the lower gate electrode and the upper electrode) of the seventh transistor 37 through the second input terminal 22; and a clock signal which is supplied to the gate electrodes (the lower gate electrode and the upper gate electrode) of the eighth transistor 38 through the second input terminal 22 is a clock signal which is supplied to the gate electrodes (the lower electrode and the upper electrode) of the eighth transistor 38 through the third input terminal 23. Note that in the shift register illustrated in FIG. 15A, the seventh transistor 37 and the eighth transistor 38 are both on, the seventh transistor 37 is turned off and the eighth transistor 38 is kept on, and then the seventh transistor 37 kept off state and the eighth transistor 38 is turned off, whereby the decrease in the potential of the node B, which is caused by the decrease in the potentials of the second input terminal 22 and the third input terminal 23, occurs twice due to the decrease in the potential of the gate electrode of the seventh transistor 37 and the decrease in the potential of the gate electrode of the eighth transistor 38. On the other hand, in the shift register illustrated in FIG. 15A, as in a period in FIG. 15B, the seventh transistor 37 and the eighth transistor 38 are both on, the seventh transistor 37 is kept on and the eighth transistor 38 is turned off, and then the seventh transistor 37 is turned off and the eighth transistor 38 is kept off, whereby the decrease in the potential of the node B, which is caused by the decrease in the potentials of the second input terminal 22 and the third input terminal 23, can be reduced to once due to the decrease in the potential of the gate electrode of the eighth transistor 38 is decreased. Accordingly, the connection relation, that is, the clock signal is supplied to the gate electrodes (the lower electrode and the upper electrode) of the seventh transistor 37 through the third input terminal 23 and the clock signal is supplied to the gate electrodes (the lower gate electrode and the upper gate electrode) of the eighth transistor 38 through the second input terminal 22, is preferable. That is because the number of times of fluctuation of the potential of the node B can be reduced and noise can be reduced.

In this way, in a period during which the potential of the first output terminal 26 and the potential of the second output terminal 27 are held at the L level, an H level signal is regularly supplied to the node B; therefore, a malfunction of the pulse output circuit can be suppressed.

Embodiment 7

A thin film transistor is manufactured, and a semiconductor device having a display function (also referred to as a display device) can be manufactured using the thin film transistors in a pixel portion and further in a driver circuit. Further, when part or whole of a driver circuit using a thin film transistor is formed over the same substrate as a pixel portion, a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes an inorganic electroluminescent (EL) element, an organic EL element, and the like. Furthermore, a display medium whose contrast is changed by an electric effect, such as electronic ink, can be used.

The display device includes a panel in which the display element is sealed, and a module in which an IC or the like including a controller is mounted on the panel. Furthermore, an element substrate, which corresponds to one embodiment before the display element is completed in a manufacturing process of the display device, is provided with a means for supplying current to the display element in each of a plurality of pixels. Specifically, the element substrate may be in a state in which only a pixel electrode (also referred to as a pixel electrode layer) of the display element is provided, a state after formation of a conductive film serving as a pixel electrode and before etching of the conductive film so that the pixel electrode is formed, or any other states.

Note that a display device in this specification means an image display device, a display device, or a light source (including a lighting device). Further, the display device includes the following modules in its category: a module to which a connector such as a flexible printed circuit (FPC), a tape automated bonding (TAB) tape, or a tape carrier package (TCP) is attached; a module having a TAB tape or a TCP which is provided with a printed wiring board at the end thereof; and a module having an integrated circuit (IC) which is directly mounted on a display element by a chip on glass (COG) method.

The appearance and a cross section of a liquid crystal display panel, which is one embodiment of a semiconductor device, are described with reference to FIGS. 16A1, 16A2, and 16B. FIGS. 16A1 and 16A2 are each a top view of a panel in which thin film transistors 4010 and 4011 and a liquid crystal element 4013 are sealed between a first substrate 4001 and a second substrate 4006 with a sealant 4005. FIG. 16B is a cross-sectional view taken along line M-N of FIGS. 16A1 and 16A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 which is formed using a single crystal semiconductor film or a polycrystalline semiconductor film over a substrate separately prepared is mounted in a region which is different from the region surrounded by the sealant 4005 over the first substrate 4001.

Note that the connection method of the driver circuit which is separately formed is not particularly limited, and a COG method, a wire bonding method, a TAB method, or the like can be used. FIG. 16A1 illustrates an example in which the signal line driver circuit 4003 is mounted by a COG method, and FIG. 16A2 illustrates an example in which the signal line driver circuit 4003 is mounted by a TAB method.

The pixel portion 4002 and the scan line driver circuit 4004 provided over the first substrate 4001 include a plurality of thin film transistors. FIG. 16B illustrates the thin film transistor 4010 included in the pixel portion 4002 and the thin film transistor 4011 included in the scan line driver circuit 4004. A protective insulating layer 4020 and a protective insulating layer 4021 are provided over the thin film transistors 4010 and 4011.

Any of the highly reliable thin film transistors including the oxide semiconductor layers, which are described in Embodiments 1 to 5, can be used as the thin film transistors 4010 and 4011. As the thin film transistor 4011 for the driver circuit, any of the thin film transistors 210, 240, 470, and 471 which are described in Embodiments 1 to 5 can be used. As the thin film transistor 4010 for the pixel, any of the thin film transistors 220, 460, and 461 which are described in Embodiments 1 to 5 can be used. In this embodiment, the thin film transistors 4010 and 4011 are n-channel thin film transistors.

A conductive layer 4040 is provided over the protective insulating layer 4021 so as to overlap with a channel formation region in an oxide semiconductor layer of the thin film transistor 4011 for the driver circuit. The conductive layer 4040 is provided so as to overlap with the channel formation region of the oxide semiconductor layer, whereby the amount of change in the threshold voltage of the thin film transistor 4011 before and after BT test can be reduced. Further, a potential of the conductive layer 4040 may be the same as or different from that of the gate electrode layer of the thin film transistor 4011. The conductive layer 4040 can function also as a second gate electrode layer. Alternatively, the potential of the conductive layer 4040 may be GND or 0 V, or the conductive layer 4040 may be in a floating state.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033, respectively, which each function as an alignment film, and the liquid crystal layer 4008 is sandwiched between the pixel electrode layer 4030 and the counter electrode layer 4031 with the insulating layers 4032 and 4033 therebetween.

Note that as the first substrate 4001 and the second substrate 4006, glass, ceramics, plastics, or the like having a light-transmitting property can be used. As plastic, a fiberglass-reinforced plastics (FRP) plate, a polyvinyl fluoride (PVF) film, a polyester film, or an acrylic resin film can be used.

A spacer 4035 is a columnar spacer obtained by selective etching of an insulating film and is provided in order to control the distance (a cell gap) between the pixel electrode layer 4030 and the counter electrode layer 4031. Alternatively, a spherical spacer may be used. In addition, the counter electrode layer 4031 is electrically connected to a common potential line provided over the same substrate as the thin film transistor 4010. With the use of a common connection portion, the counter electrode layer 4031 and the common potential line can be electrically connected to each other through conductive particles arranged between the pair of substrates. Note that the conductive particles are included in the sealant 4005.

Alternatively, a liquid crystal exhibiting a blue phase for which an alignment film is unnecessary may be used. A blue phase is one of liquid crystal phases, which appears just before a cholesteric phase changes into an isotropic phase while temperature of cholesteric liquid crystal is increased. Since the blue phase appears within a relatively narrow range of temperature, a liquid crystal composition containing a chiral agent at 5 wt. % or more in order to improve the temperature range is used for the liquid crystal layer 4008. The liquid crystal composition which includes a liquid crystal exhibiting a blue phase and a chiral agent has a short response time of 1 msec or less, has optical isotropy, which makes the alignment treatment unneeded, and has a small viewing angle dependence.

An embodiment of the present invention can be applied to a semi-transmissive liquid crystal display device in addition to a transmissive liquid crystal display device.

An example of the liquid crystal display device is described in which a polarizing plate is provided on the outer surface of the substrate (on the viewer side) and a coloring layer (a color filter) and an electrode layer used for a display element are provided on the inner surface of the substrate; however, the polarizing plate may be provided on the inner surface of the substrate. The stacked structure of the polarizing plate and the coloring layer is not limited to this embodiment and may be set as appropriate depending on materials of the polarizing plate and the coloring layer or conditions of a manufacturing process. Further, a light-blocking film serving as a black matrix may be provided in a portion other than the display portion.

Further, the protective insulating layer 4020 is formed over the thin film transistors 4010 and 4011. The protective insulating layer 4020 can be formed using a material and a method which are similar to those of the protective insulating layer 408 described in Embodiment 1. Here, as the protective insulating layer 4020, a silicon nitride film is formed by a PCVD method.

The protective insulating layer 4021 is formed as the planarization insulating film. The protective insulating layer 4021 may be formed using a material and a method which are similar to those of the planarization insulating layer 409 described in Embodiment 1, and an organic material having heat resistance, such as polyimide, an acrylic resin, a benzocyclobutene-based resin, polyamide, or an epoxy resin can be used. Other than such an organic material, it is possible to use a low-dielectric constant material (a low-k material), a siloxane-based resin, phosphosilicate glass (PSG), borophosphosilicate glass (BPSG), or the like. Note that the protective insulating layer 4021 may be formed by stacking a plurality of insulating films formed of these materials.

Note that a siloxane-based resin corresponds to a resin including a Si—O—Si bond formed using a siloxane-based material as a starting material. The siloxane-based resin may include an organic group (e.g., an alkyl group or an aryl group) as a substituent. In addition, the organic group may include a fluoro group.

The formation method of the protective insulating layer 4021 is not particularly limited, and the following methods can be employed depending on the material: a sputtering method, an SOG method, a spin coating method, a dipping method, a spray coating method, or a droplet discharge method (e.g., an ink-jet method, screen printing, offset printing). Alternatively, the insulating layer 4021 can be formed using a tool (equipment) such as a doctor knife, a roll coater, a curtain coater, or a knife coater. The baking step of the protective insulating layer 4021 also serves as annealing of the oxide semiconductor layer, whereby a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A Conductive composition including a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a transmittance of greater than or equal to 70% at a wavelength of 550 nm The sheet resistance is preferably lower. Further, the resistivity of the conductive high molecule included in the conductive composition is preferably less than or equal to 0.1 Ω·cm.

As the conductive high molecule, a so-called π-electron conjugated conductive high molecule can be used. For example, polyaniline or a derivative thereof, polypyrrole or a derivative thereof, polythiophene or a derivative thereof, a copolymer of two or more kinds of these conductive high molecules, and the like can be given.

A variety of signals and potentials are supplied to the signal line driver circuit 4003 which is formed separately, the scan line driver circuit 4004, or the pixel portion 4002 from an FPC 4018.

In this embodiment, a connection terminal electrode 4015 is formed using the same conductive film as that of the pixel electrode layer 4030 included in the liquid crystal element 4013, and a terminal electrode 4016 is formed using the same conductive film as that of source and drain electrode layers of the thin film transistor 4011.

The connection terminal electrode 4015 is electrically connected to a terminal included in the FPC 4018 via an anisotropic conductive film 4019.

Note that FIGS. 16A1, 16A2, and 16B illustrate examples in which the signal line driver circuit 4003 is formed separately and mounted on the first substrate 4001; however, the present invention is not limited to this structure. Part of the signal line driver circuit or part of the scan line driver circuit may be separately formed and then mounted.

Figure 17:
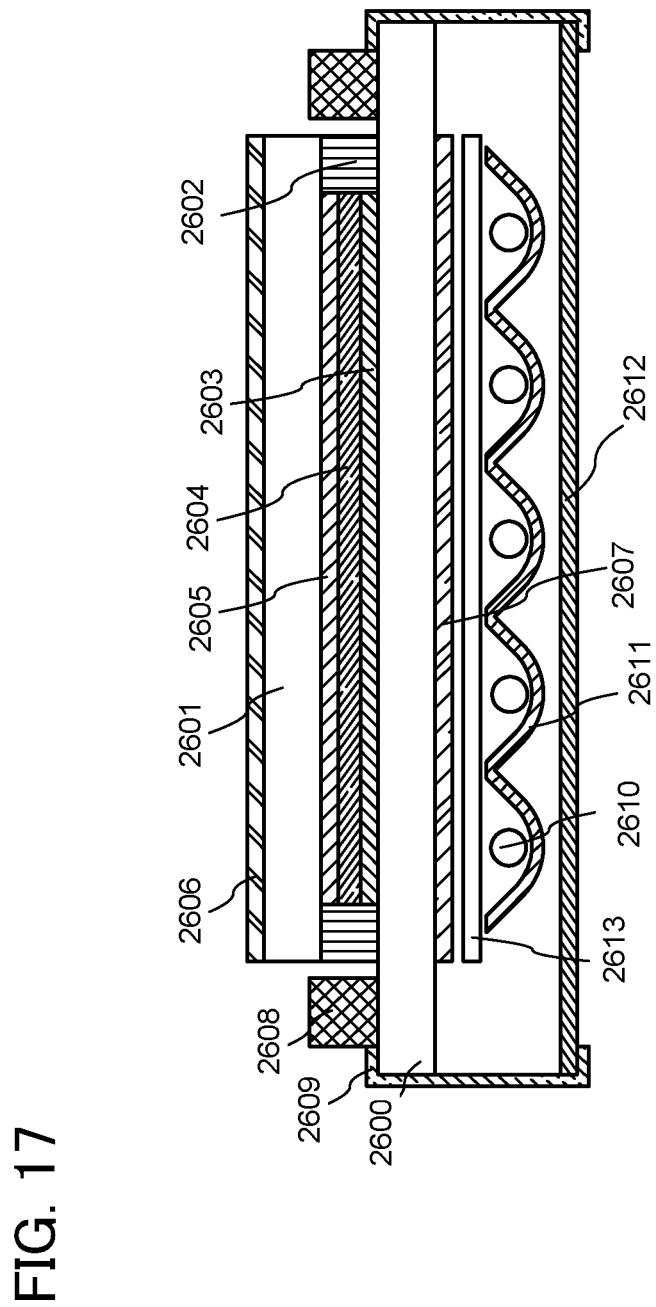
FIG. 17 illustrates a semiconductor device.

FIG. 17 illustrates an example in which a liquid crystal display module is formed as a semiconductor device using a TFT substrate 2600 which is manufactured in accordance with the manufacturing method disclosed in this specification.

FIG. 17 illustrates an example of a liquid crystal display module. The TFT substrate 2600 and a counter substrate 2601 are fixed to each other with a sealant 2602, and a pixel portion 2603 including a TFT and the like, a display element 2604 including a liquid crystal layer, and a coloring layer 2605 are provided between the substrates to form a display region. The coloring layer 2605 is necessary to perform color display. In the RGB system, respective coloring layers corresponding to colors of red, green, and blue are provided for respective pixels. A polarizing plate 2607 and a diffusion plate 2613 are provided outside the TFT substrate 2600 and a polarizing plate 2606 is provided outside the counter substrate 2601. A light source includes a cold cathode fluorescent lamp 2610 and a reflective plate 2611, and a circuit board 2612 is connected to a wiring circuit portion 2608 of the TFT substrate 2600 through a flexible wiring board 2609 and includes an external circuit such as a control circuit or a power supply circuit. The polarizing plate and the liquid crystal layer may be stacked with a retardation plate therebetween.

The liquid crystal display module can employ a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like.

Through the above steps, a highly reliable liquid crystal display panel as a semiconductor device can be manufactured.

This embodiment can be implemented in appropriate combination with the structures described in the other embodiments.

Embodiment 8

In this embodiment, an example of electronic paper is described as one mode of a semiconductor device.

The semiconductor device can be used for electronic paper in which electronic ink is driven by an element electrically connected to a switching element. The electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute. Each microcapsule contains first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region. An electrophoretic display does not need to use a polarizing plate which is required in a liquid crystal display device.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, when a plurality of the microcapsules are arranged as appropriate over an active matrix substrate so as to be interposed between two electrodes, an active matrix display device can be completed, and display can be performed by application of an electric field to the microcapsules. For example, the active matrix substrate obtained using the thin film transistor of any of Embodiments 1 to 5 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, or a magnetophoretic material, or formed of a composite material of any of these.

Figure 18:
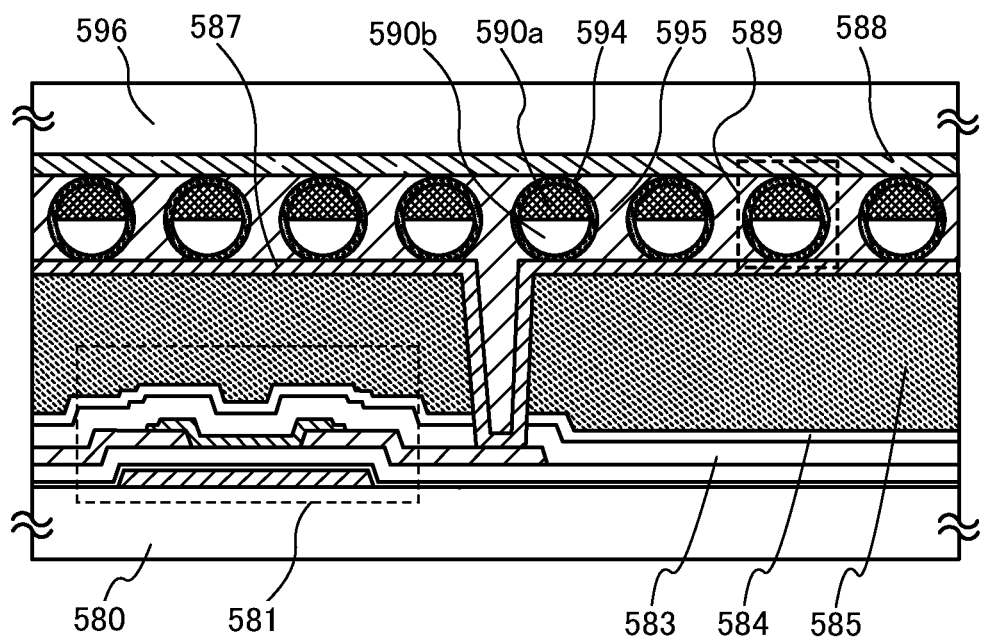
FIG. 18 illustrates a semiconductor device.

FIG. 18 illustrates active matrix electronic paper as an example of a semiconductor device. A thin film transistor 581 used for the semiconductor device can be formed in a manner similar to the thin film transistor described in Embodiment 1, which is a highly reliable thin film transistor including an oxide semiconductor layer. Any of the thin film transistors described in Embodiments 2 to 5 can also be used as the thin film transistor 581 of this embodiment.

The electronic paper in FIG. 18 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 formed over a substrate 580 is a bottom-gate thin film transistor and is covered with an insulating film 583 which is in contact with the oxide semiconductor layer. A source electrode layer or a drain electrode layer of the thin film transistor 581 is in contact with a first electrode layer 587 in an opening formed in the insulating layer 583, an insulating layer 584, and an insulating layer 585, whereby the thin film transistor 581 is electrically connected to the first electrode layer 587. Between the first electrode layer 587 and a second electrode layer 588 which is formed on a substrate 596, spherical particles 589 are provided. Each spherical particle 589 includes a black region 590a and a white region 590b, and a cavity 594 filled with liquid around the black region 590a and the white region 590b. The circumference of the spherical particle 589 is filled with a filler 595 such as a resin. In this embodiment, the first electrode layer 587 corresponds to a pixel electrode, and the second electrode layer 588 corresponds to a common electrode. The second electrode layer 588 is electrically connected to a common potential line provided over the same substrate as the thin film transistor 581. With the use of a common connection portion, the second electrode layer 588 can be electrically connected to the common potential line through conductive particles provided between the pair of substrates.

Instead of the element using the twisting ball, an electrophoretic element can also be used. A microcapsule having a diameter of approximately 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite directions to each other, so that white or black can be displayed. A display element using this principle is an electrophoretic display element, and is called electronic paper in general. The electrophoretic display element has higher reflectance than a liquid crystal display element, and thus an auxiliary light is unnecessary, power consumption is low, and a display portion can be recognized in a dim environment. In addition, even when power is not supplied to the display portion, an image which has been displayed once can be maintained. Accordingly, a displayed image can be stored even when a semiconductor device having a display function (which may be referred to simply as a display device or a semiconductor device provided with a display device) is disconnected from a power supply.

Through this process, a highly reliable electronic paper as a semiconductor device can be manufactured.

This embodiment can be implemented in appropriate combination with the structures described in the other embodiments.

Embodiment 9

An example of a light-emitting display device will be described as a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In the organic EL element, by application of voltage to a light-emitting element, electrons and holes are separately injected from a pair of electrodes into a layer containing a light-emitting organic compound, and thus current flows. Then, the carriers (electrons and holes) recombine, so that the light-emitting organic compound is excited. The light-emitting organic compound returns to a ground state from the excited state, thereby emitting light. Owing to such a mechanism, such a light-emitting element is referred to as a current-excitation light-emitting element.

The inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission which utilizes a donor level and an acceptor level. The thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

Figure 19:
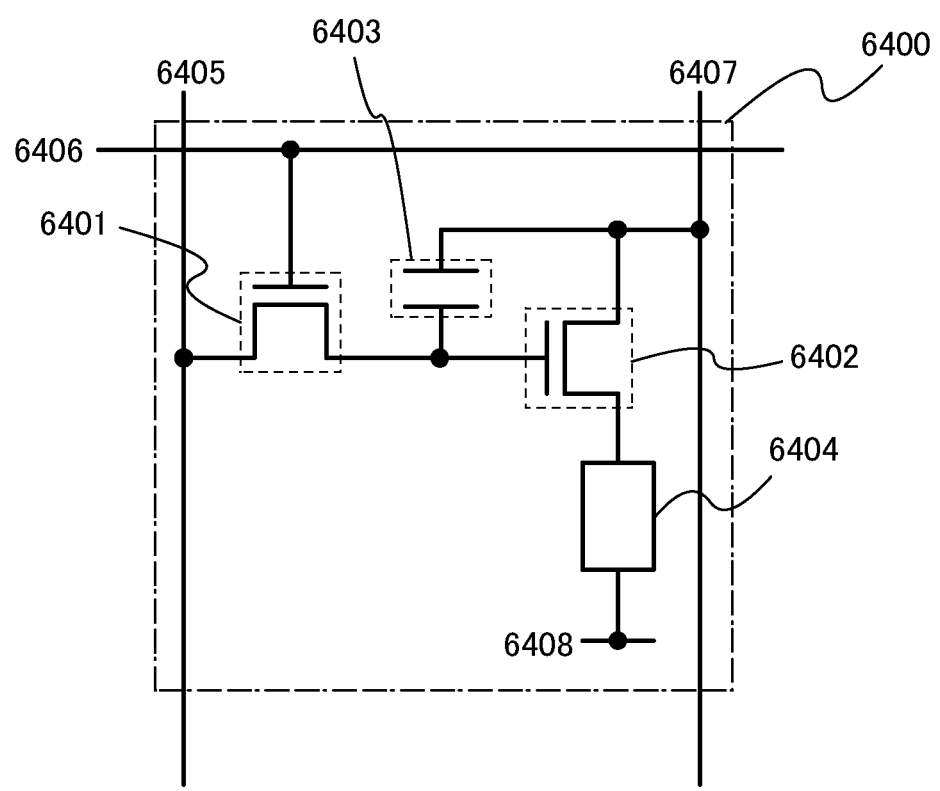
FIG. 19 illustrates an equivalent circuit of a pixel in a semiconductor device.

FIG. 19 illustrates an example of a pixel structure to which digital time grayscale driving can be applied, as an example of a semiconductor device.

The structure and operation of a pixel to which digital time grayscale driving can be applied are described. Here, one pixel includes two n-channel transistors each of which includes an oxide semiconductor layer for a channel formation region.

A pixel 6400 includes a switching transistor 6401, a transistor 6402 for driving a light-emitting element, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the transistor 6402 for driving the light-emitting element. The gate of the transistor 6402 for driving the light-emitting element is connected to a power supply line 6407 through the capacitor 6403, a first electrode of the transistor 6402 for driving the light-emitting element is connected to the power supply line 6407, and a second electrode of the transistor 6402 for driving the light-emitting element is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

The second electrode (common electrode 6408) of the light-emitting element 6404 is set to a low power supply potential. Note that the low power supply potential is a potential satisfying a relationship, the low power supply potential<a high power supply potential with reference to the high power supply potential which is set to the power supply line 6407. As the low power supply potential, GND, 0 V, or the like may be employed, for example. A potential difference between the high power supply potential and the low power supply potential is applied to the light-emitting element 6404 so that current flows through the light-emitting element 6404, whereby the light-emitting element 6404 emits light. Thus, each potential is set so that the potential difference between the high power supply potential and the low power supply potential is higher than or equal to a forward threshold voltage of the light-emitting element 6404.

When gate capacitance of the transistor 6402 for driving the light-emitting element is used as a substitute for the capacitor 6403, the capacitor 6403 can be omitted. The gate capacitance of the transistor 6402 for driving the light-emitting element may be formed between a channel region and a gate electrode.

In the case of a voltage-input voltage driving method, a video signal is input to the gate of the transistor 6402 for driving the light-emitting element so that the transistor 6402 for driving the light-emitting element is completely turned on or off. That is, the transistor 6402 for driving the light-emitting element operates in a linear region; thus, voltage higher than the voltage of the power supply line 6407 is applied to the gate of the transistor 6402 for driving the light-emitting element. Note that voltage higher than or equal to (voltage of the power supply line+$V_{th}$ of the transistor 6402 for driving the light-emitting element) is applied to the signal line 6405.

In the case of performing analog grayscale driving instead of digital time grayscale driving, the same pixel structure as in FIG. 19 can be used by changing signal input.

In the case of performing the analog grayscale driving, a voltage higher than or equal to voltage which is the sum of the forward voltage of the light-emitting element 6404 and $V_{th}$ of the transistor 6402 for driving the light-emitting element is applied to the gate of the transistor 6402 for driving the light-emitting element. The forward voltage of the light-emitting element 6404 refers to a voltage at which a desired luminance is obtained and is larger than at least forward threshold voltage. By inputting a video signal to enable the driving transistor 6402 to operate in a saturation region, current can flow through the light-emitting element 6404. In order that the transistor 6402 for driving the light-emitting element can operate in the saturation region, the potential of the power supply line 6407 is set higher than the gate potential of the transistor 6402 for driving the light-emitting element. With an analog video signal, current in accordance with the video signal flows through the light-emitting element 6404, and the analog grayscale driving can be performed.

The pixel structure illustrated in FIG. 19 is not limited thereto. For example, a switch, a resistor, a capacitor, a transistor, a logic circuit, or the like may be added to the pixel illustrated in FIG. 19.

Next, structures of the light-emitting element are described with reference to FIGS. 20A to 20C. Here, a cross-sectional structure of a pixel is described by taking an n-channel TFT for driving a light-emitting element as an example. TFTs 7001, 7011, and 7021 for driving light-emitting elements used in semiconductor devices illustrated in FIGS. 20A, 20B, and 20C, respectively, can be formed in a manner similar to that of the thin film transistor which is provided in the pixel and described in Embodiment 1, and are highly reliable thin film transistors each including an oxide semiconductor layer. Alternatively, the thin film transistor which is provided in the pixel and described in any of Embodiments 2 to 5 can be employed as the TFTs 7001, 7011, and 7021.

In order to extract light emitted from the light-emitting element, at least one of an anode and a cathode is required to transmit light. A thin film transistor and a light-emitting element are formed over a substrate. A light-emitting element can have a top emission structure in which light is extracted through the surface opposite to the substrate; a bottom emission structure in which light is extracted through the surface on the substrate side; or a dual emission structure in which light is extracted through the surface opposite to the substrate and the surface on the substrate side. The pixel structure can be applied to a light-emitting element having any of these emission structures.

A light-emitting element with a top emission structure is described with reference to FIG. 20A.

Figure 20A:
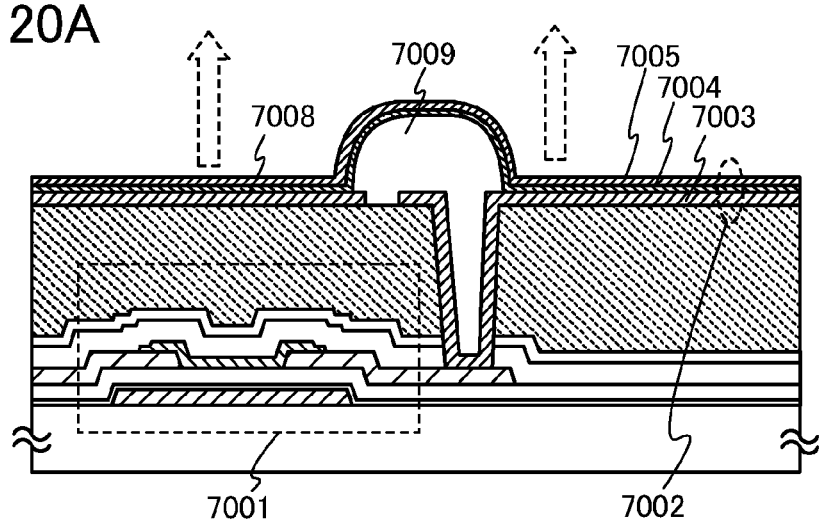
FIGS. 20A to 20C each illustrate a semiconductor device.

FIG. 20A is a cross-sectional view of a pixel in the case where a TFT 7001 for driving the light-emitting element is an n-type TFT and light is emitted from a light-emitting element 7002 to an anode 7005 side. In FIG. 20A, a cathode 7003 of the light-emitting element 7002 is electrically connected to the TFT 7001 serving as a TFT for driving a light-emitting element, and a light-emitting layer 7004 and the anode 7005 are stacked in this order over the cathode 7003. The cathode 7003 can be formed using a variety of conductive materials as long as they have a low work function and reflect light. For example, Ca, Al, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron injection layer, an electron transport layer, a light-emitting layer, a hole transport layer, and a hole injection layer in this order over the cathode 7003. However, it is not necessary to form all of these layers. The anode 7005 is formed using a light-transmitting conductive film such as a film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Between the cathode 7003 and a cathode 7008 in an adjacent pixel, a partition wall 7009 is provided so as to cover end portions of the cathode 7003 and the cathode 7008. The partition wall 7009 is formed using a film of an organic resin such as polyimide, an acrylic resin, polyamide, or an epoxy resin, an inorganic insulating film, or a polysiloxane. It is particularly preferable that the partition wall 7009 be formed using a photosensitive resin material and a sidewall of the partition wall 7009 be formed as an inclined surface with continuous curvature. When the partition wall 7009 is formed using a photosensitive resin material, a step for forming a resist mask can be omitted.

The light-emitting element 7002 corresponds to a region where the light-emitting layer 7004 is sandwiched between the cathode 7003 and the anode 7005. In the case of the pixel illustrated in FIG. 20A, light is emitted from the light-emitting element 7002 to the anode 7005 side as indicated by an arrow.

Next, a light-emitting element having a bottom-emission structure is described with reference to FIG. 20B. FIG. 20B is a cross-sectional view of a pixel in the case where the TFT 7011 for driving the light-emitting element is an n-type TFT and light is emitted from a light-emitting element 7012 to a cathode 7013 side. In FIG. 20B, the cathode 7013 of the light-emitting element 7012 is formed over a light-transmitting conductive film 7017 which is electrically connected to the TFT 7011 for driving the light-emitting element, and a light-emitting layer 7014 and an anode 7015 are stacked in this order over the cathode 7013. A light-blocking film 7016 for reflecting or blocking light may be formed so as to cover the anode 7015 when the anode 7015 has a light-transmitting property. For the cathode 7013, a variety of materials can be used as in the case of FIG. 20A as long as the cathode 7013 is formed using a conductive material having a low work function. The cathode 7013 is formed to have a thickness that enables transmission of light (preferably, approximately 5 nm to 30 nm). For example, an aluminum film with a thickness of 20 nm can be used as the cathode 7013. The light-emitting layer 7014 may be formed using either a single layer or a plurality of layers stacked as in the case of FIG. 20A. The anode 7015 is not required to transmit light but can be formed using a light-transmitting conductive material as in the case of FIG. 20A. As the light-blocking film 7016, a metal or the like that reflects light can be used, for example; however, it is not limited to a metal film. For example, a resin or the like to which black pigments are added can also be used.

Further, between the conductive film 7017 and a conductive film 7018 in an adjacent pixel, a partition wall 7019 is provided so as to cover end portions of the conductive film 7017 and the conductive film 7018. The partition wall 7019 is formed using a film of an organic resin such as polyimide, an acrylic resin, polyamide, or an epoxy resin, an inorganic insulating film, or a polysiloxane. It is particularly preferable that the partition wall 7019 be formed using a photosensitive resin material and the sidewall of the partition wall 7019 be formed as an inclined surface with continuous curvature. When the partition wall 7019 is formed using a photosensitive resin material, a step for forming a resist mask can be omitted.

A region where the light-emitting layer 7014 is sandwiched between the cathode 7013 and the anode 7015 corresponds to the light-emitting element 7012. In the case of the pixel illustrated in FIG. 20B, light is emitted from the light-emitting element 7012 to the cathode 7013 side as indicated by an arrow.

Next, a light-emitting element having a dual-emission structure is described with reference to FIG. 20C. In FIG. 20C, a cathode 7023 of a light-emitting element 7022 is formed over a light-transmitting conductive film 7027 which is electrically connected to the TFT 7021 for driving the light-emitting element, and a light-emitting layer 7024 and an anode 7025 are stacked in this order over the cathode 7023. As in the case of FIG. 20A, the cathode 7023 can be formed using any of a variety of materials as long as the cathode 7023 is formed using a conductive material having a low work function. The cathode 7023 is formed to have a thickness that enables transmission of light. For example, a film of Al having a thickness of 20 nm can be used as the cathode 7023. The light-emitting layer 7024 may be formed using a single layer or a plurality of layers stacked as in the case of FIG. 20A. As in the case of FIG. 20A, the anode 7025 can be formed using a light-transmitting conductive material.

Further, between the conductive film 7027 and a conductive film 7028 in an adjacent pixel, a partition wall 7029 is provided so as to cover end portions of the conductive film 7027 and the conductive film 7028. The partition wall 7029 is formed using a film of an organic resin such as polyimide, an acrylic resin, polyamide, or an epoxy resin, an inorganic insulating film, or a polysiloxane. It is particularly preferable that the partition wall 7029 be formed using a photosensitive resin material and the sidewall of the partition wall 7029 be formed as an inclined surface with continuous curvature. When the partition wall 7029 is formed using a photosensitive resin material, a step for forming a resist mask can be omitted.

The light-emitting element 7022 corresponds to a region where the cathode 7023, the light-emitting layer 7024, and the anode 7025 overlap with one another. In the case of the pixel illustrated in FIG. 20C, light is emitted from the light-emitting element 7022 to both the anode 7025 side and the cathode 7023 side as indicated by arrows.

Note that, although the organic EL element is described here as the light-emitting element, an inorganic EL element can also be provided as a light-emitting element.

Note that the example is described in which the thin film transistor (the TFT for driving the light-emitting element) which controls the driving of a light-emitting element is electrically connected to the light-emitting element; however, a structure may be employed in which a TFT for current control is connected between a TFT for driving a light-emitting element and a light-emitting element.

Figure 20B:
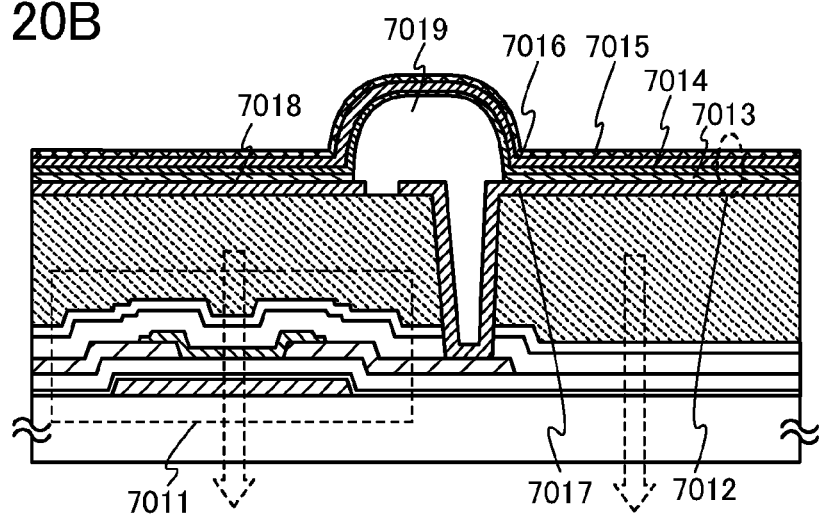
Figure 20C:
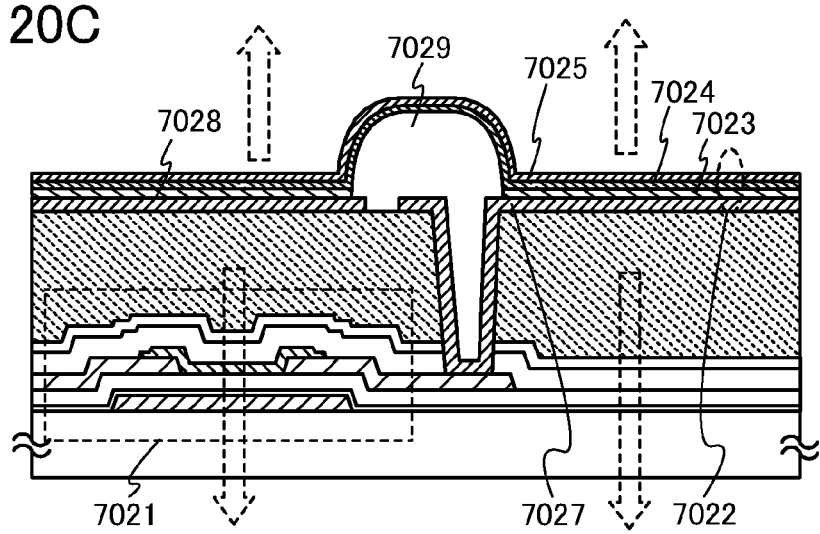

Note that the structure of the semiconductor device is not limited to those illustrated in FIGS. 20A to 20C and can be modified in various ways based on techniques disclosed in this specification.

Next, the appearance and a cross section of a light-emitting display panel (also referred to as a light-emitting panel) which is one embodiment of the semiconductor device are described with reference to FIGS. 21A and 21B. FIG. 21A is a top view of a panel in which a thin film transistor and a light-emitting element formed over a first substrate are sealed between the first substrate and a second substrate with a sealant. FIG. 21B is a cross-sectional view taken along line H-I of FIG. 21A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a bonding film or an ultraviolet curable resin film) or a cover material with high air-tightness and little degasification so that the panel is not exposed to the outside air.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 21B.

Any of the highly reliable thin film transistors including the oxide semiconductor layers, which are described in Embodiments 1 to 5, can be used as the thin film transistors 4509 and 4510. As the thin film transistor 4509 provided in the driver circuit, any of the thin film transistors 210, 240, 470, and 471 which are described in Embodiments 1 to 5 can be used. As the thin film transistor 4510 provided in the pixel, any of the thin film transistors 220, 460, and 461 which are described in Embodiments 1 to 5 can be used. In this embodiment, the thin film transistors 4509 and 4510 are n-channel thin film transistors.

A conductive layer 4540 is provided over an insulating layer 4544 so as to overlap with a channel formation region in an oxide semiconductor layer of the thin film transistor 4509 for the driver circuit. The conductive layer 4540 is provided so as to overlap with the channel formation region of the oxide semiconductor layer, whereby the amount of change in the threshold voltage of the thin film transistor 4509 before and after BT test can be reduced. Further, a potential of the conductive layer 4540 may be the same as or different from that of the gate electrode layer of the thin film transistor 4509. The conductive layer 4540 can function also as a second gate electrode layer. Alternatively, the potential of the conductive layer 4540 may be GND or 0 V, or the conductive layer 4540 may be in a floating state.

Further, a protective insulating layer 4543 is formed over the thin film transistors 4509 and 4510. The protective insulating layer 4543 can be formed using a material and a method which are similar to those of the protective insulating layer 408 described in Embodiment 1. Here, as the protective insulating layer 4543, a silicon nitride film is formed by a PCVD method.

The insulating layer 4544 is formed as the planarization insulating film. The insulating layer 4544 may be formed using a material and a method which are similar to those of the planarization insulating layer 409 described in Embodiment 1. Here, the insulating layer 4544 is formed using an acrylic resin.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that the structure of the light-emitting element 4511 is the stacked structure which includes the first electrode layer 4517, an electroluminescent layer 4512, and a second electrode layer 4513; however, there is no limitation. The structure of the light-emitting element 4511 can be changed as appropriate depending on the direction in which light is extracted from the light-emitting element 4511, or the like.

A partition wall 4520 is formed using an organic resin film, an inorganic insulating film, or a polysiloxane. It is particularly preferable that the partition wall 4520 be formed using a photosensitive material and an opening be formed over the first electrode layer 4517 so that a sidewall of the opening is formed as an inclined surface with continuous curvature.

The electroluminescent layer 4512 may be formed using a single layer or a plurality of layers stacked.

A protective film may be formed over the second electrode layer 4513 and the partition wall 4520 in order to prevent oxygen, hydrogen, moisture, carbon dioxide, or the like from entering the light-emitting element 4511. As the protective film, a silicon nitride film, a silicon nitride oxide film, a DLC film, or the like can be formed.

A variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed using the same conductive film as the first electrode layer 4517 included in the light-emitting element 4511, and a terminal electrode 4516 is formed using the same conductive film as the source electrode layer and the drain electrode layer included in the thin film transistor 4509.

The connection terminal electrode 4515 is electrically connected to a terminal of the FPC 4518a through an anisotropic conductive film 4519.

The second substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (poly(vinyl chloride)), an acrylic resin, polyimide, an epoxy resin, a silicone resin, PVB (poly(vinyl butyral)), or EVA (a copolymer of ethylene with vinyl acetate) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Note that only the signal line driver circuits or part thereof, or the scan line driver circuits or part thereof may be separately formed and mounted. This embodiment is not limited to the structure illustrated in FIGS. 21A and 21B.

Through the above steps, a highly reliable light-emitting display device (display panel) as a semiconductor device can be manufactured.

This embodiment can be implemented in appropriate combination with the structures described in the other embodiments.

Embodiment 10

Figure 22:
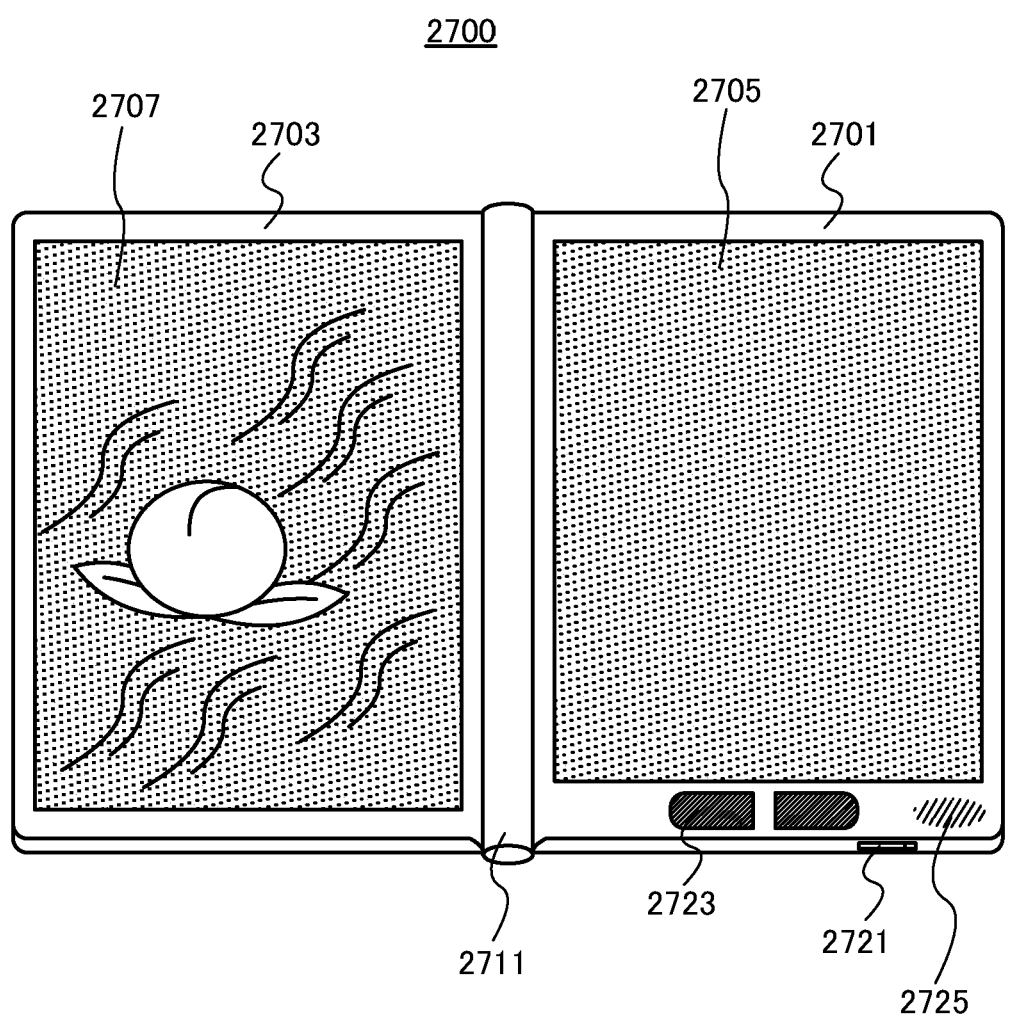
FIG. 22 is an external view of an example of an e-book reader.

A semiconductor device disclosed in this specification can be applied to electronic paper. Electronic paper can be used for electronic devices in all fields as long as they display data. For example, electronic paper can be applied to an e-book reader (an electronic book), a poster, an advertisement in a vehicle such as a train, or displays of a variety of cards such as a credit card. FIG. 22 illustrates an example of the electronic devices.

FIG. 22 illustrates an e-book reader 2700. For example, the e-book reader 2700 includes two housings of a housing 2701 and a housing 2703. The housing 2701 and the housing 2703 are combined with a hinge 2711 so that the e-book reader 2700 can be opened and closed with the hinge 2711 as an axis. Such a structure enables the e-book reader 2700 to operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 22) can display text and a display portion on the left side (the display portion 2707 in FIG. 22) can display graphics.

FIG. 22 illustrates an example in which the housing 2701 is provided with an operation portion and the like. For example, the housing 2701 is provided with a power switch 2721, operation keys 2723, a speaker 2725, and the like. Pages can be turned with the operation keys 2723. Note that a keyboard, a pointing device, and the like may be provided on the same surface as the display portion of the housing. Moreover, an external connection terminal (an earphone terminal, a USB terminal, a terminal connectable to a variety of cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may be configured to wirelessly transmit and receive data. Through wireless communication, desired book data or the like can be purchased and downloaded from an electronic book server.

Embodiment 11

A semiconductor device disclosed in this specification can be applied to a variety of electronic devices (including game machines). Examples of such electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pinball machine, and the like.

Figure 23A:
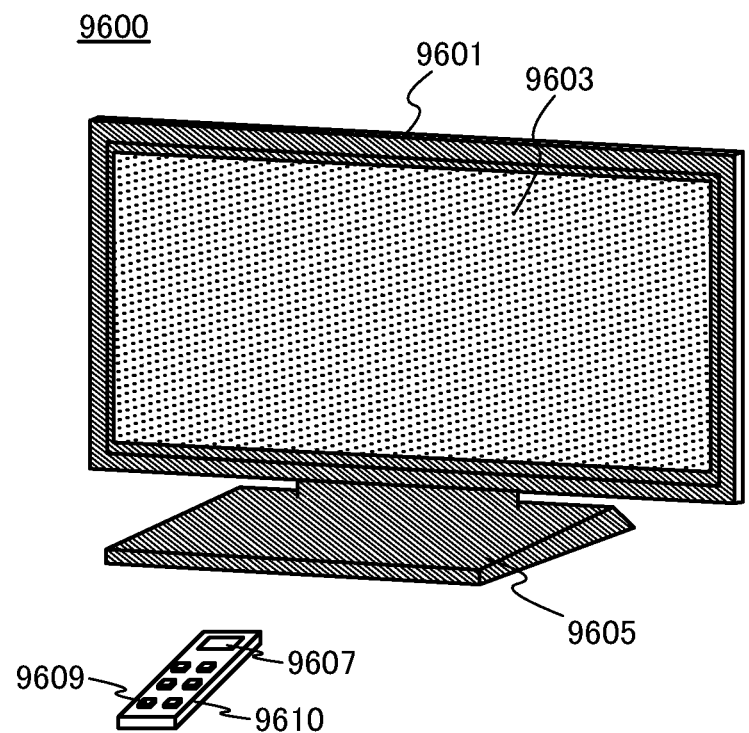
FIGS. 23A and 23B are external views of an example of a television set and an example of a digital photo frame.

FIG. 23A illustrates a television set 9600. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels can be switched and volume can be controlled with operation keys 9609 of the remote controller 9610, whereby an image displayed on the display portion 9603 can be controlled. Moreover, the remote controller 9610 may be provided with a display portion 9607 for displaying data outputted from the remote controller 9610.

Note that the television set 9600 is provided with a receiver, a modem, and the like. With the use of the receiver, general TV broadcasts can be received. Moreover, when the display device is connected to a communication network with or without wires via the modem, one-way (from a sender to a receiver) or two-way (between a sender and a receiver or between receivers) information communication can be performed.

Figure 23B:
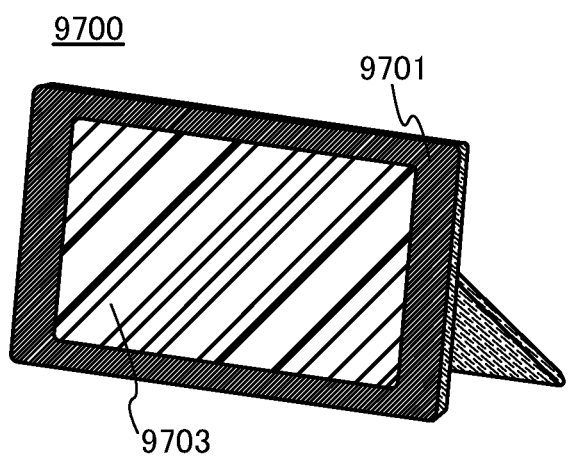

FIG. 23B illustrates a digital photo frame 9700. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection portion (a USB terminal, a terminal connectable to a variety of cables such as a USB cable, or the like), a recording medium insertion portion, and the like. Although these components may be provided on the same surface as the display portion, it is preferable to provide them on the side surface or the back surface for design aesthetics. For example, a memory storing data of an image taken with a digital camera is inserted in the recording medium insertion portion of the digital photo frame 9700 and the data is loaded, whereby the image can be displayed on the display portion 9703.

The digital photo frame 9700 may be configured to transmit and receive data wirelessly. Through wireless communication, desired image data can be loaded to be displayed.

Figure 24A:
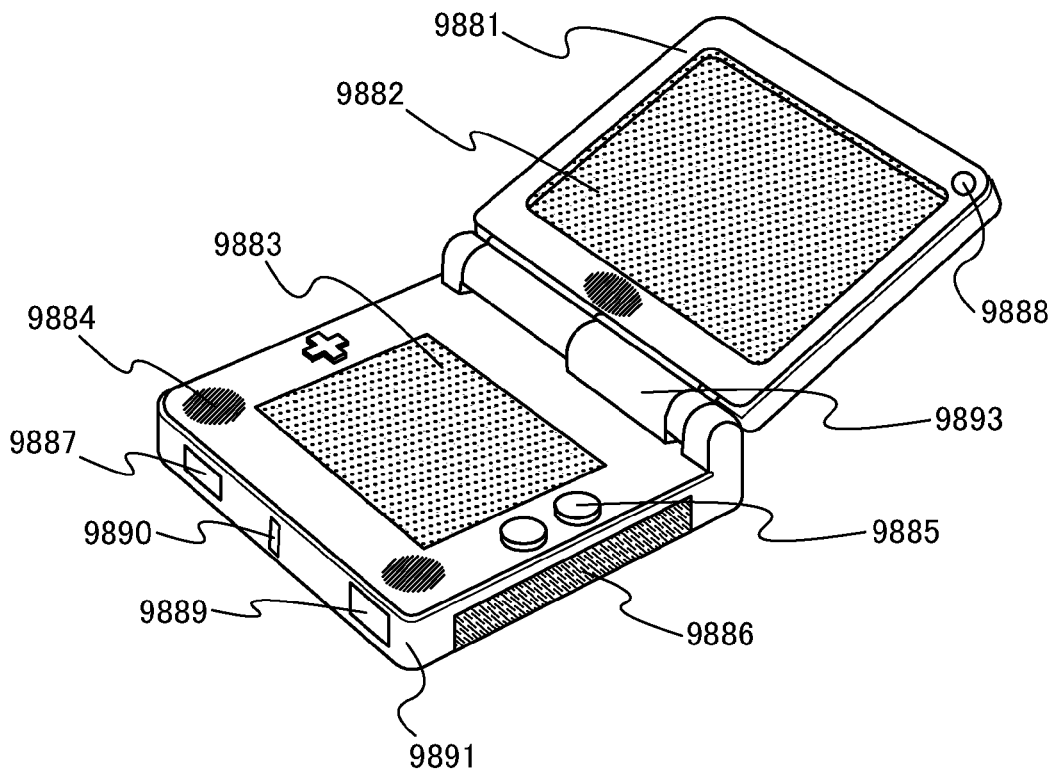
FIGS. 24A and 24B are external views illustrating examples of game machines.

FIG. 24A is a portable game machine and is constituted by two housings of a housing 9881 and a housing 9891 which are connected with a joint portion 9893 so that the portable game machine can be opened or folded. A display portion 9882 and a display portion 9883 are incorporated in the housing 9881 and the housing 9891, respectively. In addition, the portable game machine illustrated in FIG. 24A is provided with a speaker portion 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), and a microphone 9889), and the like. Needless to say, the structure of the portable game machine is not limited to the above and other structures provided with at least a semiconductor device disclosed in this specification can be employed. The portable game machine may include an additional accessory as appropriate. The portable game machine illustrated in FIG. 24A has a function of reading a program or data stored in the recording medium to display it on the display portion, and a function of sharing data with another portable game machine by wireless communication. Note that a function of the portable game machine illustrated in FIG. 24A is not limited to those described above, and the portable game machine can have a variety of functions.

Figure 24B:
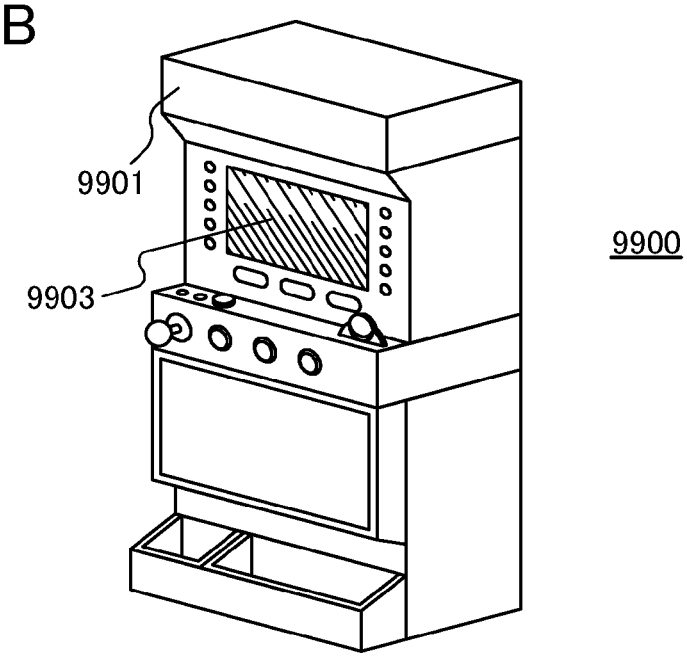

FIG. 24B illustrates a slot machine 9900 which is a large-sized game machine. In the slot machine 9900, a display portion 9903 is incorporated in a housing 9901. In addition, the slot machine 9900 includes an operation means such as a start lever or a stop switch, a coin slot, a speaker, and the like. Needless to say, the structure of the slot machine 9900 is not limited to the above and other structures provided with at least a semiconductor device disclosed in this specification may be employed. The slot machine 9900 may include an additional accessory as appropriate.

Figure 25A:
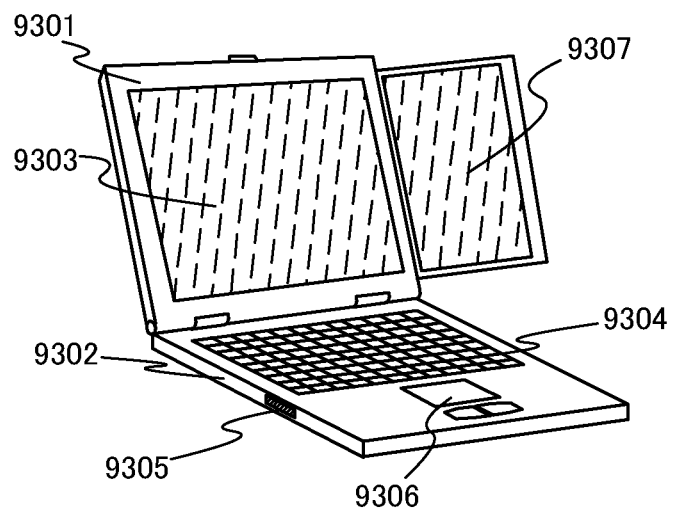
FIGS. 25A and 25B are external views illustrating an example of a portable computer and an example of a mobile phone set.

FIG. 25A is a perspective view illustrating a portable computer.

In the portable computer illustrated in FIG. 25A, a top housing 9301 having a display portion 9303 and a bottom housing 9302 having a keyboard 9304 can overlap with each other by closing a hinge unit which connects the top housing 9301 and the bottom housing 9302. The portable computer illustrated in FIG. 25A is conveniently carried. Moreover, in the case of using the keyboard for input of data, the hinge unit is opened so that a user can input data looking at the display portion 9303.

The bottom housing 9302 includes a pointing device 9306 with which input can be performed, in addition to the keyboard 9304. When the display portion 9303 is a touch panel, a user can input data by touching part of the display portion. The bottom housing 9302 includes an arithmetic function portion such as a CPU or hard disk. In addition, the bottom housing 9302 includes an external connection port 9305 into which another device, for example, a communication cable conformable to communication standards of a USB is inserted.

The top housing 9301, which includes a display portion 9307 and can keep the display portion 9307 therein by sliding it toward the inside of the top housing 9301, can have a large display screen. In addition, a user can adjust the angle of a screen of the display portion 9307 which can be kept in the top housing 9301. If the display portion 9307 which can be kept in the top housing 9301 is a touch panel, a user can input data by touching part of the display portion 9307.

The display portion 9303 or the stowable display portion 9307 is formed using an image display device such as a liquid crystal display panel or a light-emitting display panel using an organic light-emitting element, an inorganic light-emitting element, or the like.

In addition, the portable computer illustrated in FIG. 25A can be provided with a receiver and the like and can receive a TV broadcast to display an image on the display portion. A user can watch a TV broadcast when the whole screen of the display portion 9307 is exposed by being slid while the hinge unit which connects the top housing 9301 and the bottom housing 9302 is kept closed. In this case, the hinge unit is not opened and display is not performed on the display portion 9303. In addition, start up of only a circuit for displaying a TV broadcast is performed. Thus, power consumption can be minimized, which is useful for the portable computer whose battery capacity is limited.

Figure 25B:
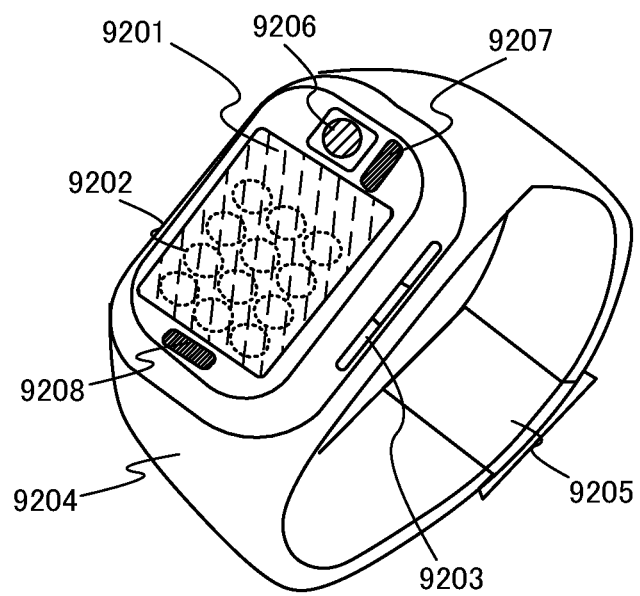

FIG. 25B is a perspective view of an example of a mobile phone that the user can wear on the wrist like a wristwatch.

This mobile phone is formed with a main body which includes a communication device including at least a telephone function, and a battery; a band portion 9204 which enables the main body to be worn on the wrist; an adjusting portion 9205 for adjusting the band portion 9204 to fit the wrist; a display portion 9201; a speaker 9207; and a microphone 9208.

In addition, the main body includes operation switches 9203. The operation switches 9203 can serve, for example, as a switch for starting a program for the Internet when pushed, in addition to serving as a power switch, a switch for switching displays, a switch for instruction to start taking images, or the like, and can be configured to have respective functions.

A user can input data into this mobile phone by touching the display portion 9201 with a finger or an input pen, operating the operation switches 9203, or inputting voice into the microphone 9208. In FIG. 25B, display buttons 9202 are displayed on the display portion 9201. A user can input data by touching the display buttons 9202 with a finger or the like.

Further, the main body includes a camera portion 9206 including an image pick-up means having a function of converting an image of an object, which is formed through a camera lens, to an electronic image signal. Note that the camera portion is not necessarily provided.

The mobile phone illustrated in FIG. 25B is provided with a receiver of a TV broadcast and the like, and can display an image on the display portion 9201 by receiving the TV broadcast. In addition, the mobile phone is provided with a memory device such as a memory, and the like, and can record the TV broadcast in the memory. The mobile phone illustrated in FIG. 25B may have a function of collecting location information such as GPS.

An image display device such as a liquid crystal display panel or a light-emitting display panel using an organic light-emitting element, an inorganic light-emitting element, or the like is used as the display portion 9201. The mobile phone illustrated in FIG. 25B is compact and lightweight and the battery capacity is limited. For the above reason, a panel which can be driven with low power consumption is preferably used as a display device for the display portion 9201.

Note that although FIG. 25B illustrates the electronic device which is worn on the wrist, this embodiment is not limited thereto as long as an electronic device is portable.

Embodiment 12

In this embodiment, as one mode of a semiconductor device, examples of display devices each including the thin film transistor described in any of Embodiments 1 to 5 will be described with reference to FIGS. 26 to 39. In this embodiment, examples of liquid crystal display devices in each of which a liquid crystal element is used as a display element will be described with reference to FIGS. 26 to 39. The thin film transistor described in any of Embodiments 1 to 5 can be used as TFTs 628 and 629. The TFTs 628 and 629 can be manufactured through a process similar to that described in any of Embodiments 1 to 5 and have excellent electrical characteristics and high reliability.

First, a vertical alignment (VA) liquid crystal display device is described. The VA is a method for controlling alignment of liquid crystal molecules of a liquid crystal display. In the VA liquid crystal display device, liquid crystal molecules are aligned in a vertical direction with respect to a panel surface when no voltage is applied. In this embodiment, in particular, a pixel is divided into some regions (subpixels), and liquid crystal molecules are aligned in different directions in their respective regions. This is referred to as multi-domain or multi-domain design. Liquid crystal display devices of the multi-domain design are described below.

Figure 26:
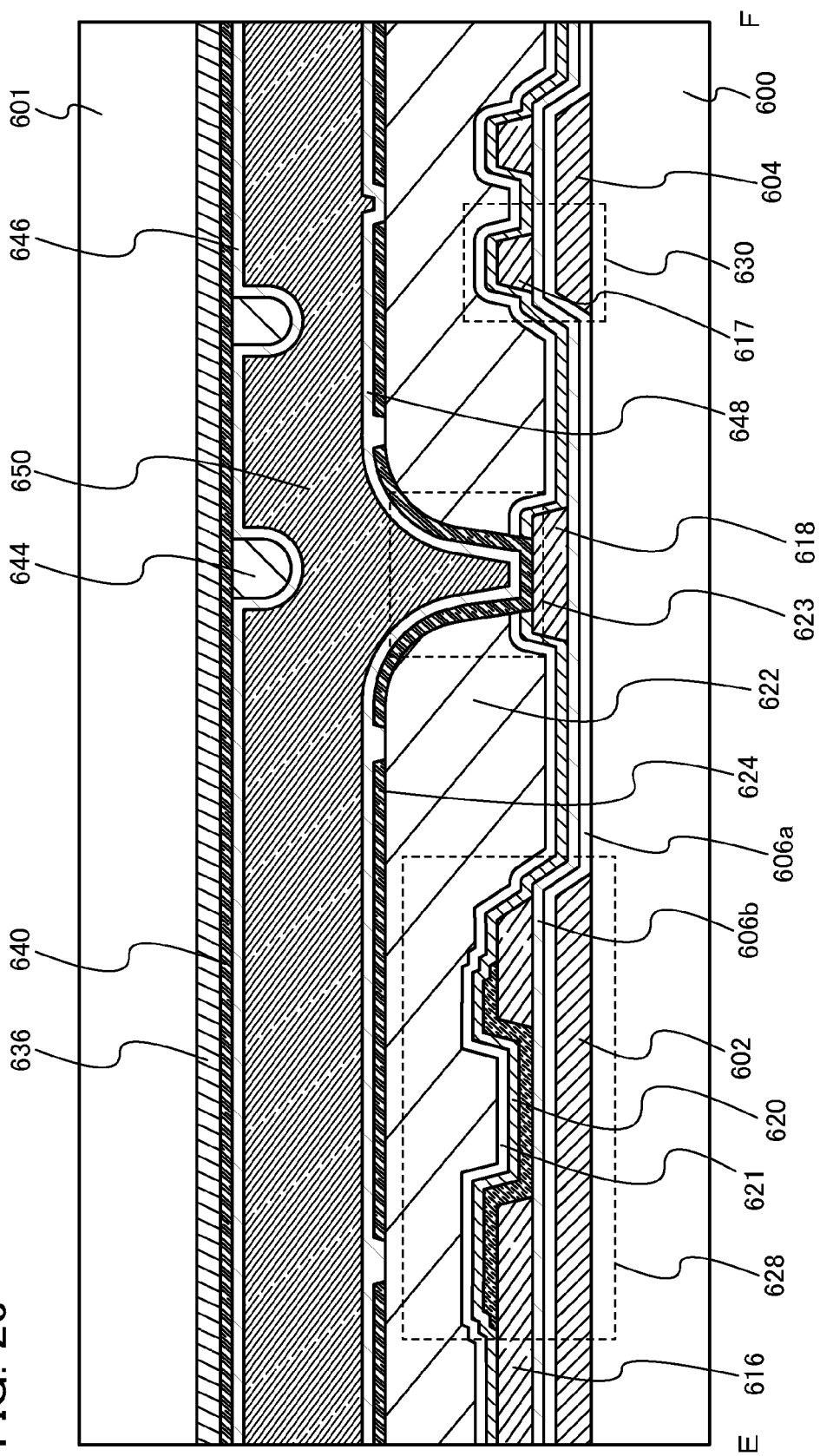
FIG. 26 illustrates a semiconductor device.
Figure 27:
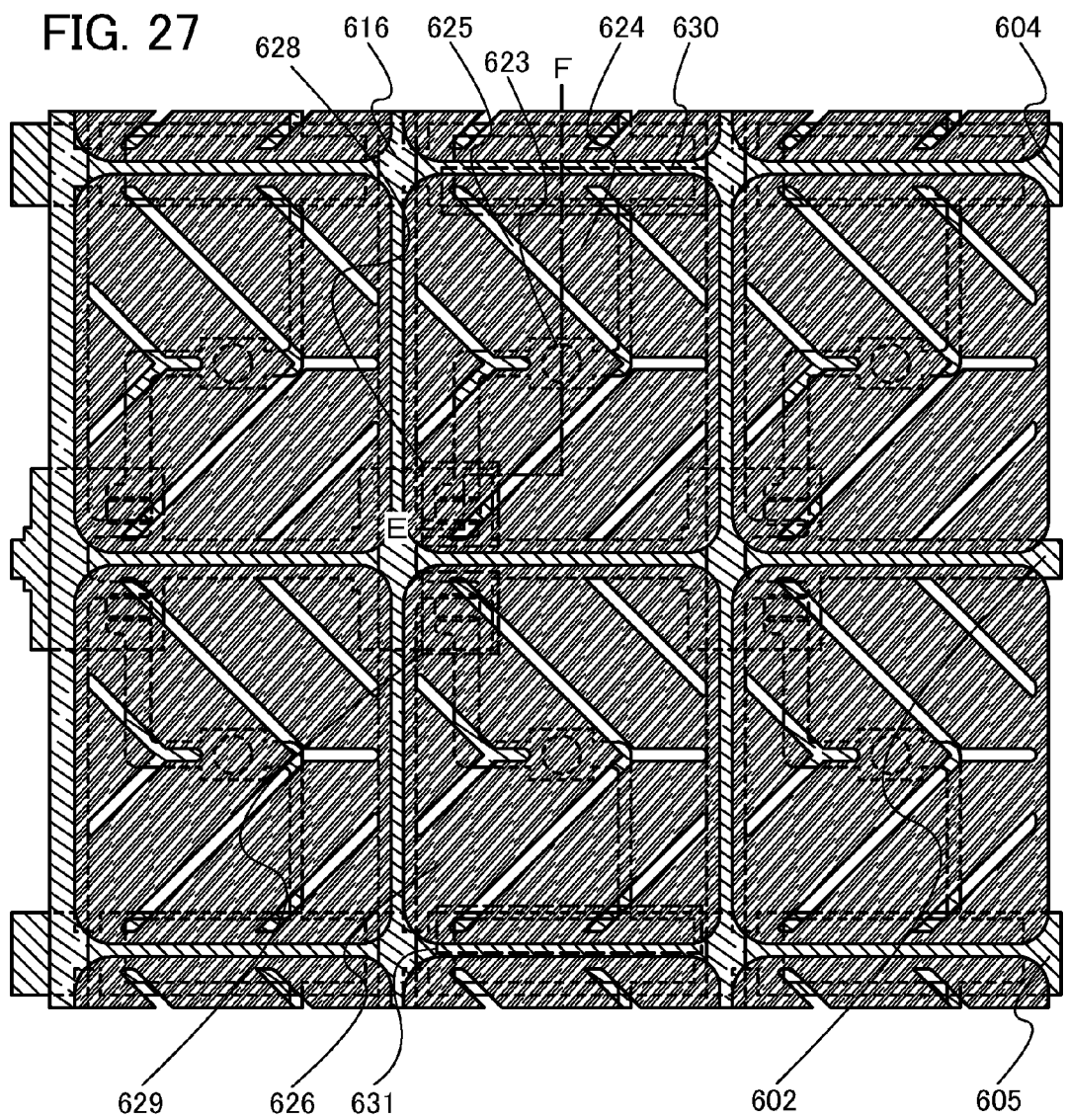
FIG. 27 illustrates a semiconductor device.
Figure 28:
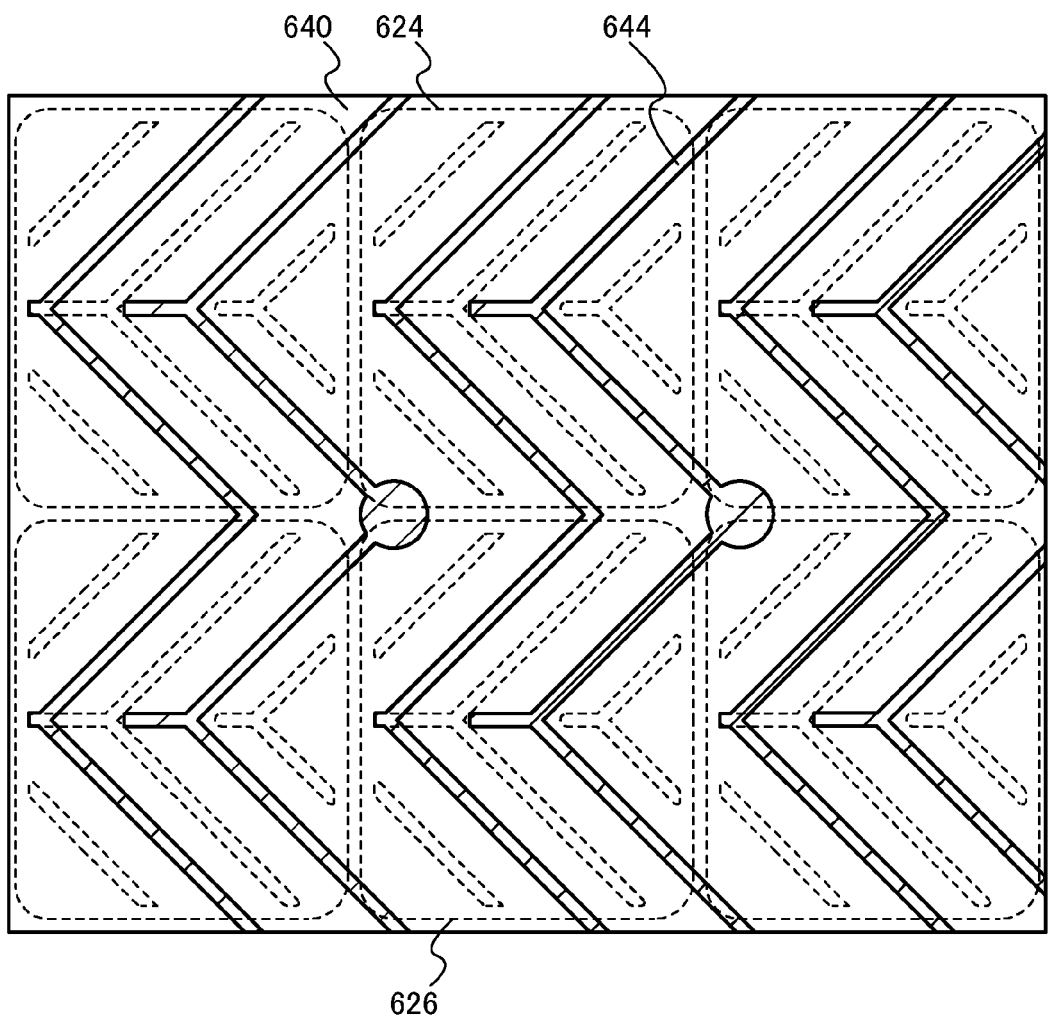
FIG. 28 illustrates a semiconductor device.

FIG. 27 and FIG. 28 illustrate a pixel electrode and a counter electrode, respectively. FIG. 27 is a plan view showing the substrate side where the pixel electrode is formed. FIG. 26 illustrates a cross-sectional structure taken along section line E-F in FIG. 27. FIG. 28 is a plan view showing the substrate side where the counter electrode is formed. Description below is made with reference to those drawings.

In FIG. 26, a substrate 600 over which a TFT 628, a pixel electrode layer 624 connected to the TFT 628, and a storage capacitor portion 630 are formed and a counter substrate 601 for which a counter electrode layer 640 and the like are provided overlap with each other, and liquid crystals are injected between the substrate 600 and the counter substrate 601.

A coloring film 636 and the counter electrode layer 640 are provided for the counter substrate 601, and protrusions 644 are formed on the counter electrode layer 640. An alignment film 648 is formed over the pixel electrode layer 624, and an alignment film 646 is similarly formed on the counter electrode layer 640 and the protrusions 644. A liquid crystal layer 650 is formed between the substrate 600 and the counter substrate 601.

The TFT 628, the pixel electrode layer 624 connected to the TFT 628, and the storage capacitor portion 630 are formed over the substrate 600. The pixel electrode layer 624 is connected to a wiring 618 through a contact hole 623 which penetrates an insulating film 620 and an insulating film 621 for covering the TFT 628, a wiring 616, and the storage capacitor portion 630 and also penetrates an insulating film 622 for covering the insulating film 620 and the insulating film 621. The thin film transistor described in any of Embodiments 1 to 5 can be used as the TFT 628 as appropriate. Further, the storage capacitor portion 630 includes a first capacitor wiring 604 which is formed at the same time as a gate wiring 602 of the TFT 628; a first gate insulating film 606a; a second gate insulating film 606b; and a second capacitor wiring 617 which is formed at the same time as the wirings 616 and 618.

The pixel electrode layer 624, the liquid crystal layer 650, and the counter electrode layer 640 overlap with each other, whereby a liquid crystal element is formed.

FIG. 27 illustrates a planar structure over the substrate 600. The pixel electrode layer 624 is formed using the material described in Embodiment 1. The pixel electrode layer 624 is provided with slits 625. The slits 625 are provided for controlling the alignment of the liquid crystals.

A TFT 629, a pixel electrode layer 626 connected to the TFT 629, and a storage capacitor portion 631 which are illustrated in FIG. 27 can be formed in a similar manner to the TFT 628, the pixel electrode layer 624, and the storage capacitor portion 630, respectively. Both the TFTs 628 and 629 are connected to the wiring 616. One pixel of this liquid crystal display panel includes the pixel electrode layers 624 and 626. The pixel electrode layers 624 and 626 constitute subpixels.

FIG. 28 illustrates a planar structure of the counter substrate side. The counter electrode layer 640 is preferably formed using a material similar to that of the pixel electrode layer 624. The protrusions 644 which control the alignment of the liquid crystals are formed on the counter electrode layer 640. Note that in FIG. 28, the pixel electrode layers 624 and 626 formed over the substrate 600 are represented by dashed lines, and the counter electrode layer 640 and the pixel electrode layers 624 and 626 overlap with each other.

Figure 29:
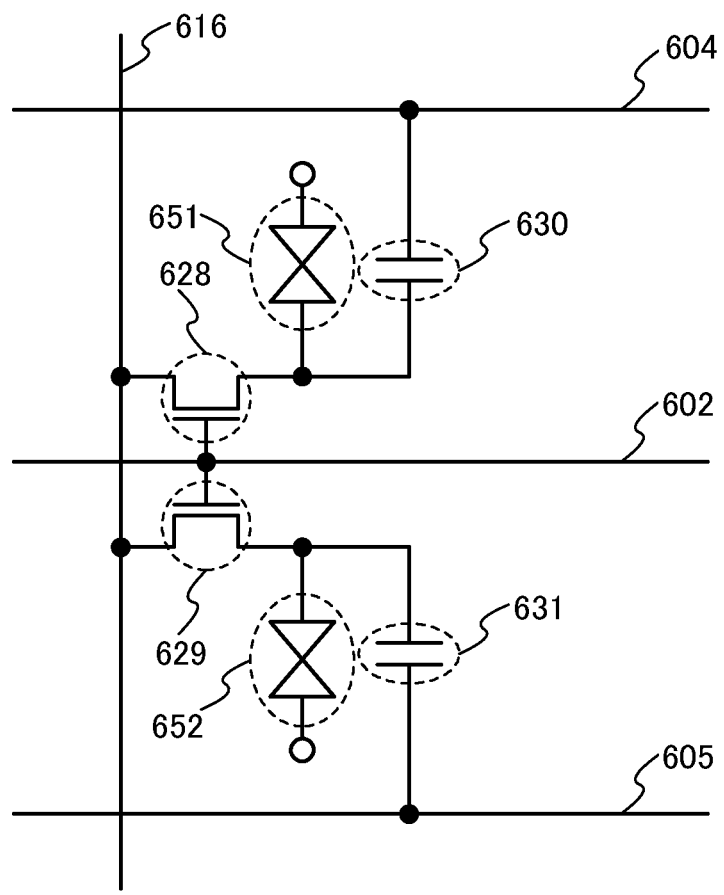
FIG. 29 illustrates a semiconductor device.

FIG. 29 illustrates an equivalent circuit of this pixel structure. Both the TFTs 628 and 629 are connected to the gate wiring 602 and the wiring 616. In that case, when potentials of the capacitor wiring 604 and a capacitor wiring 605 are different from each other, operations of liquid crystal elements 651 and 652 can vary. In other words, the alignment of the liquid crystals is precisely controlled and a viewing angle is increased by separate control of potentials of the capacitor wirings 604 and 605.

When a voltage is applied to the pixel electrode layer 624 provided with the slits 625, a distorted electric field (an oblique electric field) is generated in the vicinity of the slits 625. The protrusions 644 on the counter substrate 601 side and the slits 625 are alternatively arranged so that the oblique electric field is effectively generated to control the alignment of the liquid crystals, whereby the direction of the alignment of the liquid crystals varies depending on the location. In other words, a viewing angle of the liquid crystal display panel is increased by multi-domain.

Next, a VA liquid crystal display device, which is different from the above-described device, will be described with reference to FIG. 30 to FIG. 33.

Figure 30:
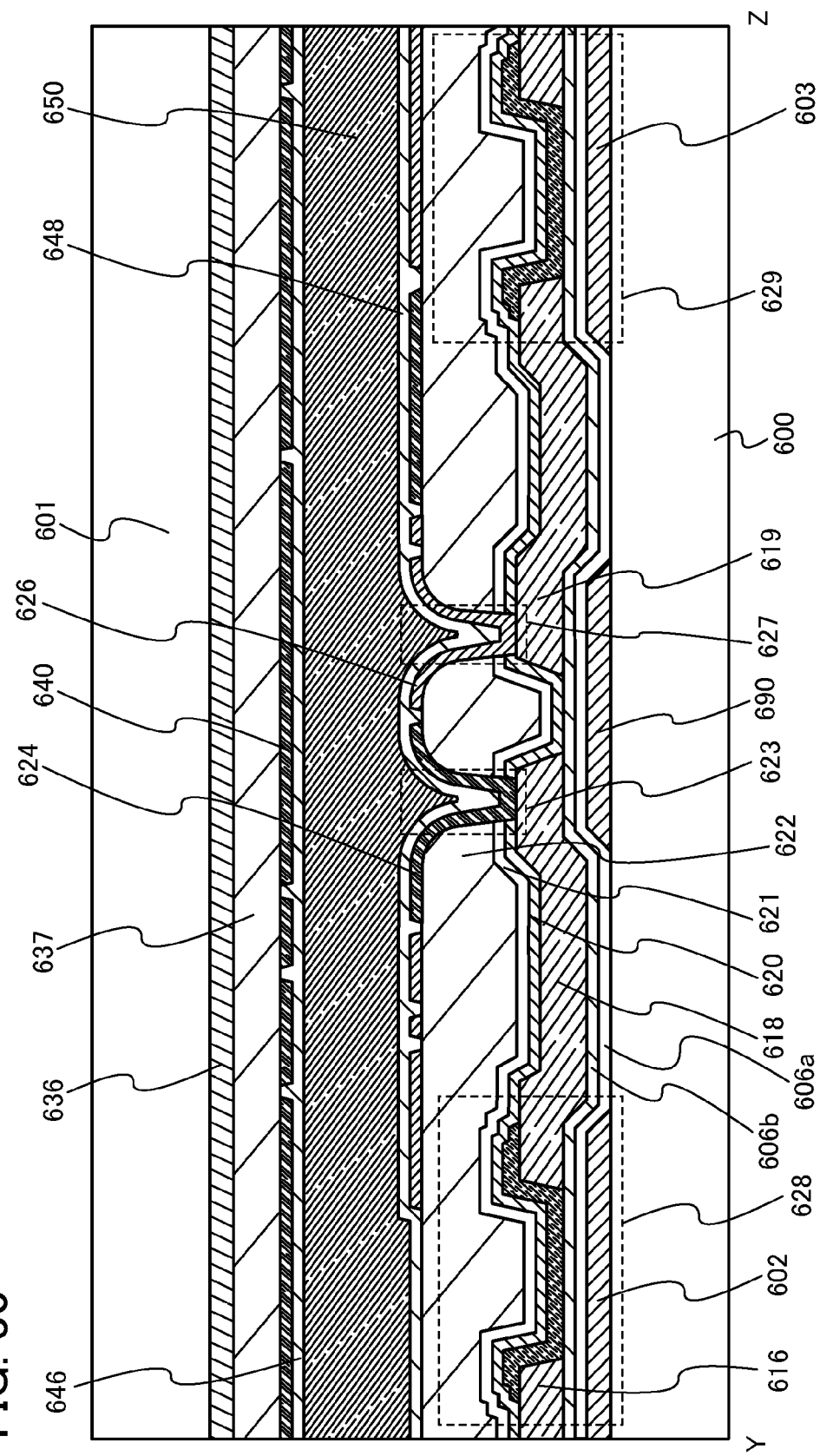
FIG. 30 illustrates a semiconductor device.
Figure 31:
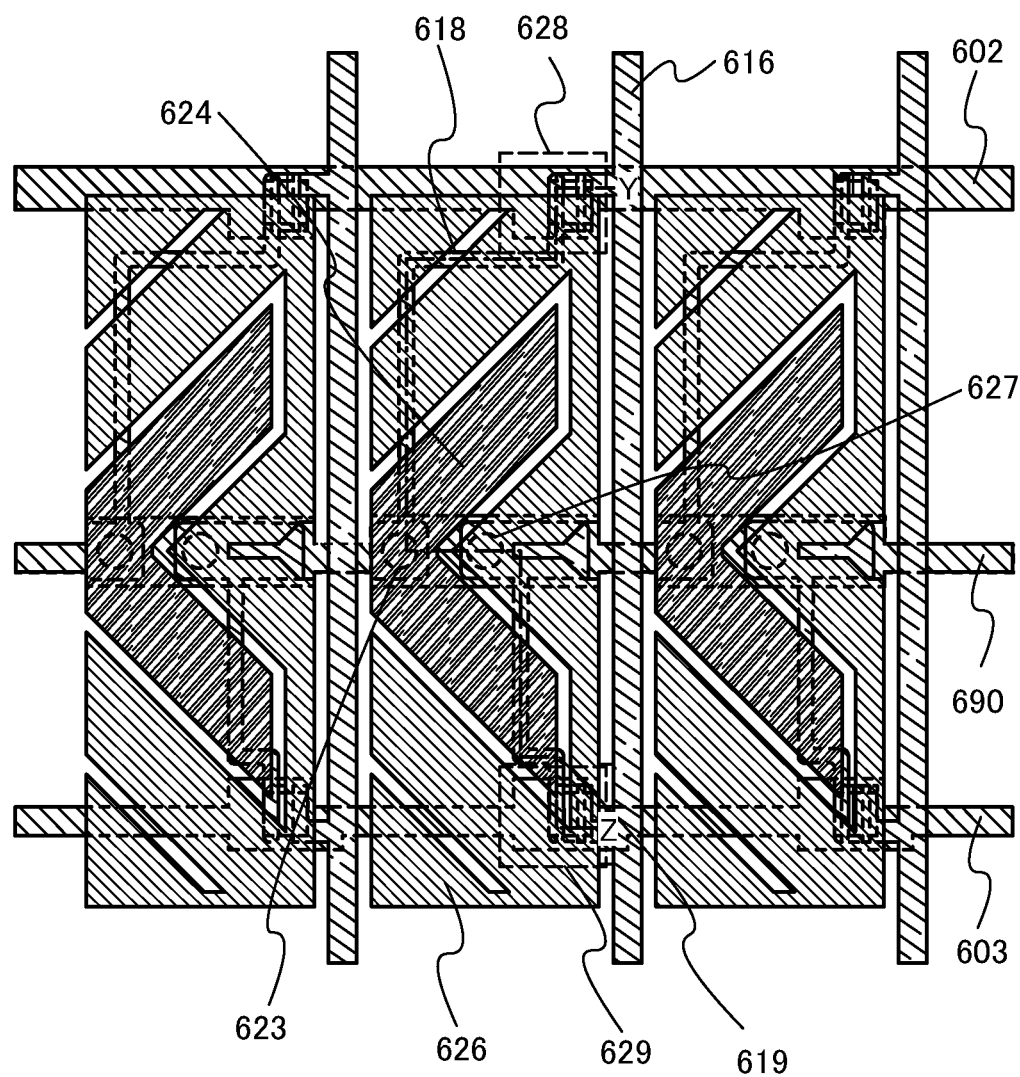
FIG. 31 illustrates a semiconductor device.

FIG. 30 and FIG. 31 illustrate a pixel structure of a VA liquid crystal display panel. FIG. 31 is a plan view of the substrate 600. FIG. 30 illustrates a cross-sectional structure taken along section line Y-Z in FIG. 31.

In this pixel structure, a plurality of pixel electrodes are provided in one pixel, and a TFT is connected to each of the pixel electrodes. The plurality of TFTs is driven by different gate signals. In other words, signals applied to individual pixel electrodes in a multi-domain pixel are controlled independently of each other.

A pixel electrode layer 624 is connected to a TFT 628 through a wiring 618 in a contact hole 623 penetrating insulating films 620, 621, and 622. The pixel electrode layer 626 is connected to a TFT 629 through a wiring 619 in a contact hole 627 penetrating the insulating films 620, 621, and 622. A gate wiring 602 of the TFT 628 is separated from a gate wiring 603 of the TFT 629 so that different gate signals can be supplied. On the other hand, a wiring 616 serving as a data line is shared by the TFTs 628 and 629. The thin film transistor described in any of Embodiments 1 to 5 can be used as appropriate as the TFTs 628 and 629. Note that a first gate insulating film 606a and a second gate insulating film 606b are formed over the gate wiring 602, the gate wiring 603, and a capacitor wiring 690.

Figure 33:
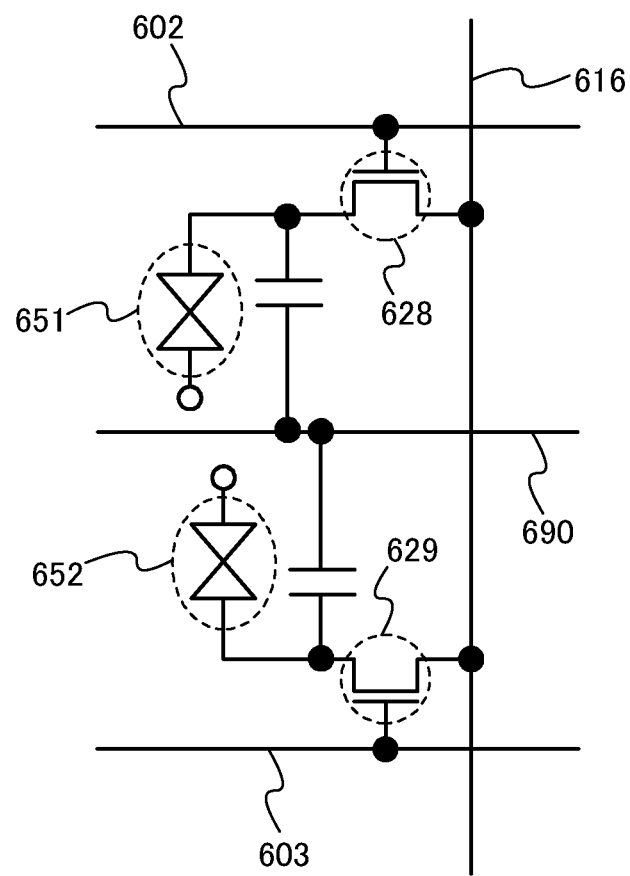
FIG. 33 illustrates a semiconductor device.

The shape of the pixel electrode layer 624 is different from that of the pixel electrode layer 626. The pixel electrode layer 626 is formed so as to surround the external side of the pixel electrode layer 624 which spreads into a V shape. Voltages applied to the pixel electrode layers 624 and 626 are made to be different in TFTs 628 and 629, whereby alignment of liquid crystals is controlled. FIG. 33 illustrates an equivalent circuit of this pixel structure. The TFT 628 is connected to the gate wiring 602, and the TFT 629 is connected to the gate wiring 603. Both the TFTs 628 and 629 are connected to the wiring 616. When different gate signals are supplied to the gate wirings 602 and 603, operations of liquid crystal elements 651 and 652 can vary. In other words, the operations of the TFTs 628 and 629 are controlled separately to precisely control the alignment of the liquid crystals in the liquid crystal elements 651 and 652, which leads to a wider viewing angle.

Figure 32:
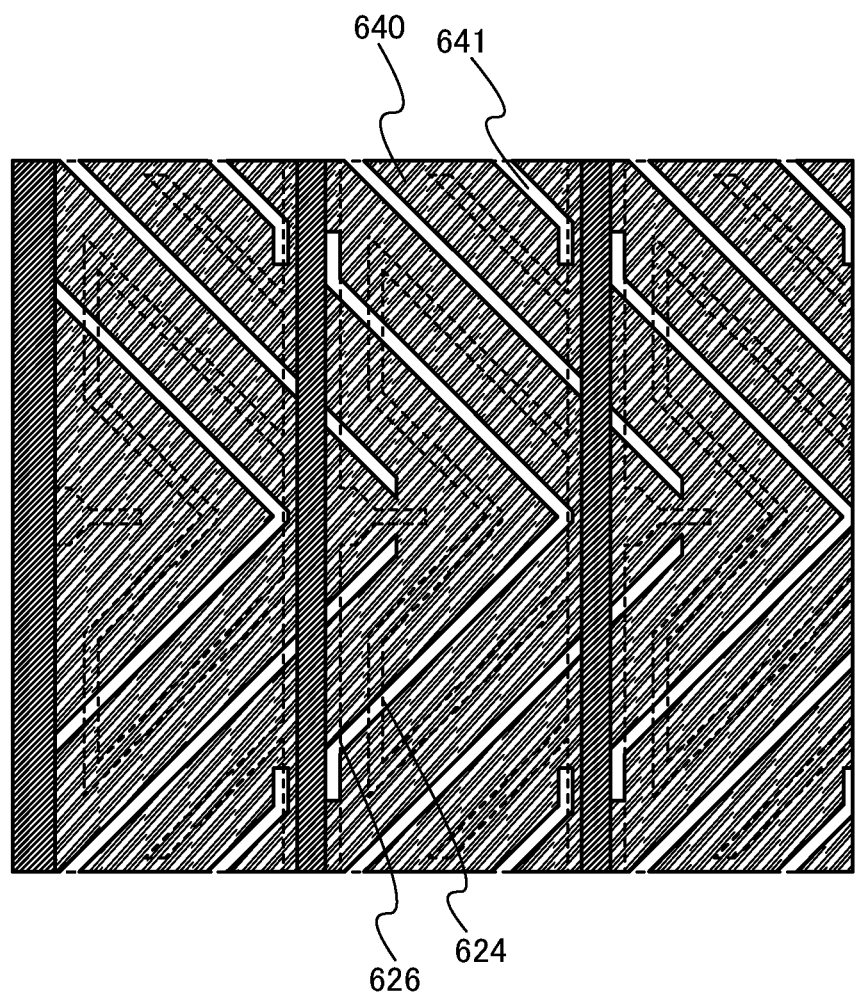
FIG. 32 illustrates a semiconductor device.

A counter substrate 601 is provided with a coloring film 636 and a counter electrode layer 640. A planarization film 637 is formed between the coloring film 636 and the counter electrode layer 640 to prevent alignment disorder of the liquid crystals. FIG. 32 illustrates a planar structure of the counter substrate side. The counter electrode layer 640 is an electrode shared by different pixels and slits 641 are formed. The slits 641 and the slits 625 on the pixel electrode layer 624 and 626 sides are alternatively arranged so that an oblique electric field is effectively generated, whereby the alignment of the liquid crystals can be controlled. Accordingly, the alignment of the liquid crystals can vary in different locations, which leads to a wider viewing angle. Note that in FIG. 32, the pixel electrode layers 624 and 626 which are formed over the substrate 600 are represented by dashed lines and the counter electrode layer 640 and the pixel electrode layers 624 and 626 overlap with each other.

An alignment film 648 is formed over the pixel electrode layer 624 and the pixel electrode layer 626, and the counter electrode layer 640 is similarly provided with an alignment film 646. A liquid crystal layer 650 is formed between the substrate 600 and a counter substrate 601. The pixel electrode layer 624, the liquid crystal layer 650, and the counter electrode layer 640 overlap with each other to form a first liquid crystal element. The pixel electrode layer 626, the liquid crystal layer 650, and the counter electrode layer 640 overlap with each other to form a second liquid crystal element. The pixel structure of the display panel illustrated in FIG. 30 to FIG. 33 is a multi-domain structure in which the first liquid crystal element and the second liquid crystal element are provided in one pixel.

Next, a liquid crystal display device in a horizontal electric field mode is described. In the horizontal electric field mode, an electric field is applied in a horizontal direction with respect to liquid crystal molecules in a cell, whereby liquid crystals are driven to express a gray scale. With this method, a viewing angle can be increased to about 180°. Hereinafter, a liquid crystal display device in the horizontal electric field mode is described.

Figure 34:
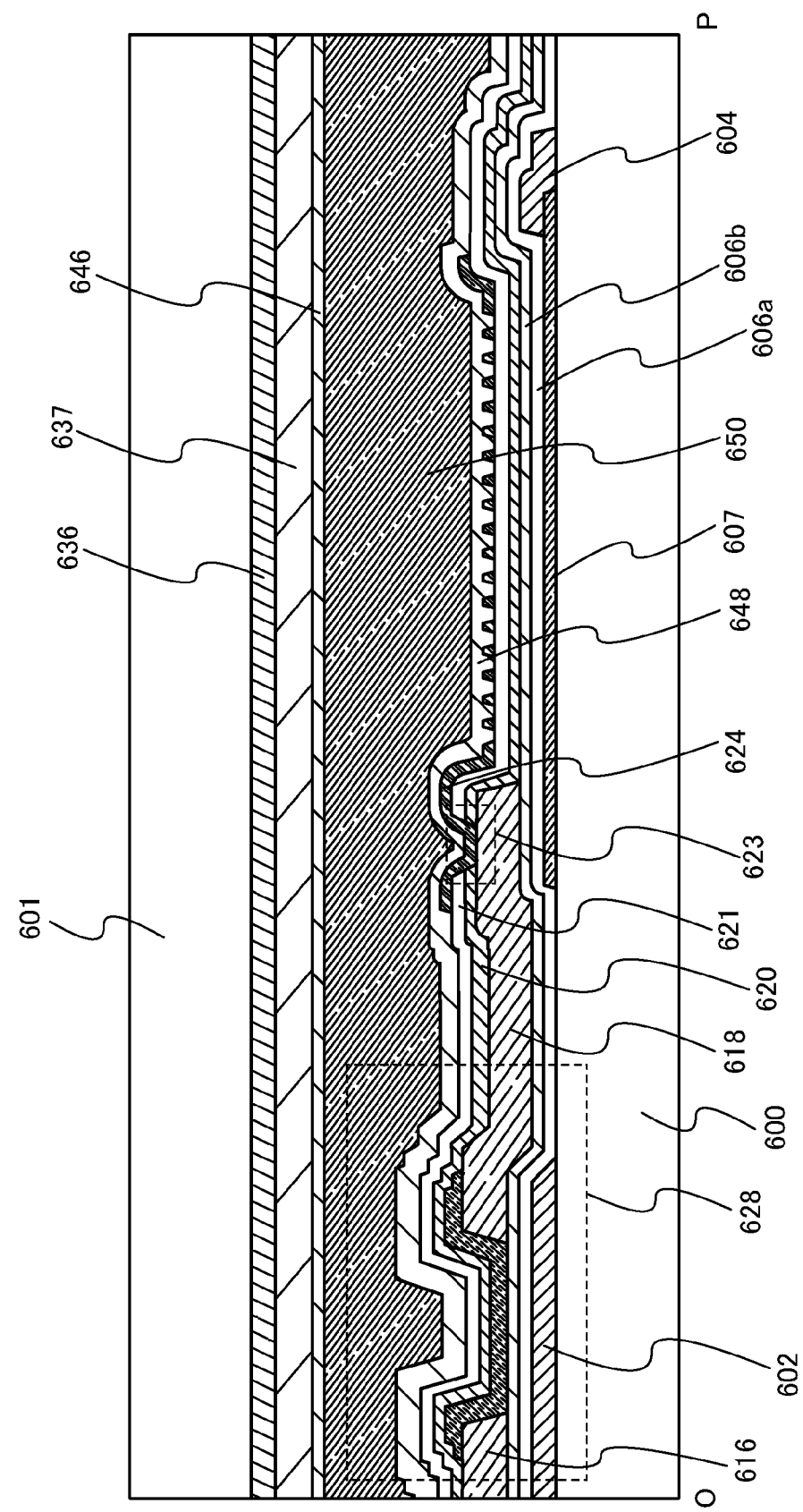
FIG. 34 illustrates a semiconductor device.

In FIG. 34, a substrate 600 over which an electrode layer 607, a TFT 628, and a pixel electrode layer 624 connected to the TFT 628 are formed overlaps with a counter substrate 601, and liquid crystals are injected between the substrate 600 and the counter substrate 601. The counter substrate 601 is provided with a coloring film 636, a planarization film 637, and the like. Note that a counter electrode is not provided on the counter substrate 601 side. In addition, a liquid crystal layer 650 is formed between the substrate 600 and the counter substrate 601 with the alignment films 646 and 648 therebetween.

The electrode layer 607 and a capacitor wiring 604 connected to the electrode layer 607, and the TFT 628 are formed over the substrate 600. The capacitor wiring 604 can be formed at the same time as a gate wiring 602 of the TFT 628. The thin film transistor described in any of Embodiments 1 to 5 can be used as the TFT 628. The electrode layer 607 can be formed using a material similar to that of the pixel electrode layer described in any of Embodiment 1 to 5. The electrode layer 607 is divided almost in a pixel form. Note that a first gate insulating film 606a and a second insulating film 606b are formed over the electrode layer 607 and the capacitor wiring 604.

Wirings 616 and 618 of the TFT 628 are formed over the first gate insulating film 606a and the second gate insulating film 606b. The wiring 616 is a data line through which a video signal travels, extends in one direction in a liquid crystal display panel, is connected to a source or drain region of the TFT 628, and functions as one of source and drain electrodes. The wiring 618 functions as the other of the source and drain electrodes and is connected to the pixel electrode layer 624.

An insulating film 620 and an insulating film 621 are formed over the wirings 616 and 618. Over the insulating film 621, the pixel electrode layer 624 is formed to be connected to the wiring 618 through a contact hole 623 formed in the insulating film 620 and the insulating film 621. The pixel electrode layer 624 is formed using a material similar to that of the pixel electrode described in any of Embodiments 1 to 5.

In such a manner, the TFT 628 and the pixel electrode layer 624 connected to the TFT 628 are formed over the substrate 600. Note that a storage capacitor is formed with the electrode layer 607 and the pixel electrode layer 624.

Figure 35:
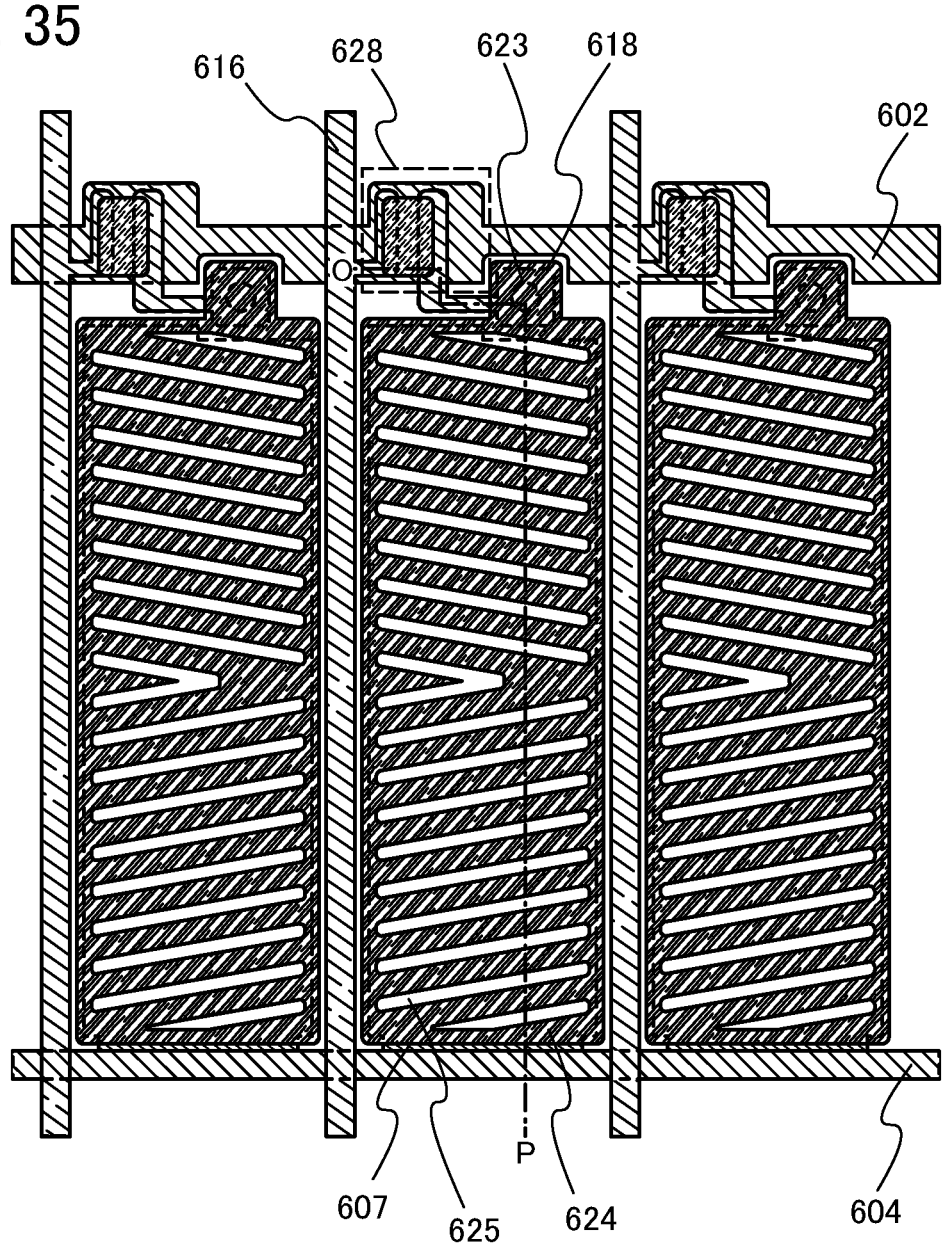
FIG. 35 illustrates a semiconductor device.

FIG. 35 is a plan view illustrating a structure of the pixel electrode. FIG. 34 illustrates a cross-sectional structure taken along section line O-P in FIG. 35. The pixel electrode layer 624 is provided with slits 625. The slits 625 are provided for controlling alignment of liquid crystals. In that case, an electric field is generated between the electrode layer 607 and the pixel electrode layer 624. The thickness of the first gate insulating film 606a and the second gate insulating film 606b which are formed between the electrode layer 607 and the pixel electrode layer 624 is 50 nm to 200 nm, which is much smaller than the thickness of the liquid crystal layer which is 2 μm to 10 μm. Thus, an electric field is generated substantially in parallel (in a horizontal direction) to the substrate 600. The alignment of the liquid crystals is controlled with this electric field. Liquid crystal molecules are horizontally rotated with the use of the electric field in the direction substantially parallel to the substrate. In that case, the liquid crystal molecules are horizontally aligned in any state, and thus the contrast or the like is less influenced by the viewing angle, which leads to a wider viewing angle. In addition, since both the electrode layer 607 and the pixel electrode layer 624 are light-transmitting electrodes, an aperture ratio can be improved.

Next, a different example of the liquid crystal display device in the horizontal electric field mode is described.

Figure 36:
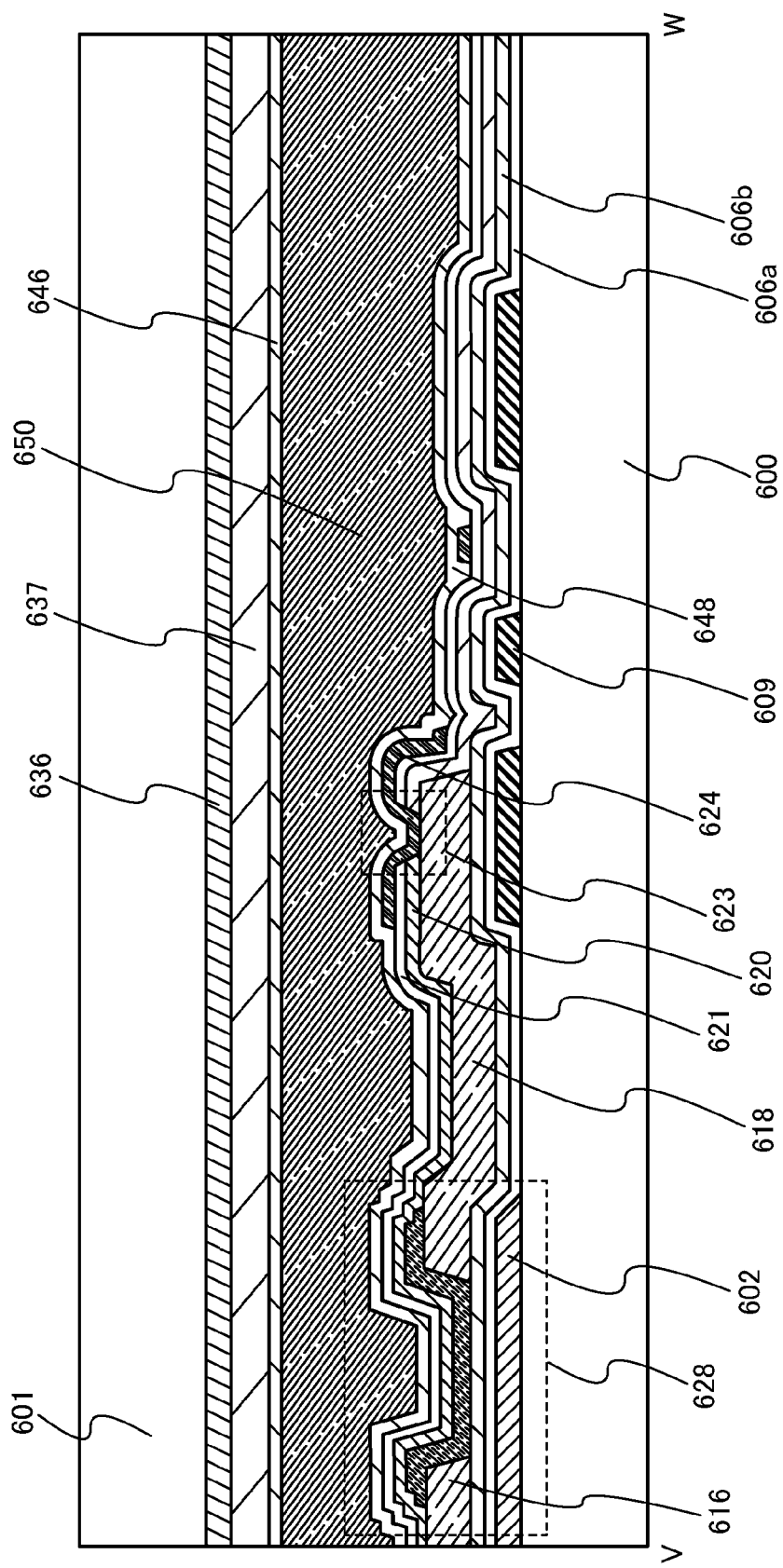
FIG. 36 illustrates a semiconductor device.
Figure 37:
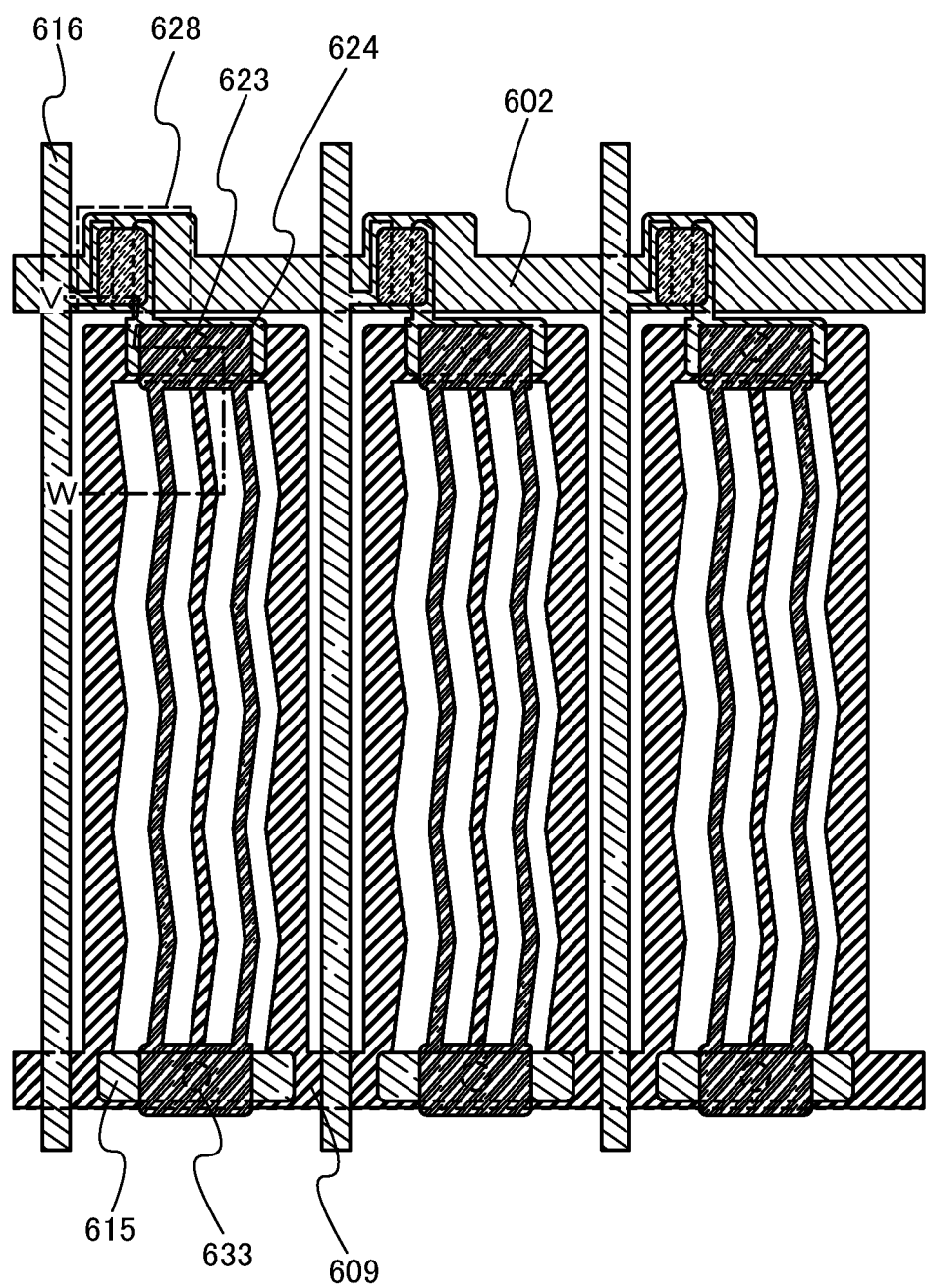
FIG. 37 illustrates a semiconductor device.

FIG. 36 and FIG. 37 illustrate a pixel structure of a liquid crystal display device in an IPS mode. FIG. 37 is a plan view. FIG. 36 illustrates a cross-sectional structure taken along section line V-W in FIG. 37. Description below is given with reference to both the drawings.

In FIG. 36, a substrate 600 over which a TFT 628 and a pixel electrode layer 624 connected to the TFT 628 are formed overlaps with a counter substrate 601, and liquid crystals are injected between the substrate 600 and the counter substrate 601. The counter substrate 601 is provided with a coloring film 636, a planarization film 637, and the like. Note that a counter electrode is not provided on the counter substrate 601 side. A liquid crystal layer 650 is formed between the substrate 600 and the counter substrate 601 with the alignment films 646 and 648 therebetween.

A common potential line 609 and the TFT 628 are formed over the substrate 600. The common potential line 609 can be formed at the same time as a gate wiring 602 of the TFT 628. The thin film transistor described in any of Embodiments 1 to 5 can be used as the TFT 628.

Wirings 616 and 618 of the TFT 628 are formed over the first gate insulating film 606a and the second gate insulating film 606b. The wiring 616 is a data line through which a video signal travels, extends in one direction in a liquid crystal display panel, is connected to a source or drain region of the TFT 628, and functions as one of source and drain electrodes. The wiring 618 functions as the other of the source and drain electrodes and is connected to the pixel electrode layer 624.

An insulating film 620 and an insulating film 621 are formed over the wirings 616 and 618. Over the insulating film 620 and the insulating film 621, the pixel electrode layer 624 is formed to be connected to the wiring 618 through a contact hole 623 formed in the insulating film 620 and the insulating film 621. The pixel electrode layer 624 is formed using a material similar to that of the pixel electrode described in any of Embodiments 1 to 5. Note that, as illustrated in FIG. 37, the pixel electrode layer 624 is formed such that the pixel electrode layer 624 and a comb-like electrode that is formed at the same time as the common potential line 609 can generate a horizontal electric field. Further, the pixel electrode layer 624 is formed so that comb-teeth portions of the pixel electrode layer 624 and those of the comb-like electrode that is formed at the same time as the common potential line 609 are alternately arranged.

The alignment of the liquid crystals is controlled by an electric field generated between a potential applied to the pixel electrode layer 624 and a potential of the common potential line 609. Liquid crystal molecules are horizontally rotated with the use of the electric field in the direction substantially parallel to the substrate. In that case, the liquid crystal molecules are horizontally aligned in any state, and thus the contrast or the like is less influenced by the viewing angle, which leads to a wider viewing angle.

In such a manner, the TFT 628 and the pixel electrode layer 624 connected to the TFT 628 are formed over the substrate 600. A storage capacitor is formed with a first gate insulating film 606a, and a second gate insulating film 606b, the common potential line 609, and a capacitor electrode 615. The capacitor electrode 615 and the pixel electrode layer 624 are connected to each other through a contact hole 633.

Next, a mode of a liquid crystal display device in a TN mode is described.

Figure 38:
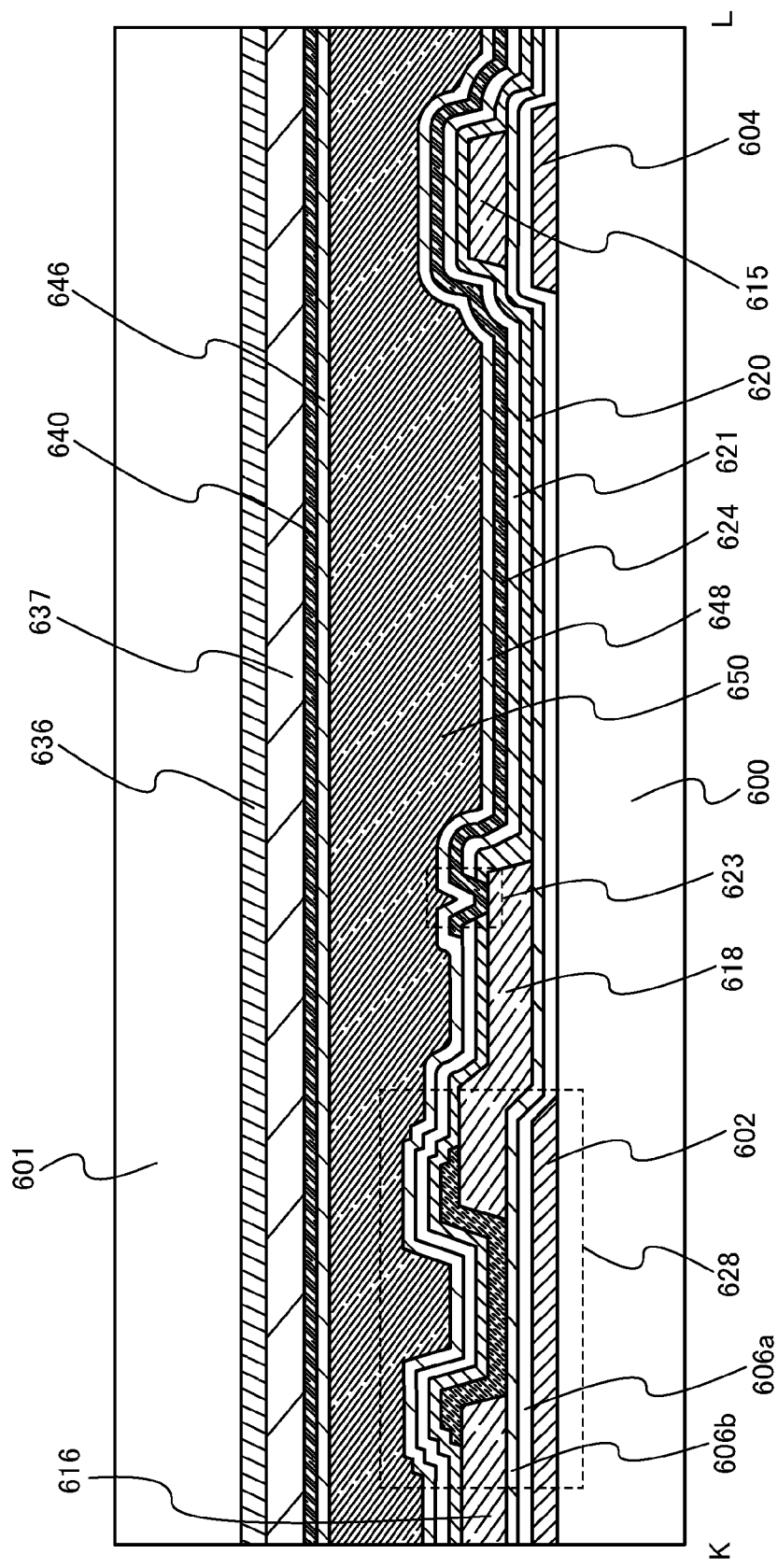
FIG. 38 illustrates a semiconductor device.
Figure 39:
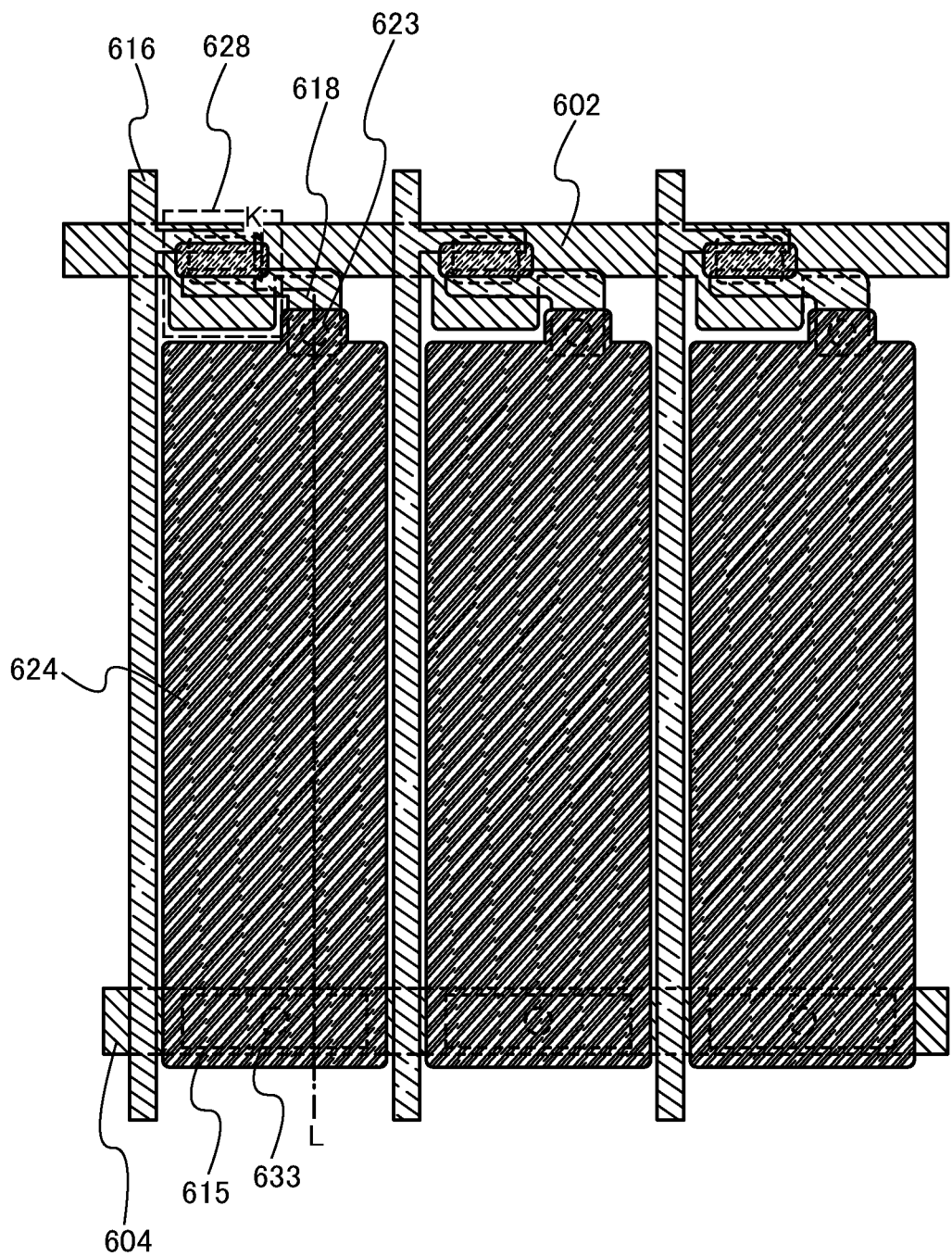
FIG. 39 illustrates a semiconductor device.

FIG. 38 and FIG. 39 illustrate a pixel structure of a liquid crystal display device in a TN mode. FIG. 39 is a plan view. FIG. 38 illustrates a cross-sectional structure taken along section line K-L in FIG. 39. Description below is given with reference to both the drawings.

A pixel electrode layer 624 is connected to a TFT 628 through a wiring 618 through a contact hole 623 formed in an insulating film 620 and an insulating film 621. A wiring 616 functioning as a data line is connected to the TFT 628. The TFT described in any of Embodiments 1 to 5 can be used as the TFT 628.

The pixel electrode layer 624 is formed using the pixel electrode described in any of Embodiments 1 to 5. A capacitor wiring 604 can be formed at the same time as a gate wiring 602 of the TFT 628. A first gate insulating film 606a and a second gate insulating film 606b are formed over the gate wiring 602 and the capacitor wiring 604. A storage capacitor is formed with the first gate insulating film 606a, the second gate insulating film 606b, the capacitor wiring 604, and a capacitor electrode 615. The capacitor electrode 615 and the pixel electrode layer 624 are connected to each other through a contact hole 633.

A counter substrate 601 is provided with a coloring film 636 and a counter electrode layer 640. A planarization film 637 is formed between the coloring film 636 and the counter electrode layer 640 to prevent alignment disorder of liquid crystals. A liquid crystal layer 650 is formed between the pixel electrode layer 624 and the counter electrode layer 640 with the alignment films 646 and 648 therebetween.

The pixel electrode layer 624, the liquid crystal layer 650, and the counter electrode layer 640 overlap with each other, whereby a liquid crystal element is formed.

The coloring film 636 may be formed on the substrate 600 side. A polarizing plate can be attached to a surface of the substrate 600, which is opposite to the surface provided with the thin film transistor, and a polarizing plate can be attached to a surface of the counter substrate 601, which is opposite to the surface provided with the counter electrode layer 640.

Through the above-described process, liquid crystal display devices can be manufactured as display devices. The liquid crystal display devices of this embodiment each have a high aperture ratio.

This application is based on Japanese Patent Application serial no. 2009-169602 filed with Japan Patent Office on Jul. 18, 2009, the entire contents of which are hereby incorporated by reference.

REFERENCE NUMERALS

10: pulse output circuit, 11: wiring, 12: wiring, 13: wiring, 14: wiring, 15: wiring, 21: input terminal, 22: input terminal, 23: input terminal, 24: input terminal, 25: input terminal, 26: output terminal, 27: output terminal, 31: transistor, 32: transistor, 33: transistor, 34: transistor, 35: transistor, 36: transistor, 37: transistor, 38: transistor, 39: transistor, 40: transistor, 41: transistor, 42: transistor, 43: transistor, 51: power supply line, 52: power supply line, 53: power supply line, 61: period, 62: period, 90: light-blocking portion, 101: gate electrode layer, 105: conductive film, 106: resist mask, 111: gate electrode layer, 200: substrate, 203: protective insulating layer, 204: planarization insulating layer, 210: thin film transistor, 216: oxide insulating layer, 217: conductive layer, 220: thin film transistor, 224: contact hole, 227: pixel electrode layer, 230: capacitor wiring layer, 231: capacitor electrode, 232: gate wiring layer, 233: oxide semiconductor layer, 234: source wiring, 235: terminal electrode, 236: metal wiring layer, 237: metal wiring layer, 238: gate wiring layer, 240: thin film transistor, 241, metal wiring layer, 242: metal wiring layer, 250: capacitor wiring layer, 252: oxide semiconductor layer, 400: substrate, 401: gate electrode layer, 404: metal conductive film, 405: conductive layer, 406: conductive layer, 407: oxide insulating film, 408: protective insulating layer, 409: planarization insulating layer, 410: resist mask, 411: resist mask, 412: resist mask, 413: oxide semiconductor film, 415: conductive layer, 430: oxide semiconductor layer, 431: high-resistant drain region, 432: high-resistant drain region, 433: oxide semiconductor layer, 434: channel formation region, 438: projected region, 439: projected region, 451: gate electrode layer, 452: contact hole, 453: oxide semiconductor layer, 454: oxide semiconductor layer, 456: pixel electrode layer, 458: oxide semiconductor layer, 459: oxide semiconductor layer, 460: thin film transistor, 461: thin film transistor, 470: thin film transistor, 471: thin film transistor, 580: substrate, 581: thin film transistor, 583: insulating film, 585: insulating layer, 587: electrode layer, 588: electrode layer, 589: spherical particle, 594: cavity, 595: filler, 596: substrate, 600: substrate, 601: counter substrate, 602: gate wiring, 603: gate wiring, 604: capacitor wiring, 605: capacitor wiring, 607: electrode layer, 609: common potential line, 615: capacitor electrode, 616: wiring, 617: capacitor wiring, 618: wiring, 619: wiring, 620: insulating film, 621: insulating film, 622: insulating film, 623: contact hole, 624: pixel electrode layer, 625: slit, 626: pixel electrode layer, 627: contact hole, 628: TFT, 629: TFT, 630: storage capacitor portion, 631: storage capacitor portion, 633: contact hole, 636: coloring film, 637: planarization film, 640: counter electrode layer, 641: slit, 644: protrusion, 646: alignment film, 648: alignment film, 650: liquid crystal layer, 651: liquid crystal element, 652: liquid crystal element, 690: capacitor wiring, 900: gray-tone mask, 901 substrate, 902: light-blocking portion, 903: diffraction grating portion, 910: half-tone mask, 911: substrate, 912: light-blocking portion, 913: semi-light-transmitting portion, 2600: TFT substrate, 2601: counter substrate, 2602: sealant, 2603: pixel portion, 2604: display element, 2605: coloring layer, 2606: polarizing plate, 2607: polarizing plate, 2608: wiring circuit portion, 2609: flexible wiring board, 2610: cold cathode fluorescent lamp, 2611: reflecting plate, 2612: circuit board, 2613: diffusion plate, 2700: e-book reader, 2701: housing, 2703: housing, 2705: display portion, 2707: display portion, 2711: hinge, 2721: power switch, 2723: operation key, 2725: speaker, 4001: substrate, 4002: pixel portion, 4003: signal line driver circuit, 4004: scan line driver circuit, 4005: sealant, 4006: substrate, 4008: liquid crystal layer, 4010: thin film transistor, 4011: thin film transistor, 4013: liquid crystal element, 4015: connection terminal electrode, 4016: terminal electrode, 4018: FPC, 4019: anisotropic conductive film, 4020: protective insulating layer, 4021: insulating layer, 4030: pixel electrode layer, 4031: counter electrode layer, 4032: insulating layer, 4035: spacer, 4040: conductive layer, 4501: substrate, 4502: pixel portion, 4505: sealant, 4506: substrate, 4507: filler, 4509: thin film transistor, 4510: thin film transistor, 4511: light-emitting element, 4512: electroluminescent layer, 4513: electrode layer, 4515: connection terminal electrode, 4516: terminal electrode, 4517: electrode layer, 4519: anisotropic conductive film, 4520: partition wall, 4540: conductive layer, 4543: protective insulating layer, 4544: insulating layer, 5300: substrate, 5301: pixel portion, 5302: scan line driver circuit, 5303: scan line driver circuit, 5304: signal line driver circuit, 5305: timing control circuit, 5601: shift register, 5602: switching circuit, 5603: thin film transistor, 5604: wiring, 5605: wiring, 6400: pixel, 6401: switching transistor, 6402: transistor for driving light-emitting element, 6403: capacitor, 6404: light-emitting element, 6405: signal line, 6406: scan line, 6407: power supply line, 6408: common electrode, 7001: TFT, 7002: light-emitting element, 7003: cathode, 7004: light-emitting layer, 7005: anode, 7008: cathode, 7009: partition wall, 7011: TFT for driving light-emitting element, 7012: light-emitting element, 7013: cathode, 7014: light-emitting layer, 7015: anode, 7016: light-blocking film, 7017: conductive film, 7018: conductive film, 7019: partition wall, 7021: TFT for driving light-emitting element, 7022: light-emitting element, 7023: cathode, 7024: light-emitting layer, 7025: anode, 7027: conductive film, 7028: conductive film, 7029: partition wall, 9201: display portion, 9202: display button, 9203: operation switch, 9204: band portion, 9205: adjusting portion, 9206: camera portion, 9207: speaker, 9208: microphone, 9301: upper housing, 9302: lower housing, 9303: display portion, 9304: keyboard, 9305: external connection port, 9306: pointing device, 9307: display portion, 9600: television set, 9601: housing, 9603: display portion, 9605: stand, 9607: display portion, 9609: operation key, 9610: remote controller, 9700: digital photo frame, 9701: housing, 9703: display portion, 9881: housing, 9882: display portion, 9883: display portion, 9884: speaker portion, 9885: operation key, 9886: recording medium insertion portion, 9887: connection terminal, 9888: sensor, 9889: microphone, 9890: LED lamp, 9891: housing, 9893: joint portion, 9900: slot machine, 9901: housing, 9903: display portion, 202*a*: gate insulating layer, 202*b*: gate insulating layer, 401*a*: gate insulating layer, 401*b*: gate insulating layer, 402*a*: gate insulating layer, 402*b*: gate insulating layer, 405*a*: source electrode layer, 405*b*: drain electrode layer, 410*a*: resist mask, 410*b*: resist mask, 411*a*: resist mask, 4503*a*: signal line driver circuit, 4504*a*: scan line driver circuit, 4518*a*: FPC, 455*a*: source electrode layer, 455*b*: drain electrode layer, 590*a*: black region, 590*b*: white region, 606*a*: gate insulating film, and 606*b*: gate insulating film.

What is claimed is:

1. A semiconductor device comprising:
    a pixel portion comprising a first transistor, and a driver circuit comprising a second transistor over a substrate,
    wherein each of the first transistor and the second transistor comprises:
        a gate electrode layer;
        a gate insulating layer adjacent to the gate electrode layer;
        an oxide semiconductor layer adjacent to the gate electrode layer with the gate insulating layer therebetween, the oxide semiconductor layer comprising a first region and a second region;
        an oxide insulating layer in contact with the oxide semiconductor layer; and
        a conductive layer over the oxide insulating layer, the conductive layer at least overlapping with the gate electrode layer,
    wherein the oxide semiconductor layer is located between the gate insulating layer and the oxide insulating layer,
    wherein the second region includes an edge portion of the oxide semiconductor layer, and
    wherein a thickness of the second region is smaller than a thickness of the first region.

2. The semiconductor device according to claim 1, wherein the oxide semiconductor layer comprises crystals.

3. The semiconductor device according to claim 1, further comprising:
    a first source electrode layer and a first drain electrode layer in the first transistor, and
    a second source electrode layer and a second drain electrode layer in the second transistor,
    wherein the first source electrode layer and the first drain electrode layer are formed over the gate insulating layer, and the oxide semiconductor layer of the first transistor is formed over the gate insulating layer, the first source electrode layer, and the first drain electrode layer, and
    wherein the oxide semiconductor layer of the second transistor is formed over the gate insulating layer, and the second source electrode layer and the second drain electrode layer are formed over the oxide semiconductor layer of the second transistor.

4. The semiconductor device according to claim 3, wherein the edge portion of the oxide semiconductor layer in the second transistor protrudes from outside edges of the second source electrode layer and the second drain electrode layer.

5. The semiconductor device according to claim 3, wherein a thickness of a channel region in the second transistor is smaller than a thickness of a region overlapping with one of the second source electrode layer and the second drain electrode layer.

6. The semiconductor device according to claim 1, wherein the oxide semiconductor layer comprises indium, zinc, and one or more metal elements selected from gallium, iron, nickel, aluminum, manganese, cobalt, and tin.

7. The semiconductor device according to claim 1, wherein each of the first transistor and the second transistor has a light-transmitting property.

8. A semiconductor device comprising:
    a transistor comprising:
        a first electrode over a substrate;
        a gate insulating layer adjacent to the first electrode;
        a first oxide semiconductor layer adjacent to the first electrode with the gate insulating layer therebetween, the first oxide semiconductor layer comprising a first region and a second region;

an oxide insulating layer in contact with the first oxide semiconductor layer; and a light-transmitting conductive layer over the oxide insulating layer, the light-transmitting conductive layer at least overlapping with the first electrode, wherein the first oxide semiconductor layer is located between the gate insulating layer and the oxide insulating layer, wherein the second region includes an edge portion of the first oxide semiconductor layer, and wherein a thickness of the second region is smaller than a thickness of the first region, and a capacitor comprising:

a second oxide semiconductor layer over the substrate, wherein the light-transmitting conductive layer overlaps with the second oxide semiconductor layer, and wherein the capacitor has a light-transmitting property.

9. The semiconductor device according to claim 8, wherein each of the first oxide semiconductor layer and the second oxide semiconductor layer comprises crystals.

10. The semiconductor device according to claim 8, further comprising a source electrode layer and a drain electrode layer electrically connected to the first oxide semiconductor layer.

11. The semiconductor device according to claim 10, wherein the edge portion of the first oxide semiconductor layer protrudes from outside edges of the source electrode layer and the drain electrode layer.

12. The semiconductor device according to claim 8, wherein each of the first oxide semiconductor layer and the second oxide semiconductor layer comprises indium, zinc, and one or more metal elements selected from gallium, iron, nickel, aluminum, manganese, cobalt, and tin.

13. The semiconductor device according to claim 8, wherein the transistor is included in a driver circuit.

14. The semiconductor device according to claim 8, wherein the semiconductor device is a display device.

* * * * *